United States Patent
Lee et al.

(10) Patent No.: US 11,428,644 B2
(45) Date of Patent: Aug. 30, 2022

(54) METHOD AND ELECTRONIC APPARATUS FOR DISPLAYING INSPECTION RESULT OF BOARD

(71) Applicant: KOH YOUNG TECHNOLOGY INC., Seoul (KR)

(72) Inventors: Jong Myoung Lee, Seoul (KR); Duk Young Lee, Suwon-si (KR); Su Hyeong Choi, Gumi-si (KR); Hyeon Su Jeong, Seoul (KR)

(73) Assignee: KOH YOUNG TECHNOLOGY INC., Seoul (KR)

(*) Notice: Subject to any disclaimer, the term of this patent is extended or adjusted under 35 U.S.C. 154(b) by 0 days.

(21) Appl. No.: 16/624,619

(22) PCT Filed: Nov. 27, 2019

(86) PCT No.: PCT/KR2019/016429
§ 371 (c)(1),
(2) Date: Dec. 19, 2019

(87) PCT Pub. No.: WO2020/111756
PCT Pub. Date: Jun. 4, 2020

(65) Prior Publication Data
US 2021/0404973 A1 Dec. 30, 2021

(30) Foreign Application Priority Data

Nov. 27, 2018 (KR) .................. 10-2018-0148583
Nov. 26, 2019 (KR) .................. 10-2019-0153629

(51) Int. Cl.
*H05K 13/08* (2006.01)
*G01N 21/95* (2006.01)
(Continued)

(52) U.S. Cl.
CPC ..... *G01N 21/9501* (2013.01); *G01N 21/8803* (2013.01); *G01N 21/8851* (2013.01);
(Continued)

(58) Field of Classification Search
CPC .... H05K 13/083; H05K 3/3442; H05K 13/08; H05K 13/0815; H05K 1/181;
(Continued)

(56) References Cited

U.S. PATENT DOCUMENTS

2004/0208353 A1  10/2004  Murakami
2006/0271226 A1  11/2006  Tasaki et al.
(Continued)

FOREIGN PATENT DOCUMENTS

CN   1862259   11/2006
CN   1920868   2/2007
(Continued)

OTHER PUBLICATIONS

Korean Office Action, with English translation, corresponding to Korean Application No. 10-2019-0153629, dated Jan. 19, 2021.
(Continued)

Primary Examiner — Michael P Stafira
(74) Attorney, Agent, or Firm — Kile Park Reed & Houtteman PLLC

(57) ABSTRACT

An electronic apparatus including a display and one or more processor is disclosed. The one or more processor is configured to: divide a first error value of each of a plurality of first components with respect to a mounting position acquired through inspection of a plurality of substrates of a first type, into a plurality of error values, generate a graph of a tree structure including a plurality of nodes corresponding to the plurality of first components, component types of each of the plurality of first components and a plurality of components included in a mounter, adjust attributes of each
(Continued)

of the plurality of nodes using the plurality of error values divided from the first error value of each of the plurality of first components, and display the graph in which the attributes of each of the plurality of nodes are adjusted, on the display.

20 Claims, 34 Drawing Sheets

(51) Int. Cl.
    *G01N 21/88*      (2006.01)
    *G01N 21/956*      (2006.01)
    *H01L 21/66*      (2006.01)

(52) U.S. Cl.
    CPC ....... *G01N 21/95607* (2013.01); *H01L 22/30* (2013.01); *H05K 13/083* (2018.08); *G01N 2021/8858* (2013.01); *G01N 2021/8883* (2013.01); *G01N 2021/8896* (2013.01)

(58) Field of Classification Search
    CPC ..... H05K 2201/10015; H05K 13/0409; H05K 13/085; H05K 2201/10636; H05K 13/00; H05K 13/04; H05K 13/0812; H05K 13/084; H05K 2201/09381; H05K 13/0061; H05K 13/0813; H05K 13/0882; H05K 2201/0129; H05K 2201/10977; H05K 1/111; H05K 13/081; H05K 3/301; H05K 3/3457; H05K 1/0269; H05K 1/0271; H05K 13/0404; H05K 13/0408; H05K 13/0465; H05K 13/0817; H05K 13/087; H05K 13/0895; H05K 2201/10106; H05K 2201/10727; H05K 2201/2045; H05K 2203/163; H05K 3/341; H05K 3/3421; H05K 1/0209; H05K 1/025; H05K 1/0393; H05K 1/165; H05K 1/18; H05K 13/021; H05K 13/041; H05K 13/0413; H05K 13/0417; H05K 13/0434; H05K 2201/0367; H05K 2201/0373; H05K 2203/0369; H05K 3/06; H05K 3/3485; H05K 3/4007; H05K 7/1487; H05K 7/1489; H05K 7/1492; H05K 9/0024; H05K 3/30; G01B 11/002; G01B 2210/56; G01B 11/25; G01B 11/00; G01B 11/026; G01B 11/22; G01B 5/0002; G01B 5/0004; G01N 21/95684; G01N 27/83; G01N 2021/8825; G01N 2021/8858; G01N 2021/8883; G01N 2021/8896; G01N 21/8803; G01N 21/8851; G01N 21/9501; G01N 21/95607; G01N 27/82

See application file for complete search history.

(56) References Cited

U.S. PATENT DOCUMENTS

| | | | |
|---|---|---|---|
| 2007/0109885 A1 | 5/2007 | Mori et al. | |
| 2007/0211242 A1 | 9/2007 | Okabe et al. | |
| 2009/0306922 A1 | 12/2009 | Toyoshima | |
| 2010/0152877 A1 | 6/2010 | Maenishi | |
| 2010/0188417 A1 | 7/2010 | Kojitani et al. | |
| 2012/0116567 A1 | 5/2012 | Hayakawa et al. | |
| 2014/0125375 A1 | 5/2014 | Lee et al. | |
| 2015/0243108 A1* | 8/2015 | Nakayama | G05B 19/41875 702/81 |
| 2016/0209207 A1 | 7/2016 | Kim et al. | |
| 2018/0077182 A1* | 3/2018 | Sartran | H04L 43/12 |
| 2018/0192522 A1 | 7/2018 | Taniguchi et al. | |
| 2019/0254203 A1 | 8/2019 | Ikeyama et al. | |
| 2020/0375076 A1 | 11/2020 | Suzuki | |

FOREIGN PATENT DOCUMENTS

| | | | | |
|---|---|---|---|---|
| CN | 1972591 | | 5/2007 | |
| CN | 101034069 | | 9/2007 | |
| CN | 101378649 | | 3/2009 | |
| CN | 101432864 | | 5/2009 | |
| CN | 101788504 | | 7/2010 | |
| CN | 101859717 | | 10/2010 | |
| CN | 102664158 | | 9/2012 | |
| CN | 202799576 | | 3/2013 | |
| CN | 104122272 | | 10/2014 | |
| CN | 104584713 | | 4/2015 | |
| CN | 104655022 | | 5/2015 | |
| CN | 104657447 A | * | 5/2015 | ....... G06F 17/30306 |
| CN | 104685429 | | 6/2015 | |
| CN | 105783784 | | 7/2016 | |
| CN | 106030769 A | * | 10/2016 | ......... H05K 13/0434 |
| CN | 106168582 | | 11/2016 | |
| CN | 106416455 | | 2/2017 | |
| CN | 107015549 | | 8/2017 | |
| CN | 107015549 A | * | 8/2017 | ............. G01D 21/00 |
| CN | 107087388 | | 8/2017 | |
| CN | 108282992 | | 7/2018 | |
| CN | 108633244 A | * | 10/2018 | ......... G05B 19/4065 |
| EP | 2 902 861 | | 8/2015 | |
| EP | 3 119 176 | | 1/2017 | |
| JP | 7-239253 | | 9/1995 | |
| JP | 3511632 | | 3/2004 | |
| JP | 2004-172221 | | 6/2004 | |
| JP | 2006-216589 | | 8/2006 | |
| JP | 2006216589 A | * | 8/2006 | |
| JP | 2006-324424 | | 11/2006 | |
| JP | 2007-141960 | | 6/2007 | |
| JP | 2007-157781 | | 6/2007 | |
| JP | 2008-103411 | | 5/2008 | |
| JP | 2010-238689 A | | 10/2010 | |
| JP | 2013-45872 | | 3/2013 | |
| JP | 2017-212460 | | 11/2017 | |
| KR | 10-2017-0090049 | | 8/2017 | |
| WO | 2014/049872 | | 4/2014 | |
| WO | WO-2014091735 A1 | * | 6/2014 | ......... G05B 19/4183 |
| WO | 2017/085865 | | 5/2017 | |
| WO | WO-2018073936 A1 | * | 4/2018 | ......... G06Q 10/0875 |

OTHER PUBLICATIONS

Chinese Office Action, with English translation, corresponding to Chinese Application No. or Publication No. 201980003048.9, dated Jan. 27, 2021.
International Search report, with English translation, corresponding to International Application No. PCT/KR2019/007867, dated Oct. 4, 2019.
Written Opinion, with English translation, corresponding to International Application No. PCT/KR2019/007867, dated Oct. 4, 2019.
Korean Office Action, with English translation, corresponding to Korean Application No. 10-2019-0077004, dated Nov. 11, 2020.
Chinese Office Action, with English translation, corresponding to Chinese Application No. or Publication No. 201980002555.0, dated Sep. 24, 2020.
Extended European Search Report, corresponding to European Application No./Patent No. 19812895.1, dated Sep. 21, 2020.
Extended European Search Report, corresponding to European Application No./Patent No. 19817118.3, dated Oct. 13, 2020.
International Search report, with English translation, corresponding to International Application No. PCT/KR2019/016429, dated Mar. 4, 2020.
Written Opinion, with English translation, corresponding to International Application No. PCT/KR2019/016429, dated Mar. 4, 2020.
Chinese Office Action, with English translation, corresponding to Chinese Application No. or Publication No. 201980002555.0, dated Apr. 30, 2021.
European Office Action corresponding to European Application No.

(56) References Cited

OTHER PUBLICATIONS 19 817 118.3, dated Apr. 11, 2022.
European Office Action corresponding to European Application No. 19 812 895.1, dated Apr. 5, 2022.
Office Action from US Patent Office for U.S. Appl. No. 16/621,142 dated Feb. 22, 2022.

* cited by examiner

FIG. 6

| Component | | Component type | | Nozzle | |
|---|---|---|---|---|---|
| C0 | 55 | P0 | 55 | N0 | 30 |
| C1 | 53 | | | | |
| C2 | 57 | | | | |
| C3 | 29 | P1 | 29 | | |
| C4 | 27 | | | | |
| C5 | 31 | | | | |
| C6 | 45 | | | | |
| C7 | 29 | P2 | 31 | | |
| C8 | 33 | | | | |
| C9 | 20 | P3 | 20 | N1 | 1 |
| C10 | 18 | | | | |
| C11 | 22 | | | | |
| C12 | 20 | | | | |
| C13 | 10 | P4 | 1 | | |
| C14 | 1 | | | | |
| C15 | 1 | | | | |
| C16 | 1 | P5 | 1 | | |
| C17 | 5 | P6 | 5.5 | N2 | 0.33 |
| C18 | 6 | | | | |
| C19 | 1 | P4 | 0.33 | | |
| C20 | 0 | | | | |
| C21 | 0 | | | | |

| Component | | Component type | | Nozzle | |
|---|---|---|---|---|---|
| C0 | 0 | | | | |
| C1 | 0 | P0 | 25 | | |
| C2 | 0 | | | | |
| C3 | 0 | P1 | 0 | N0 | 30 |
| C4 | 0 | | | | |
| C5 | 0 | | | | |
| C6 | 15 | | | | |
| C7 | 0 | P2 | 0 | | |
| C8 | 0 | | | | |
| C9 | 0 | P3 | 20 | N1 | 0 |
| C10 | 0 | | | | |
| C11 | 0 | | | | |
| C12 | 0 | | | | |
| C13 | 10 | P4 | 0 | | |
| C14 | 0 | | | | |
| C15 | 0 | | | | |
| C16 | 0 | P5 | 0 | | |
| C17 | 0 | P6 | 5.5 | N2 | 0 |
| C18 | 0 | | | | |
| C19 | 0 | P4 | 0 | | |
| C20 | 0 | | | | |
| C21 | 0 | | | | |

FIG. 13A

| | First error value (μm) |
|---|---|
| C0 | 55 |
| C1 | 53 |
| C2 | 57 |
| C3 | 29 |
| C4 | 27 |
| C5 | 31 |
| C6 | 45 |
| C7 | 29 |
| C8 | 33 |
| C9 | 20 |
| C10 | 18 |
| C11 | 22 |
| C12 | 20 |
| C13 | 10 |
| C14 | 1 |
| C15 | 1 |
| C16 | 1 |
| C17 | 5 |
| C18 | 6 |
| C19 | 1 |
| C20 | 0 |
| C21 | 0 |

FIG. 13B

| Component/<br>second error value(μm) | Component type/<br>third error value(μm) | Nozzle/<br>fourth error value(μm) |
|---|---|---|
| C0 / 0 | | |
| C1 / -2 | P0 / 25 | |
| C2 / 2 | | |
| C3 / 0 | | |
| C4 / -2 | P1 / -1 | N0 / 30 |
| C5 / 2 | | |
| C6 / 16 | | |
| C7 / -2 | P2 / 1 | |
| C8 / 2 | | |
| C9 / 0 | | |
| C10 / -2 | P3 / 19 | |
| C11 / 2 | | |
| C12 / 0 | | N1 / 1 |
| C13 / 9 | | |
| C14 / 0 | P4 / 0 | |
| C15 / 0 | | |
| C16 / 0 | P5 / 0 | |
| C17 / -0.5 | P6 / 5.17 | |
| C18 / 0.5 | | |
| C19 / 0.67 | | N2 / 0.33 |
| C20 / -0.33 | P7 / 0 | |
| C21 / -0.33 | | |

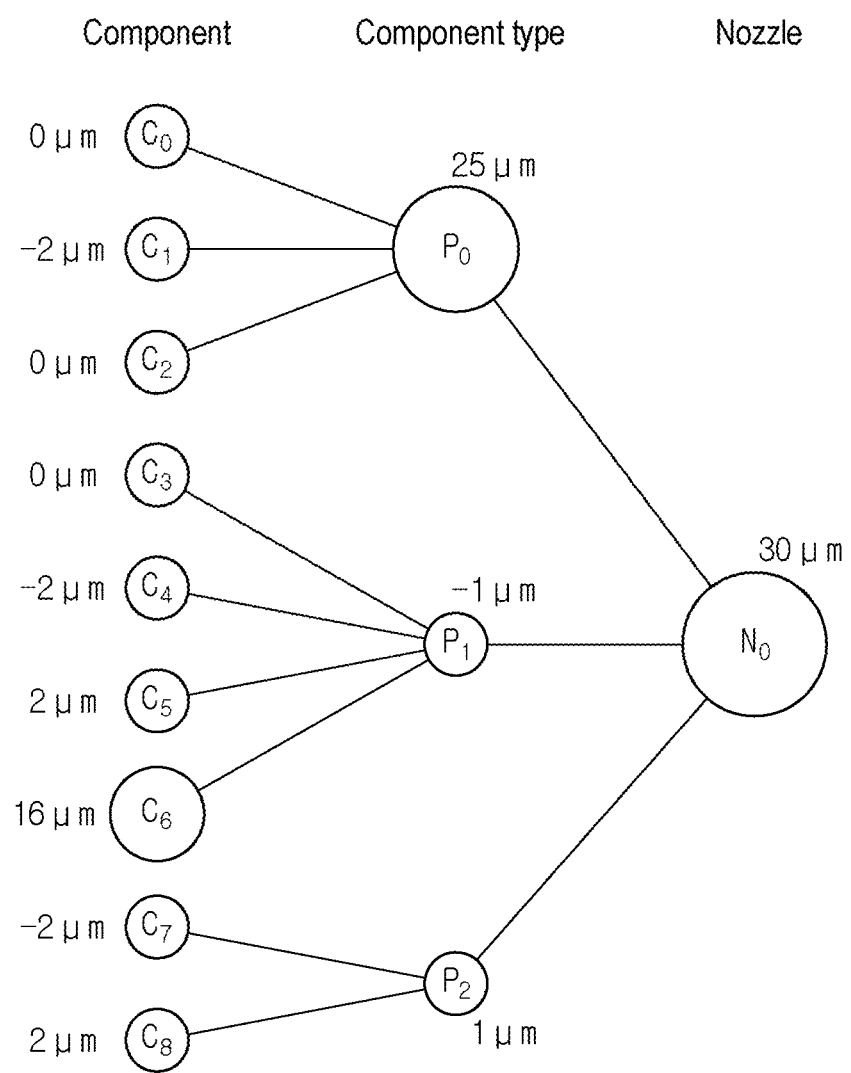

METHOD AND ELECTRONIC APPARATUS FOR DISPLAYING INSPECTION RESULT OF BOARD

TECHNICAL FIELD

The present disclosure relates to an electronic apparatus and method for displaying an inspection result of a board.

BACKGROUND

Typically, in a surface mounter technology (SMT) process, a screen printer prints solder pastes onto a substrate, and a mounter mounts components on the substrate on which the solder pastes are printed.

In addition, an automated optical inspection (AOI) device is used as a substrate inspection device for inspecting a mounting state of a component mounted on a substrate. The substrate inspection device uses a captured image of a substrate to inspect whether or not components are normally mounted on the substrate without any deviation, distortion, tilting or the like. The substrate inspection device may use the inspection results to determine whether or not a mounting failure has occurred in each of the components.

Meanwhile, when the inspection results of the substrate inspection device indicates that a mounting failure has occurred, the device operators are required, in the subsequent component mounting process, to perform subsequent processes such as adjustment of control parameters of a mounter that performs a component mounting process, replacement of components included in the mounter, and the like, so that the mounting failure rate is reduced. In order to determine what subsequent process should be performed to reduce the mounting failure rate, it is necessary to determine the cause of the mounting failure for the components in which the mounting failure has occurred.

SUMMARY

Various embodiments of the present disclosure provide an electronic apparatus for displaying a graph for an inspection result of a substrate on which a plurality of components is mounted.

Various embodiments of the present disclosure provide a method for displaying a graph for an inspection result of a substrate on which a plurality of components is mounted.

According to various embodiments of the present disclosure, an electronic apparatus comprises a display; and one or more processor. The one or more processor is configured to: divide a first error value of each of a plurality of first components with respect to a mounting position acquired through inspection of a plurality of substrates of a first type on which the plurality of first components are mounted by a mounter, into a plurality of error values, generate a graph of a tree structure including a plurality of nodes corresponding to the plurality of first components, component types of each of the plurality of first components and a plurality of components included in the mounter, adjust attributes of each of the plurality of nodes using the plurality of error values divided from the first error value of each of the plurality of first components; and display the graph in which the attributes of each of the plurality of nodes are adjusted, on the display.

In one embodiment, the components include at least one of a head, a spindle, a nozzle, a feeder and a reel.

In one embodiment, the plurality of nodes includes a plurality of first nodes corresponding to the plurality of first components, a plurality of second nodes corresponding to the component types of each of the plurality of first components and a plurality of third nodes corresponding to the components included in the mounter, the plurality of first nodes is set as a lower layer than the plurality of second nodes, and the plurality of second nodes is set as a lower layer than the plurality of third nodes.

In one embodiment, the attributes of each of the plurality of nodes include at least one of a shape, a size and a color of the plurality of nodes.

In one embodiment, the one or more processor is configured to: distribute the plurality of error values divided from the first error value of each of the plurality of first components to the plurality of nodes, and adjust the attributes of each of the plurality of nodes based on absolute values of the error values distributed to the plurality of nodes.

In one embodiment, the one or more processor is configured to: determine a plurality of second components in which a mounting failure has occurred among the plurality of first components by using the plurality of error values divided from the first error value of each of the plurality of first components, and determine a cause of a mounting failure of each of the plurality of second components as at least one of a component mounting position setting error, a mounting condition setting error according to a component type and a defect of the components included in the mounter by using the plurality of error values divided from the first error value of each of the plurality of second components.

In one embodiment, the one or more processor is configured to further adjust attributes of at least one node among the plurality of nodes based on the cause of the mounting failure of each of the plurality of second components.

In one embodiment, the first error value of each of the plurality of first components is an average value of differences between a plurality of measurement values of mounting positions of the plurality of first components measured in inspecting each of the plurality of substrates of the first type, and predetermined reference values, and the one or more processor is configured to further acquire an error variance value of each of the plurality of first components indicating a variance with respect to the differences between the plurality of measurement values of the mounting positions of the plurality of first components and the predetermined reference values.

In one embodiment, the one or more processor is configured to: adjust at least one error value among the plurality of error values divided from the first error value of each of the plurality of second components based on the determined cause of the mounting failure of each of the plurality of second components, calculate a first yield to be improved in a manufacturing process for the substrate of the first type through improvement of the determined cause of the mounting failure of each of the plurality of second components, by using at least one adjusted error value and the error variance value for each of the plurality of second components identified through the error variance value of each of the plurality of first components, and display the calculated first yield on the display.

In one embodiment, the one or more processor is configured to: calculate a second yield of the plurality of substrates of the first type based on the number of at least one substrate of the first type including the plurality of second components among the plurality of substrates of the first type, calculate a third yield for the plurality of substrates of the first type based on the number of at least one substrate of the first type in which a failure has actually occurred among the plurality of substrates of the first type, and adjust the calculated first yield based on the second yield and the third yield, and display the adjusted first yield on the display.

According to various embodiments of the present disclosure, a method of displaying an inspection result in an electronic apparatus, comprises dividing, by one or more processor of the electronic apparatus, a first error value of each of a plurality of first components with respect to a mounting position acquired through inspection of a plurality of substrates of a first type on which the plurality of first components are mounted by a mounter, into a plurality of error values, generating a graph of a tree structure including a plurality of nodes corresponding to the plurality of first components, component types of each of the plurality of first components and a plurality of components included in the mounter, adjusting attributes of each of the plurality of nodes using the plurality of error values divided from the first error value of each of the plurality of first components, and displaying, by a display of the electronic apparatus, the graph in which the attributes of each of the plurality of nodes are adjusted.

In one embodiment, the elements include at least one of a head, a spindle, a nozzle, a feeder and a reel.

In one embodiment, the plurality of nodes includes a plurality of first nodes corresponding to the plurality of first components, a plurality of second nodes corresponding to the component types of each of the plurality of first components and a plurality of third nodes corresponding to the components included in the mounter, the plurality of first nodes is set as a lower layer than the plurality of second nodes, and the plurality of second nodes is set as a lower layer than the plurality of third nodes.

In one embodiment, the attributes of each of the plurality of nodes include at least one of a shape, a size and a color of the plurality of nodes.

In one embodiment, the adjusting attributes of each of the plurality of nodes includes distributing the plurality of error values divided from the first error value of each of the plurality of first components to the plurality of nodes, and adjusting the attributes of each of the plurality of nodes based on absolute values of the error values distributed to the plurality of nodes.

In one embodiment, the method further comprises determining a plurality of second components in which a mounting failure has occurred among the plurality of first components by using the plurality of error values divided from the first error value of each of the plurality of first components, and determining a cause of a mounting failure of each of the plurality of second components as at least one of a component mounting position setting error, a mounting condition setting error according to a component type and a defect of the components included in the mounter by using the plurality of error values divided from the first error value of each of the plurality of second components.

In one embodiment, the method further comprises further adjusting attributes of at least one node among the plurality of nodes based on the cause of the mounting failure of each of the plurality of second components.

In one embodiment, the first error value of each of the plurality of first components is an average value of differences between a plurality of measurement values of mounting positions of the plurality of first components measured in inspecting each of the plurality of substrates of the first type and predetermined reference values, and the method further comprises further acquiring an error variance value of each of the plurality of first components indicating a variance with respect to the differences between the plurality of measurement values of the mounting positions of the plurality of first components and the predetermined reference values.

In one embodiment, the method further comprises adjusting at least one error value among the plurality of error values divided from the first error value of each of the plurality of second components based on the determined cause of the mounting failure of each of the plurality of second components, calculating a first yield to be improved in a manufacturing process for the substrate of the first type through improvement of the determined cause of the mounting failure of each of the plurality of second components, by using at least one adjusted error value and the error variance value for each of the plurality of second components identified through the error variance value of each of the plurality of first components, and displaying, by the display, the calculated first yield.

In one embodiment, the method further comprises calculating a second yield of the plurality of substrates of first type based on the number of at least one substrate of the first type including the plurality of second components among the plurality of substrates of the first type, calculating a third yield for the plurality of substrates of the first type based on the number of at least one substrate of the first type in which a failure actually occurred among the plurality of substrates of the first type, and adjusting the calculated first yield based on the second yield and the third yield and displaying the adjusted first yield on the display.

The electronic apparatus according to various embodiments of the present disclosure can generate and display a graph indicating an inspection result of a substrate by using error values generated based on measurement information indicating a mounting state of each of a plurality of components mounted on a substrate. Thus, the user can easily recognize the inspection result and can efficiently and accurately determine what subsequent processing should be performed to reduce a mounting failure rate in a subsequent component mounting process.

BRIEF DESCRIPTION OF DRAWINGS

FIG. 6 is a table illustrating the mounting failure rates of components, component types and nozzles according to various embodiments of the present disclosure.

FIG. 11 is a table illustrating the adjusted mounting failure rates of components, component types and nozzles according to various embodiments of the present disclosure.

FIGS. 13A and 13B are tables illustrating first to fourth error values of each of a plurality of first components according to various embodiments of the present disclosure.

FIGS. 20A to 20C are graphs indicating error values according to various embodiments of the present disclosure.

DETAILED DESCRIPTION

Figure 1:
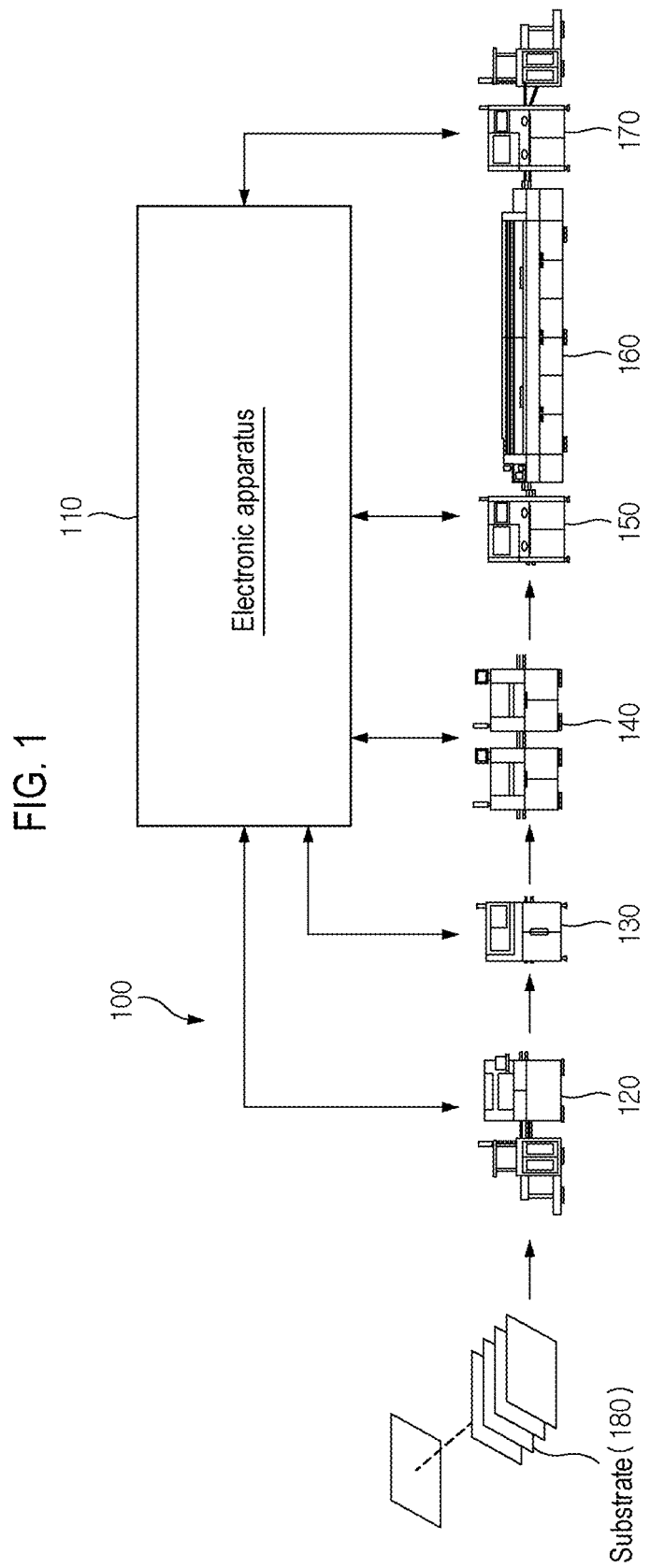
FIG. 1 illustrates an SMT process line according to various embodiments of the present disclosure.

Embodiments of the present disclosure are illustrated for describing the technical spirit of the present disclosure. The scope of the claims according to the present disclosure is not limited to the embodiments described below or to the detailed descriptions of these embodiments.

All technical or scientific terms used herein have meanings that are generally understood by a person having ordinary knowledge in the art to which the present disclosure pertains, unless otherwise specified. The terms used herein are selected only for more clear illustration of the present disclosure, and are not intended to limit the scope of claims in accordance with the present disclosure.

The expressions "include", "provided with", "have" and the like used herein should be understood as open-ended terms connoting the possibility of inclusion of other embodiments, unless otherwise mentioned in a phrase or sentence including the expressions.

A singular expression can include meanings of plurality, unless otherwise mentioned, and the same applies to a singular expression stated in the claims.

The terms "first", "second", etc. used herein are used to identify a plurality of components from one another, and are not intended to limit the order or importance of the relevant components.

The expression "based on" used herein is used to describe one or more factors that influences a decision, an action of judgment or an operation described in a phrase or sentence including the relevant expression, and this expression does not exclude additional factors influencing the decision, the action of judgment or the operation.

When a certain component is described as "coupled to" or "connected to" another component, this should be understood as having the meaning that the certain component may be coupled or connected directly to the other component or that the certain component may be coupled or connected to the other component via a new intervening component.

Hereinafter, embodiments of the present disclosure will be described with reference to the accompanying drawings. In the accompanying drawings, like or relevant components are indicated by like reference numerals. In the following description of embodiments, repeated descriptions of the identical or relevant components will be omitted. However, even if a description of a component is omitted, such a component is not intended to be excluded in an embodiment.

Although process steps, method steps, algorithms, etc. are illustrated in a sequential order in the flowchart shown in the present disclosure, such processes, methods, and algorithms may be configured to be operated in any suitable order. In other words, the steps in the processes, methods, and algorithms explained in various embodiments of the present disclosure are not necessarily performed in the order described in the present disclosure. Further, even though some steps are explained as being performed non-simultaneously, such steps may be simultaneously performed in another embodiment. Moreover, the illustration of the processes depicted in the figure does not mean that the illustrated processes exclude other changes and modifications thereto, that any of the illustrated processes or the steps thereof is essential for at least one of various embodiments of the present disclosure, and that the illustrated processes are desirable.

FIG. 1 illustrates an SMT process line 100 according to various embodiments of the present disclosure. According to various embodiments of the present disclosure, the SMT process line 100 may include an electronic apparatus 110, a solder printing apparatus 120, a screen printer inspection (SPI) apparatus 130, a mounter 140, a first substrate inspection apparatus 150, an oven 160 and a second substrate inspection apparatus 170. The substrate 180 to be processed in the SMT process line 100 may include various substrates on which various surface-mount devices may be mounted, such as a strip board, a flexible circuit board, a panel and the like.

In an embodiment, the electronic apparatus 110 may determine a cause of a mounting failure for each of the components in which a mounting failure has occurred among a plurality of components mounted on the substrate 180. The solder printing apparatus 120 may print solder pastes on the substrate 180. The substrate 180 may include one or more pads. The solder printing apparatus 120 may print a solder paste on each of the one or more pads of the substrate 180. For example, at least one pad may be arranged on the substrate at a position where one component is to be mounted.

The SPI apparatus 130 may inspect the printing state of the solder pastes printed on the substrate 180. For example, the SPI apparatus 130 may inspect the printed state of the solder pastes by inspecting the position, height, volume, shape and the like of the printed solder pastes.

In an embodiment, the mounter 140 may mount a plurality of components on the substrate 180. The mounter 140 may mount each of the components at a predetermined mounting position of each of the components on the substrate 180. The first substrate inspection apparatus 150 may inspect a mounting state of each of the components mounted on the substrate 180. For example, the first substrate inspection apparatus 150 may inspect whether the mounting state of each of the components is good or poor.

The oven 160 may perform a reflow process on the substrate 180 on which the components are mounted. During the reflow process, the solder pastes on the substrate 180 are melted and then solidified, thereby making it possible to bond the components onto the pads of the substrate 180. After the reflow process, the second substrate inspection apparatus 170 may inspect a mounting state of each of the components mounted on the substrate 180. For example, after the reflow process is performed, the second substrate inspection apparatus 170 inspects whether the mounting position of each of the components is changed. Accordingly, the second substrate inspection apparatus 170 may inspect again whether the mounting state of each of the components is good or poor.

In an embodiment, the electronic apparatus 110 may be connected to other devices included in the SMT process line 100 in a wireless or wired manner. The electronic apparatus 110 may interwork with other devices included in the SMT process line 100 in real time to perform data transmission/reception and control of each of the other devices. For example, based on the determined cause of a mounting failure, the electronic apparatus 110 may transmit a control signal for changing control parameters of the mounter 140 or controlling the operation of the mounter 140 so as to reduce the mounting failure rate.

In addition, the devices included in the SMT process line 100 may interwork with each other to perform data transmission/reception. For example, the SPI apparatus 130 may transmit the printed state inspection result information or the solder position information of the solder pastes to at least one device in the SMT process line 100 connected in a wired or wireless manner. That is, the SPI apparatus 130 may directly transmit the information to each device, may transmit the information to the electronic apparatus 110 so that the information is used in the electronic apparatus 110, or may transmit the inspection information to each device.

The mounter 140 may transmit information on the components of the mounter 140, the real-time mounting information and the like to the first substrate inspection apparatus 150 or the second substrate inspection apparatus 170 either directly or through the electronic apparatus 110. The first substrate inspection apparatus 150 or the second substrate inspection apparatus 170 may transmit the inspection result of the mounting state of each of the components mounted on the substrate 180 to the electronic apparatus 110. The electronic apparatus 110 may determine a cause of a mounting failure for each of the components in which a mounting failure has occurred by using the received inspection result, and may display the information on the determined cause of the mounting failure. The detailed configuration and operation method for the electronic apparatus 110 will be described later.

Figure 2:
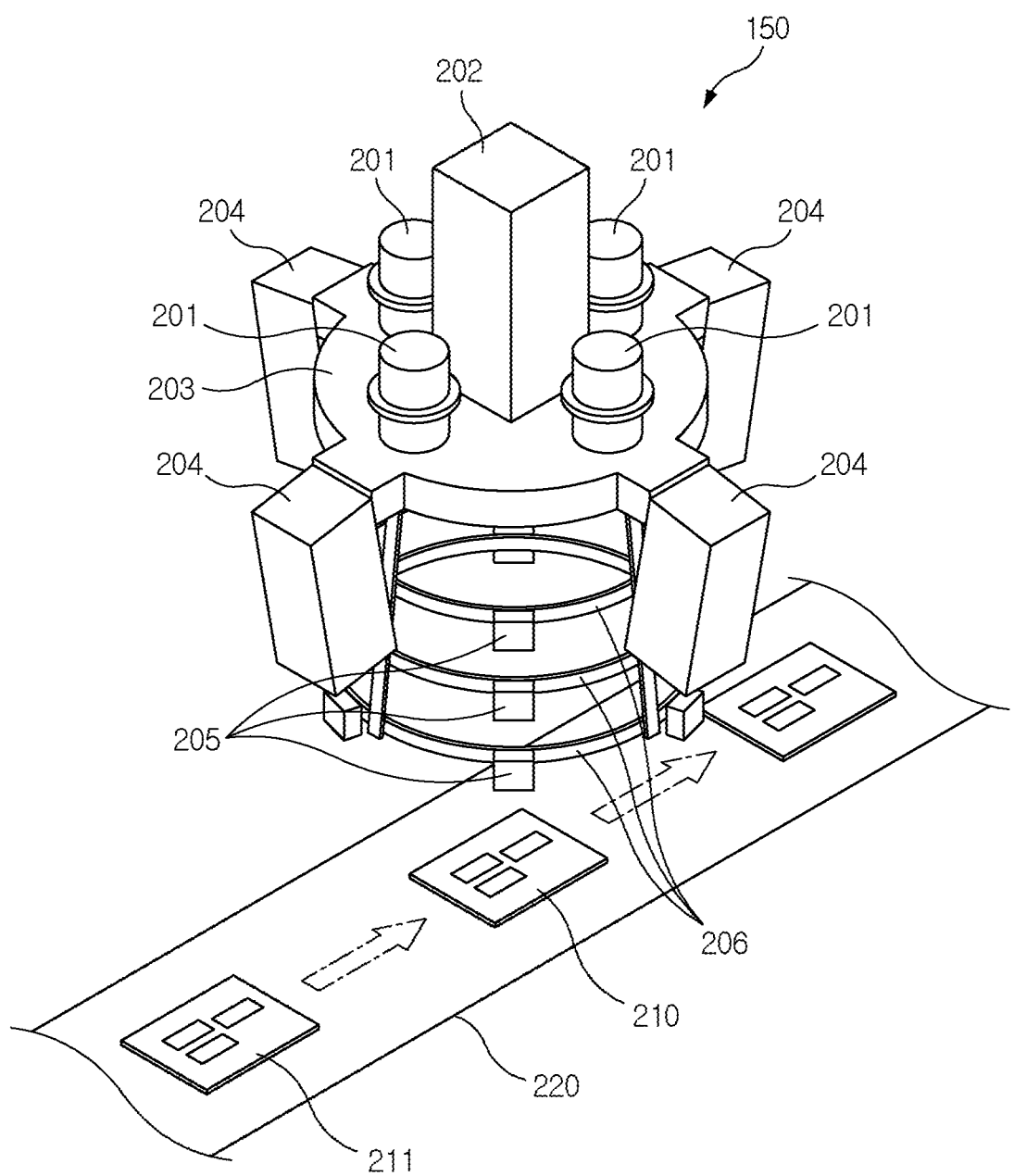
FIG. 2 illustrates a first substrate inspection device according to various embodiments of the present disclosure.

FIG. 2 illustrates the first substrate inspection apparatus 150 according to various embodiments of the present disclosure. According to various embodiments of the present disclosure, the first substrate inspection apparatus 150 may inspect a mounting state of at least one component mounted on the substrate 210. A transfer part 220 may move a substrate 210 to a predetermined position to inspect the mounting state of the component. In addition, when the inspection is completed by the first substrate inspection apparatus 150, the transfer part 220 may move the inspection-completed substrate 210 away from the predetermined position, and may move another substrate 211 to the predetermined position. Since the configuration and operation of the first substrate inspection apparatus 150 are similar to those of the second substrate inspection apparatus 170, the detailed description of the second substrate inspection apparatus 170 will be omitted.

According to various embodiments of the present disclosure, the first substrate inspection apparatus 150 may include a first light source 201, a first image sensor 202, a frame 203, a second image sensor 204 and a second light source 205. The number and arrangement of the first light source 201, the first image sensor 202, the frame 203, the second image sensor 204 and the second light source 205 shown in FIG. 2 are merely illustrative and not limiting.

In an embodiment, the first light source 201 may irradiate pattern light to the substrate 210 moved to the predetermined position for the inspection of the mounting state of the component. For example, the pattern light may be light having a pattern of a constant period, which is irradiated to measure a three-dimensional shape of the substrate 210. The first light source 201 may irradiate pattern light, in which the brightness of a stripe has a sine wave shape, on-off pattern light, in which bright portions and dark portions are repeatedly displayed, or triangular-wave pattern light, in which the change in brightness is a triangular waveform. However, this is merely for the purpose of explanation and the present disclosure is not limited thereto. The first light source 201 may irradiate light including various types of patterns in which a change in brightness is repeated at a constant cycle.

In an embodiment, the second light source 205 may irradiate first-wavelength light, second-wavelength light and third-wavelength light to the substrate 210. For example, the second light source 205 may sequentially irradiate the first-wavelength light, the second-wavelength light and the third-wavelength light, or may simultaneously irradiate at least two of the first-wavelength light, the second-wavelength light and the third-wavelength light.

In an embodiment, the first image sensor 202 may receive the pattern light, the first-wavelength light, the second-wavelength light and the third-wavelength light vertically reflected from substrate 210 and the components mounted on the substrate 210. The first image sensor 202 may generate an image and a three-dimensional shape of the substrate by using at least one of the pattern light, the first-wavelength light, the second-wavelength light and the third-wavelength light thus received.

In an embodiment, the second image sensor 204 may be disposed below the first image sensor 202. The second image sensor 204 may receive the pattern light, the first-wavelength light, the second-wavelength light and the third-wavelength light reflected from the substrate 210 and the components mounted on the substrate 210 in a direction inclined with respect to the vertical direction. The second image sensor 204 may generate image data using at least one of the pattern light, the first-wavelength light, the second-wavelength light and the third-wavelength light thus received. For example, the first image sensor 202 and the second image sensor 204 may include a charge coupled device (CCD) camera, a complementary metal oxide semiconductor (CMOS) camera, or the like. However, this is merely for the purpose of explanation. The present disclosure is not limited thereto. Various image sensors may be used as the first image sensor 202 and the second image sensor 204.

In an embodiment, the first light source 201, the first image sensor 202 and the second image sensor 204 may be fixed to a first frame 203. In addition, the second light source 205 may be fixed to a second frame 206 connected to the first frame 203. For example, when there are a plurality of second light sources 205, some of the plurality of second light sources 205 may be fixed to the second frame 206 so as to have the same height with respect to the ground surface. Other second light sources 205 may be fixed to the second frame 206 to have different heights. In FIG. 2, the second frame 206 is illustrated in a ring shape, but the present disclosure is not limited thereto.

According to various embodiments of the present disclosure, the electronic apparatus 110 of determining a cause of a mounting failure for each of the components in which a mounting failure has occurred may be included in the first substrate inspection apparatus 150 or the second substrate inspection apparatus 170, or may be configured separately from the first substrate inspection apparatus 150 or the second substrate inspection apparatus 170. In this case, the electronic apparatus 110 may be connected to the first substrate inspection apparatus 150 or the second substrate inspection apparatus 170 in a wireless or wired manner to receive the inspection result of the mounting failure for each of the components or the measurement information indicating the mounting state of each of the components from the first substrate inspection apparatus 150 or the second substrate inspection apparatus 170. The detailed configuration and operation method for the electronic apparatus 110 will be described later.

Figure 3:
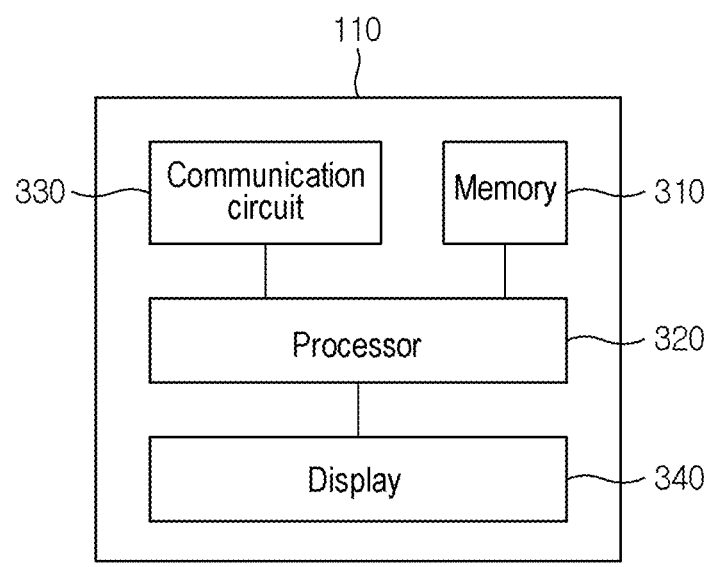
FIG. 3 is a block diagram of an electronic apparatus according to various embodiments of the present disclosure.

FIG. 3 is a block diagram of the electronic apparatus 110 according to various embodiments of the present disclosure. According to various embodiments of the present disclosure, the electronic apparatus 110 may include a memory 310 and a processor 320. In addition, the electronic apparatus 110 may further include at least one of a communication circuit 330 and a display 340. Each of the memory 310, the processor 320, the communication circuit 330 and the display 340 included in the electronic apparatus 110 may be one or more. The components included in the electronic apparatus 110 may be electrically connected through a bus (not shown) to transmit and receive information, control signals, instructions, data, and the like.

In an embodiment, the memory 310 may store instructions or data related to at least one other component of the electronic apparatus 110. In addition, the memory 310 may store software and/or a program. For example, the memory 310 may include an internal memory or an external memory. The internal memory may include at least one of a volatile memory (e.g., a DRAM, a SRAM or a SDRAM) and a nonvolatile memory (e.g., a flash memory, a hard drive or a solid state drive (SSD)). The external memory may be functionally or physically connected to the electronic apparatus 110 through various interfaces, and may be a cloud server interworked with an external device in a wired or wireless manner.

In one embodiment, the memory 310 may store instructions for operating the processor 320. For example, the memory 310 may store instructions for allowing the processor 320 to control other components of the electronic apparatus 110 and to interwork with an external electronic apparatus or an external server. In addition, instructions for enabling each component to perform a movement may be stored in the memory 310. The processor 320 may control other components of the electronic apparatus 110 and may interwork with an external electronic apparatus or an external server based on the instructions stored in the memory 310. Hereinafter, the operation of the electronic apparatus 110 will be described mainly based on the respective components of the electronic apparatus 110.

In an embodiment, the processor 320 may drive an operating system or an application program to control at least one component of the electronic apparatus 110 and to execute various data processing and calculations. For example, the processor 320 may include a central processing unit or the like, and may be implemented as a system-on-chip (SoC).

In an embodiment, the communication circuit 330 may communicate with an external electronic apparatus or an external server. For example, the communication circuit 330 may set communication between the electronic apparatus 110 and other apparatuses included in the SMT process line 100 and an external server. The communication circuit 330 may be connected to a network through wireless or wired communication to communicate with other apparatuses included in the SMT process line 100 and an external server. As another example, the communication circuit 330 may be connected by a wire to other apparatuses included in the SMT process line 100 and an external server to perform communication.

The wireless communication may include, for example, cellular communication (e.g., LTE, LTE Advance (LTE-A), Code Division Multiple Access (CDMA), Wideband CDMA (WCDMA), Universal Mobile Telecommunication System (UMTS), Wireless Broadband (WiBro), etc.). In addition, the wireless communication may include short-range wireless communication (e.g., Wireless Fidelity (WiFi), Light Fidelity (LiFi), Bluetooth, Bluetooth Low Power (BLE), Zigbee, Near Field Communication (NFC), etc.).

In one embodiment, the display 340 may include, for example, a liquid crystal display (LCD), a light emitting diode (LED) display, an organic light emitting diode (OLED) display, or the like. The display 340 may display, for example, various types of content (e.g., texts, images, videos, icons and/or symbols) to the user. The display 340 may include a touch screen, and may receive, for example, touch, gesture, proximity or hovering input or the like performed through the use of an electronic pen or a part of a user's body.

According to various embodiments of the present disclosure, the processor 320 may receive solder paste printing state inspection information or solder position information from the SPI apparatus 130, and may receive the inspection result of a mounting failure for each of the first components mounted on the substrate or the measurement information indicating the mounting state of each of the components, and the like from the first substrate inspection apparatus 150 through the communication circuit 330. When the electronic apparatus 110 is included in the first substrate inspection apparatus 150, the processor 320 may receive the inspection result of a mounting failure for each of the first components or the measurement information indicating the mounting state of each of the components, and the like without going through the communication circuit 330. Hereinafter, description will be made mainly under the assumption that the processor 320 is operated based on the information received from the first substrate inspection apparatus 150. However this is merely for the purpose of explanation. The present disclosure is not limited thereto. The processor 320 may be operated based on the information received from the second substrate inspection apparatus 170.

The processor 320 may determine a cause of a mounting failure for each of a plurality of second components in which a mounting failure has occurred among the plurality of first components by using the inspection result of a mounting failure for each of the first components or the measurement information indicating the mounting state of each of the components. A specific method for determining a cause of a mounting failure for each of a plurality of second components will be described later.

In an embodiment, the processor 320 may determine a cause of a mounting failure for each of a plurality of second components, and then may display the cause of a mounting failure for each of the plurality of second components on the display 340. In addition, the processor 320 may control the communication circuit 330 to transmit the information indicating the cause of a mounting failure for each of the plurality of second components to the mounter 140 and the external electronic apparatus (e.g., the user's electronic apparatus).

The user may check the cause of a mounting failure for each of the plurality of second components displayed on the display 340 or the display of the user's electronic apparatus, and may efficiently and accurately determine what subsequent process should be performed to reduce a mounting failure rate in a subsequent component mounting process.

In addition, after determining the cause of a mounting failure for each of the plurality of second components, the processor 320 transmits information on the cause of a mounting failure or information on the corrected mounting position for each of the second components to the mounter 140 to reduce the mounting failure rate based on the determined cause of a mounting failure for each of the plurality of second components. Thus, the processor 320 may notify the cause of a mounting failure for a component included in the mounter (e.g. a head, a spindle, a nozzle, a feeder, a reel or the like), or may request the replacement of the component. The processor 320 may directly change mounting control parameters, or may transmit a control signal for controlling the operation of the mounter 140 to the mounter 140 through the communication circuit 330.

Figure 4:
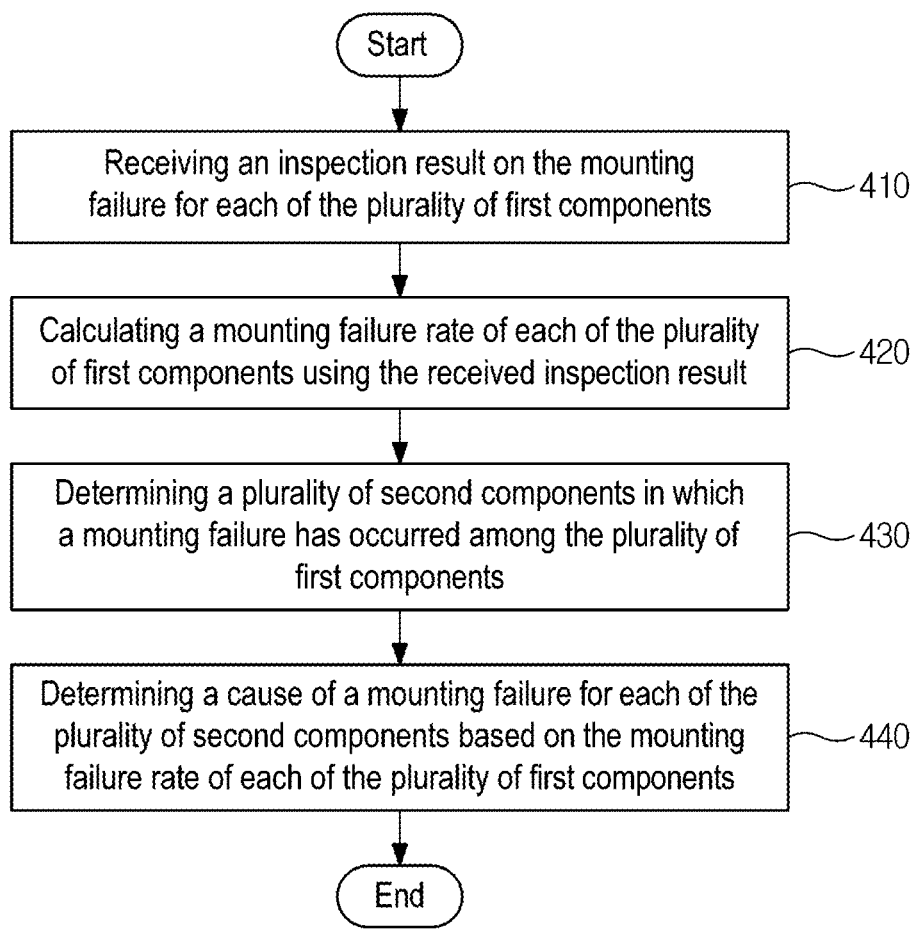
FIG. 4 is a flowchart illustrating a method for determining a cause of a mounting failure for each of a plurality of components mounted on a substrate according to various embodiments of the present disclosure.

FIG. 4 is a flowchart illustrating a method for determining a cause of a mounting failure for each of a plurality of components mounted on a substrate according to various embodiments of the present disclosure.

In step 410, the processor 320 of the electronic apparatus 110 may receive an inspection result of a mounting failure for each of a plurality of first components determined by inspecting a plurality of substrates of the first type on which the plurality of first components is mounted. When the electronic apparatus 110 is configured separately from the first substrate inspection apparatus 150, the processor 320 may receive an inspection result from the first substrate inspection apparatus 150 through the communication circuit 330. When the electronic apparatus 110 is included in the first substrate inspection apparatus 150, the processor 320 may directly generate an inspection result of a mounting failure for each of a plurality of first components through the information measured during the process of inspecting a plurality of substrates of the first type. Hereinafter, description will be made mainly under the assumption that the processor 320 makes use of the inspection result received from the first substrate inspection apparatus 150. However, the present disclosure is not limited thereto. The processor 320 may use the inspection result received from the second substrate inspection apparatus 170, or may use both the inspection result received from the first substrate inspection apparatus 150 and the inspection result received from the second substrate inspection apparatus 170.

In an embodiment, the respective first components may be mounted at different positions on the substrate of the first type. In other words, the mounting positions of the respective first components on the substrate of the first type may be different from each other. For example, an A component may be mounted at an A position on the substrate of the first type, and a B component may be mounted at a B position on the substrate of the first type. In this regard, the types of the A component and the B component may be the same or may be different.

In addition, the same type of substrates may indicate that the substrates are manufactured according to the same design information. In other words, since the same type of substrates are manufactured according to the same design information, a specific component may be mounted at a specific position of each of the same type of substrates. For example, according to the design information of the substrate of the first type, the A components may be mounted at the A and B positions on the substrates of the first type.

In an embodiment, the inspection result of a mounting failure for each of the plurality of first components may include the inspection result of a mounting failure for each of the plurality of first components on each of the plurality of substrates of the first type. For example, the inspection result of a mounting failure for the A component among the plurality of first components may include the inspection result of a mounting failure for the A component in each of the plurality of substrates of the first type. Therefore, the inspection result of a mounting failure for the A component may include information indicating at least one substrate of the first type in which the mounting failure for the A component has occurred and at least one substrate of the first type in which the mounting failure for the A component has not occurred. The inspection result of a mounting failure may be generated by the first substrate inspection apparatus 150 for each of the plurality of first components and may be transferred to the electronic apparatus 110.

For example, when the component is not mounted on the substrate, when the offset of the mounted component is equal to or greater than a predetermined threshold value, and when the coplanarity of the mounted components is equal to or greater than a predetermined threshold value, the first substrate inspection apparatus 150 may determine that a mounting failure has occurred, and may generate an inspection result of a mounting failure for a component based on the determination result. In addition, the first substrate inspection apparatus 150 may transmit measurement information indicating a mounting state of each of the plurality of first components (e.g., information indicating whether a component is mounted, offset information of the mounted component, and coplanarity information of the mounted component) to the electronic apparatus 110, and the processor 320 may generate an inspection result of a mounting failure for each of the plurality of first components by using measurement information indicating a mounting state of each of the plurality of first components.

In step 420, the processor 320 may calculate a mounting failure rate of each of the plurality of first components by using the received inspection result. For example, the processor 320 may classify at least one substrate of the first type in which a mounting failure has not occurred for each of the plurality of first components and at least one substrate of the first type in which a mounting failure has occurred for each of the plurality of first components by using the inspection result. Thereafter, the processor 320 may calculate a mounting failure rate for each of the plurality of first components by using the number of at least one substrate of the first type in which a mounting failure has not occurred for each of the plurality of first components and the number of at least one substrate of the first type in which a mounting failure has occurred for each of the plurality of first components.

For example, the processor 320 may classify a plurality of substrates of the first type in which a mounting failure has not occurred for the A component and a plurality of substrates of the first type in which a mounting failure has occurred for the A component, among fifty substrates of the first type inspected by the first substrate inspection apparatus 150.

When the number of the substrates of the first type in which a mounting failure has not occurred for the A component is 35 and the number of the substrates of the first type in which a mounting failure has occurred for the A component is 15, the processor 320 may calculate the mounting failure rate of the A component as 30%. The processor 320 may repeat the mounting failure rate calculation process for each of the first components to calculate the mounting failure rate of each of the first components.

In step 430, the processor 320 may determine a plurality of second components in which a mounting failure has occurred among the first components based on the calculated mounting failure rate of each of the first components. For example, the processor 320 may determine a plurality of components having a mounting failure rate equal to or greater than a predetermined first threshold value among the mounting failure rates of each of the first components, and may determine the determined plurality of components as a plurality of second components in which the mounting failure has occurred.

For example, when the mounting failure rate of the A component is 1%, the mounting failure rate of the B component is 4%, and the predetermined first threshold value is 2%, the processor 320 may determine that the mounting failure has not occurred in A component and further that a mounting failure has occurred in B component.

By determining a plurality of second components in which the mounting failure has occurred among the plurality of first components, the processor 320 may simplify a process of determining a cause of a mounting failure to be described below. However, depending on the user's setting, step 430 may not be performed.

In step 440, the processor 320 may determine a cause of a mounting failure for each of the plurality of second components in which a mounting failure has occurred, based on the mounting failure rate of each of the plurality of first components. For example, the processor 320 may determine the cause of a mounting failure for each of the plurality of second components as at least one of a component mounting position setting error, a mounting condition setting error according to a component type, and a defect of a nozzle included in the mounter. However, this is merely for the purpose of explanation. The present disclosure is not limited thereto. A defect of a feeder included in the mounter, a defect of a spindle included in the mounter and a defect of a reel included in the mounter may be further set as the cause of a mounting failure. In this case, the processor 320 may determine the cause of a mounting failure for each of the plurality of second components as at least one of a component mounting position setting error, a mounting condition setting error according to a component type, a nozzle defect, a spindle defect, a feeder defect and a reel defect. A specific method for determining a cause of a mounting failure for each of a plurality of second components will be described later.

Figure 5:
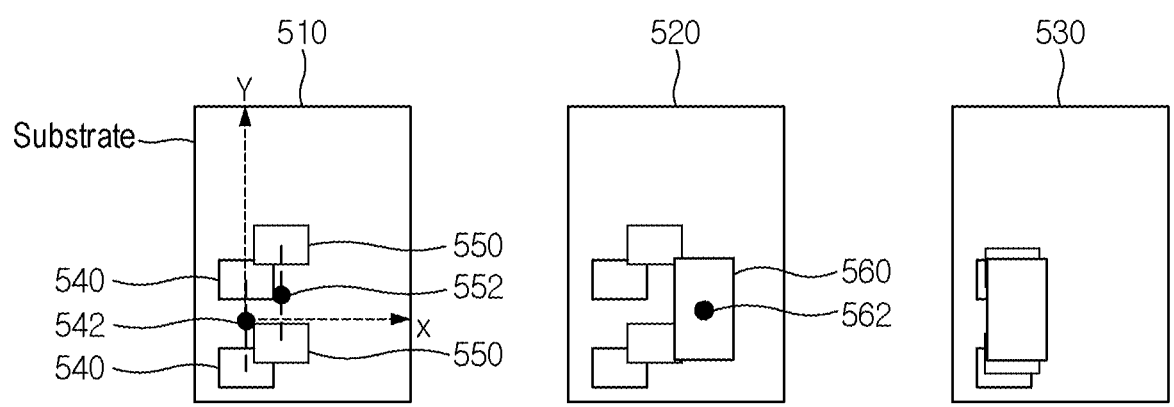
FIG. 5 illustrates pads, solder pastes and components on a substrate according to various embodiments of the present disclosure.

FIG. 5 illustrates pads, solder pastes and components on a substrate according to various embodiments of the present disclosure. As described above, the substrate 510 may include one or more pads 540. In an embodiment, the pads 540 may be formed in a pair. When the pads are formed in a pair, the position of the pads 540 may be a position of a center point 542 which is the center of the two pads. The center of the two pads may represent a point that is the center of a line segment connecting the centers of the two pads forming a pair. For example, when the pad is formed of one pad rather than a pair, such as a ball grid array (BGA) or the like, the position of the pad 540 may be the center of the pad. For example, when the substrate 510 is viewed in a XY coordinate plane, the center point 542 may become an origin point (0, 0), and may serve as a reference point indicating the position of the solder paste and the component.

In an embodiment, solder pastes 550 may be printed on the pads 540. The position of the solder pastes 550 may be a position of a center 552 of the two solder pastes 550, for example, a position of a center of mass of the two solder pastes. The SPI apparatus 130 may measure a position offset of the printed solder pastes with respect to the pads. The position offset may mean a position coordinate, i.e., a two-dimensional vector of the center 552 of the solder pastes based on the origin point 542.

In addition, a Z coordinate including a height may be added to the XY coordinate. Based on this, the position offset may be a position of a point which is the center of at least one solder paste, i.e., a point which is the center of mass. That is, the position offset may mean a three-dimensional vector. The position offset may further include rotation information indicating an angle offset of the solder pastes with respect to the pads.

In an embodiment, a component 560 may be mounted on the substrate 520 on which the solder pastes 550 are printed. For example, the position of the component 560 may be a position of a point which is the center 562 of the component. The first substrate inspection apparatus 150 may measure a position offset of the mounted component with respect to the pads. The position offset may mean a position coordinate, i.e., a two-dimensional vector of the center 562 of the component based on the origin point 542. In addition, a Z coordinate including a height of at least one position of the component may be added based on the measurement position and slope information of the component. The position offset may mean a position coordinate, i.e., a three-dimensional vector of the center 562 of the component based on the origin point 542.

The substrate 520 on which the component 560 is mounted may be subjected to a reflow process. During the reflow process, the solder pastes 550 may be melted to change positions of the solder pastes 550 and the component 560. The second substrate inspection apparatus 170 may measure a position offset of the component with respect to the pads on the substrate 530 subjected to the reflow process. The position offset may mean a position coordinate, i.e., a two-dimensional vector of the center 562 of the component 562 with respect to the origin point 542 on the substrate 530 subjected to the reflow process. For example, each position offset may be defined as an absolute value of the distance from the origin point 542 to the corresponding position coordinate, instead of the form of a position coordinate or a vector. In the present disclosure, it can be said that the closer the position offset of the component is to 0 on the substrate subjected to the reflow process, the more successful the component bonding.

FIG. 6 is a table illustrating the mounting failure rates of components, component types and nozzles according to various embodiments of the present disclosure. According to various embodiments of the present disclosure, the processor 320 may calculate a mounting failure rate of each of the plurality of first components. Hereinafter, for the sake of convenience of description, it is assumed that a first threshold value, which is a reference for determining a plurality of second components in which a mounting failure has occurred among the plurality of first component, is 2%. Accordingly, the C0 to C13 components, the C17 component and the C18 component, which have mounting failure rates equal to or greater than the first threshold value as shown in FIG. 6, may be determined to be a plurality of second components in which a mounting failure has occurred. In addition, the C14 to C16 components and the C19 to C21 components, which have mounting failure rates less than the first threshold value, may be determined to be components in which a mounting failure has not occurred.

In an embodiment, the processor 320 may calculate mounting failure rate for the respective component types and mounting failure rates of the nozzles based on the calculated mounting failure rates of the plurality of first components. The processor 320 may determine a cause of a mounting failure for each of the plurality of second components in which a mounting failure has occurred, based on the calculated mounting failure rate for the respective component types and the calculated mounting failure rates of the nozzles. A specific method for determining a cause of a mounting failure for a plurality of second components will be described in more detail with reference to FIGS. 7 to 9.

Figure 7:
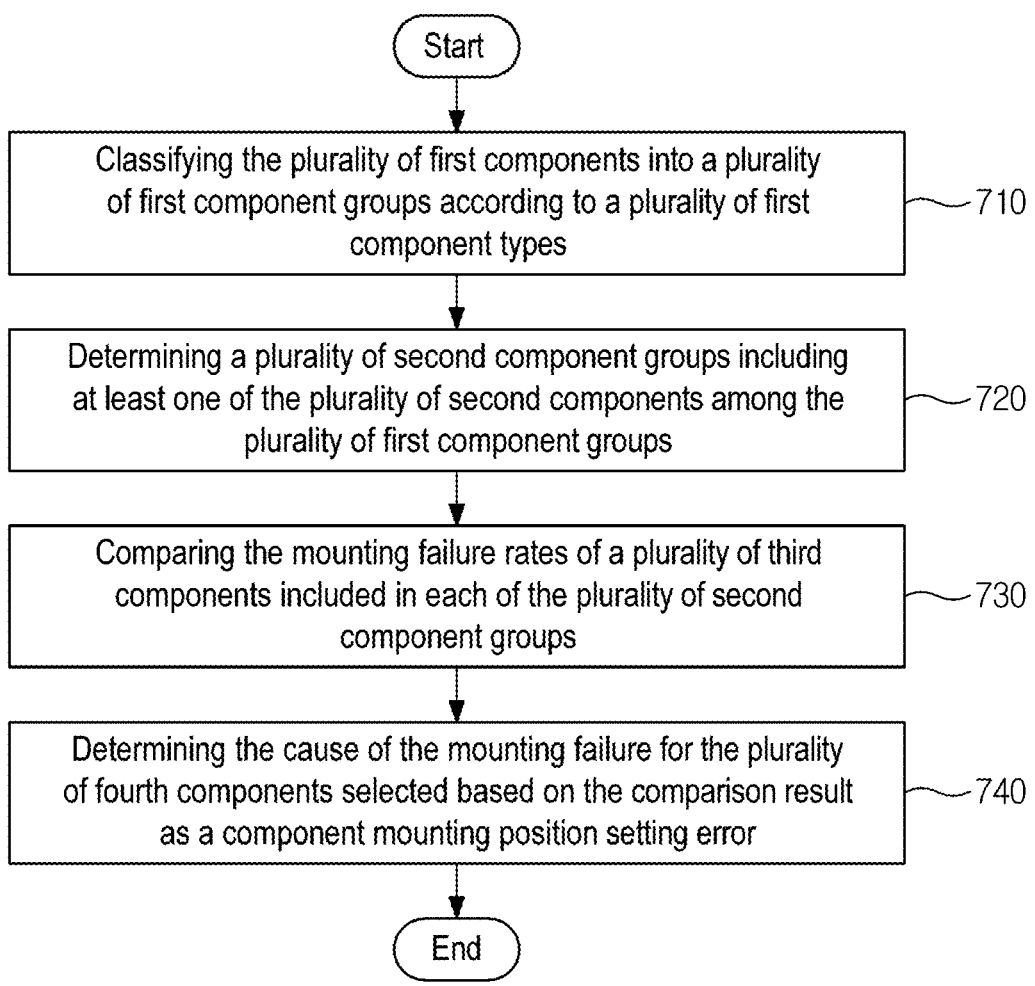
FIG. 7 is a flowchart illustrating a method for determining a cause of a mounting failure for a component as a component mounting position setting error according to various embodiments of the present disclosure.

FIG. 7 is a flowchart illustrating a method for determining a cause of a mounting failure for a component as a component mounting position setting error according to various embodiments of the present disclosure.

In step 710, the processor 320 of the electronic apparatus 110 may classify a plurality of first components, which may be classified as one type among a plurality of first component types according to the plurality of first component types, into a plurality of first component groups. For example, referring to FIG. 6, the processor 320 may classify C0 to C2 components classified as a P0 component type into a first component group 611, may classify C3 to C6 components classified as a P1 component type into a first component group 612, and may classify C7 and C8 components classified as a P2 component type into a first component group 613. Similarly, the processor 320 may classify C9 to C12 components classified as a P3 component type into a first component group 614, may classify C13 to C15 components classified as a P4 component type into a first component group 615, may classify a C16 component classified as a P5 component type into a first component group 616, may classify C17 and C18 components classified as a P6 component type into a first component group 617, and may classify C19 to C21 components classified as a P7 component type into a first component group 618.

In step 720, the processor 320 may determine a plurality of second component groups including at least one of the plurality of second components among the plurality of first component groups. The processor 320 may determine the plurality of first component groups 611, 612, 613, 614, 615 and 617 including at least one of the plurality of second components, for which it is determined that a mounting failure has occurred, as a plurality of second component groups. As a result, steps 730 and 740 to be described below may not be performed on the first component group 616 and the first component group 618 not included in the plurality of second component groups.

In step 730, the processor 320 may compare the mounting failure rates of a plurality of third components included in each of the plurality of second component groups 611, 612, 613, 614, 615 and 617, based on the mounting failure rate of each of the plurality of first components. For example, the processor 320 may compare the mounting failure rates of a plurality of third components included in each of the plurality of second component groups 611, 612, 613, 614, 615 and 617 in order to check whether at least one component having a mounting failure rate determined to be an outlier exists among the plurality of third components included in each of the plurality of second component groups 611, 612, 613, 614, 615 and 617.

For example, the mounting failure rates of the C0 to C2 components included in the second component group 611 may be compared with each other, the mounting failure rates of the C3 to C6 components included in the second component group 612 may be compared with each other, the mounting failure rates of the C7 and C8 components included in the second component group 613 may be compared with each other, the mounting failure rates of the C9 to C12 components included in the second component group 614 may be compared with each other, the mounting failure rates of the C13 to C15 components included in the second component group 615 may be compared with each other, and the mounting failure rates of the C17 and C18 components included in the second component group 617 may be compared with each other.

For example, the existence or absence of at least one component having a mounting failure rate determined as an outlier may be checked through the result of comparison of the mounting failure rates of the plurality of third components included in each of the plurality of second component groups 611, 612, 613, 614, 615 and 617 by using a method such as distance-based clustering, Grubb's test, mixed integer quadratically constrained programming (MIQCP), or the like.

In step 740, the processor 320 may determine a cause of a mounting failure for a plurality of fourth components selected based on the comparison result of step 730 among the plurality of second components in which a mounting failure has occurred as a component mounting position setting error. For example, the component mounting position setting error may include a design error of a component mounting position, an error caused by incorrectly inputting a component mounting position into the mounter, and the like.

In an embodiment, the plurality of fourth components may be components which are determined to have a mounting failure rate as an outlier based on the comparison result of step 730 in one of the plurality of second component groups 611, 612, 613, 614, 615 and 617. For example, the lowest mounting failure rate among the mounting failure rates of the plurality of third components included in the second component groups 611, 612, 613, 614, 615 and 617 may be a criterion for determining the outlier. For example, the mounting failure rate, 53%, of the C1 component in the second component group 611, the mounting failure rate, 27%, of the C4 component in the second component group 612, the mounting failure rate, 29%, of the C7 component in the second component group 613, the mounting failure rate, 18%, of the C10 component in the second component group 614, the mounting failure rate, 1%, of the C15 component in the second component group 615, and the mounting failure rate, 5%, of the C17 component in the second component group 617, may be a criterion for determining the outlier.

For example, the difference between the mounting failure rate of the C4 component, which is a criterion for determining the outlier in the second component group 612, and the mounting failure rate of the C6 component, may be determined to have an abnormal value in view of the difference between the mounting failure rate of the C4 component, the mounting failure rate of the C3 component and the mounting failure rate of the C5 component. Accordingly, the processor 320 may determine the mounting failure rate of the C6 component as the outlier, and may determine the C6 component as a component having the mounting failure rate determined as the outlier in the second component group 612.

Similarly, the difference between the mounting failure rate of the C15 component, which is a criterion for determining the outlier in the second component group 615, and the mounting failure rate of the C13 component may be determined to have an abnormal value in view of the difference between the mounting failure rate of the C15 component and the mounting failure rate of the C14 component. Accordingly, the processor 320 may determine the mounting failure rate of the C13 component as the outlier, and may determine the C13 component as a component having the mounting failure rate determined as the outlier in the second component group 615.

Meanwhile, the processor 320 may confirm that a component having a mounting failure rate determined as an outlier does not exist in the plurality of second component groups 611, 613, 614 and 617, based on the comparison result of step 730. As a specific method for determining whether a mounting failure rate of specific component is an outlier in view of the comparison between the mounting failure rate of the specific component and the mounting failure rate of other component in the second component group, it may be possible to use a method such as distance-based clustering, Grubb's test, MIQCP, or the like as described above.

The processor 320 may determine that the mounting failure for the component having the mounting failure rate determined as the outlier among the components of the same type is caused by a component mounting position setting error, and may determine that the cause of the mounting failure for the component having the mounting failure rate determined as the outlier is a component mounting positioning error.

Figure 8:
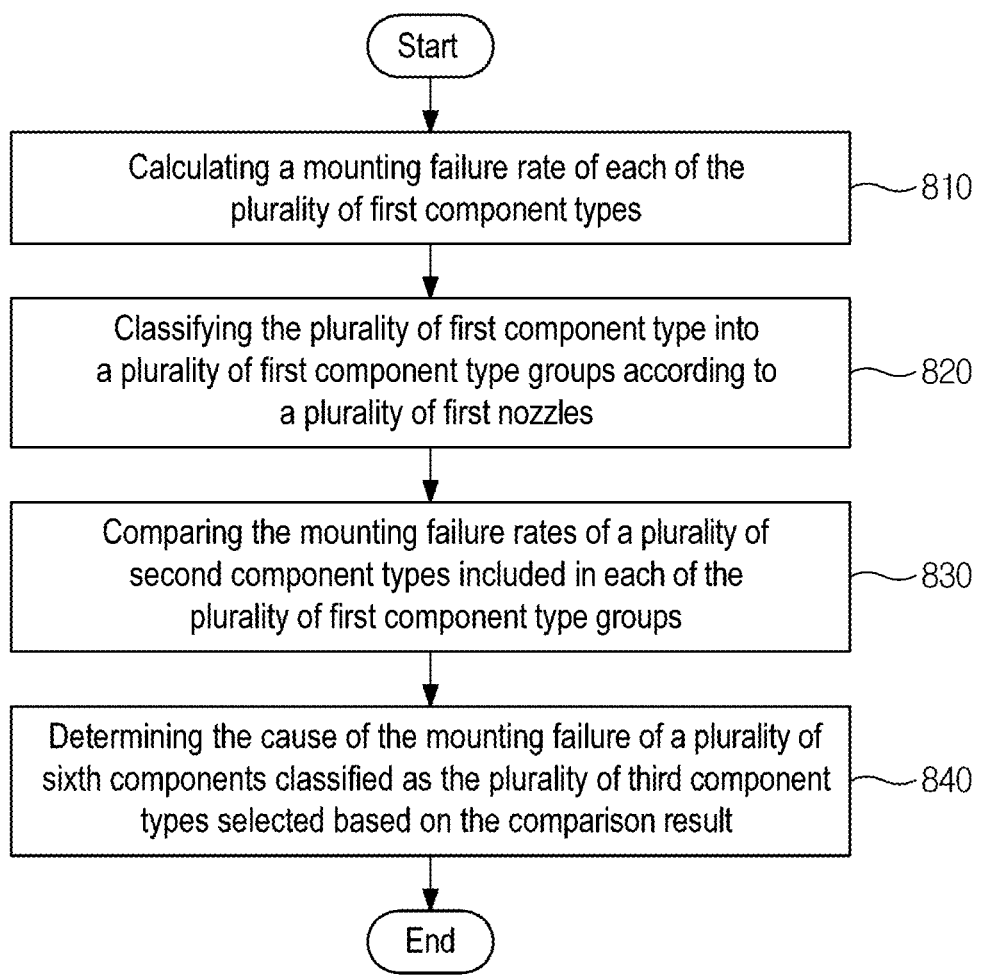
FIG. 8 is a flowchart illustrating a method for determining a cause of a mounting failure for a component as a mounting condition setting error according to a component type according to various embodiments of the present disclosure.

FIG. 8 is a flowchart illustrating a method for determining a cause of a mounting failure for a component as a mounting condition setting error according to a component type according to various embodiments of the present disclosure.

In step 810, the processor 320 of the electronic apparatus 110 may calculate a mounting failure rate of each of the plurality of first component type based on the mounting failure rate of each of a plurality of fifth components among the plurality of first components excluding the plurality of fourth components whose mounting failure cause is determined to be a component mounting position setting error. For example, the mounting failure rate of a specific component type is a mounting failure rate calculated by using the mounting failure rates of components classified as a specific component type, and may be used to check how many mounting failures have occurred in each component type and to determine whether or not the cause of a mounting failure is a mounting condition setting error according to a component type.

The mounting failure for the plurality of fourth components is most affected by the component mounting position setting error. Therefore, when calculating the mounting failure rate of each of the plurality of first types in consideration of the mounting failure rate of the plurality of fourth components together, the mounting failure rate of each of the plurality of first types may not be accurately calculated. Accordingly, the processor 320 may calculate the mounting failure rate of each of the plurality of first component types based on the mounting failure rate of each of the plurality of fifth components excluding the plurality of fourth components.

In an embodiment, referring to FIG. 6, the processor 320 may calculate a mounting failure rate of the P0 component type based on the mounting failure rates of the C0 to C2 components. For example, the processor 320 may calculate a mounting failure rate of the P0 component type as 55%, which is an average of the mounting failure rates of the C0 to C2 components. Similarly, the processor 320 may calculate a mounting failure rate of the P2 component type based on the mounting failure rates of the C7 and C8 components. For example, the processor 320 may calculate a mounting failure rate of the P2 component type as 31%, which is an average of the mounting failure rates of the C7 and C8 components. The processor 320 may calculate a mounting failure rate of each of the P3 component type, the P5 component type, the P6 component type and the P7 component type in the same manner.

The processor 320 may calculate a mounting failure rate of the P1 component type based on the mounting failure rates of the C3 to C5 components. As described above, in order to accurately calculate the mounting failure rate of the P1 component type, the processor 320 may not use the mounting failure rate of the C6 component, the mounting failure cause of which is determined to be the component mounting position setting error, to calculate the mounting failure rate of the P1 component type. The processor 320 may calculate a mounting failure rate of the P1 component type as 29%, which is an average of the mounting failure rates of the C3, C4 and C5 components. Similarly, the processor 320 may calculate a mounting failure rate of the P4 component type as 1% by using the mounting failure rates of the C14 and C15 components except for the mounting failure rate of the C13 component.

In step 820, the processor 320 may classify a plurality of first component types into a plurality of first component type groups 621, 622 and 623 according to a plurality of first nozzles used to mount the plurality of first components. For example, referring to FIG. 6, when a N0 nozzle is used to mount the C0 to C8 components, the P0 to P2 component types may be classified into the first component type group 621. In addition, when a N1 nozzle is used to mount the C9 to C16 components, the P3 to P5 component types may be classified into the first component type group 622. When a N2 nozzle is used to mount the C17 to C21 components, the P6 and P7 component types may be classified into the first component type group 623.

In step 830, the processor 320 may compare the mounting failure rates of the plurality of second component types included in each of the plurality of first component type groups 621, 622 and 623. For example, the processor 320 may compare the mounting failure rates of a plurality of second component types included in each of the plurality of first component type groups 621, 622 and 623 in order to check whether at least one component type having a mounting failure rate determined to be an outlier exists among the plurality of second component types included in each of the plurality of first component type groups 621, 622 and 623.

For example, the mounting failure rates of the P0 to P2 component types included in the first component type group 621 may be compared with each other, the mounting failure rates of the P3 to P5 component types included in the second component type group 622 may be compared with each other, and the mounting failure rates of the P6 and P7 component types included in the second component type group 623 may be compared with each other.

For example, the existence or absence of at least one component type having a mounting failure rate determined as an outlier may be checked through the result of comparison of the mounting failure rates of the plurality of second component types included in each of the plurality of first component type groups 621, 622 and 623 by using a method such as distance-based clustering, Grubb's test, MIQCP, or the like.

In step 840, the processor 320 may determine a cause of a mounting failure for a plurality of sixth components classified as a plurality of third component types selected based on the comparison result of step 830 among the plurality of second components in which a mounting failure has occurred as a mounting condition setting error according to a component type. For example, the mounting condition setting error according to a component type may include a setting error of mounter control parameters (e.g., a spindle moving speed, a nozzle's component suction pressure, a feeder moving speed, a reel division value, etc.) which are set for each component type. However, this is merely for the purpose of explanation. The present disclosure is not limited thereto. Various mounter control parameter setting errors set for each component type may be included in the mounting condition setting error according to a component type.

In an embodiment, each of the plurality of third component types may be a component type having a mounting failure rate determined as an outlier based on the result of comparison of step 830 among the plurality of first component type groups 621, 622 and 623. For example, the lowest mounting failure rate among the mounting failure rates of the plurality of second component types included in the plurality of first component type groups may be a criterion for determining the outlier. For example, the mounting failure rate, 29%, of the P1 component type in the first component type group 621, the mounting failure rate, 1%, of the P4 component type in the first component type group 622, and the mounting failure rate, 0.33%, of the P7 component type in the first component type group 623, may be used as a criterion for determining the outlier.

For example, the difference between the mounting failure rate of the P1 component type, which is a criterion for determining the outlier in the first component type group 621, and the mounting failure rate of the P5 component type may be determined to have an abnormal value in view of the difference between the mounting failure rate of the P1 component type and the mounting failure rate of the P2 component type. Accordingly, the processor 320 may determine the mounting failure rate of the P0 component type as the outlier, and may determine the P0 component type as a component type having the mounting failure rate determined as the outlier in the first component type group 621. Similarly, the processor 320 may determine the P3 component type as a component type having the mounting failure rate determined as the outlier in the first component type group 622.

In addition, when it is determined that the difference between the mounting failure rate of the P7 component type, which are criteria for determining the outlier in the first component type group 623, and the mounting failure rate of the P6 component type is equal to or greater than a predetermined threshold value, the processor 320 may determine the mounting failure rate of the P6 component type as an outlier. As described above, when there are two mounting failure rates to be compared, the outlier may be determined by comparing the difference between the two mounting failure rates and the threshold value. The processor 320 may determine the P6 component type as a component type having the mounting failure rate determined as the outlier in the first component type group 623.

The processor 320 may determine the cause of the mounting failure for the C0 to C2 components classified as the P0 component type as a mounting condition setting error according to a component type. In addition, the processor 320 may determine the cause of the mounting failure for the C9 to C12 components classified as the P3 component type and the C17 and C18 components classified as the P6 component type as a mounting condition setting error according to a component type.

Although not shown, based on the comparison result of step 830, the processor 320 may determine that there is no mounting failure rate determined as an outlier in a specific component type group. As a specific method for determining whether the mounting failure rate of a specific component type is an outlier when compared with the mounting failure rates of other component types classified as the first component type group, it may be possible to use a method such as distance-based clustering, Grubb's test, MIQCP or the like as described above.

The processor 320 may determine that the mounting failure for the component classified as the component type having the mounting failure rate determined as the outlier among the components mounted through the same nozzle is caused by the mounting condition setting error according to a component type. Accordingly, the processor 320 may determine that the cause of the mounting failure for the component classified as the component type having the mounting failure rate determined as the outlier is a mounting condition setting error according to a component type.

Figure 9:
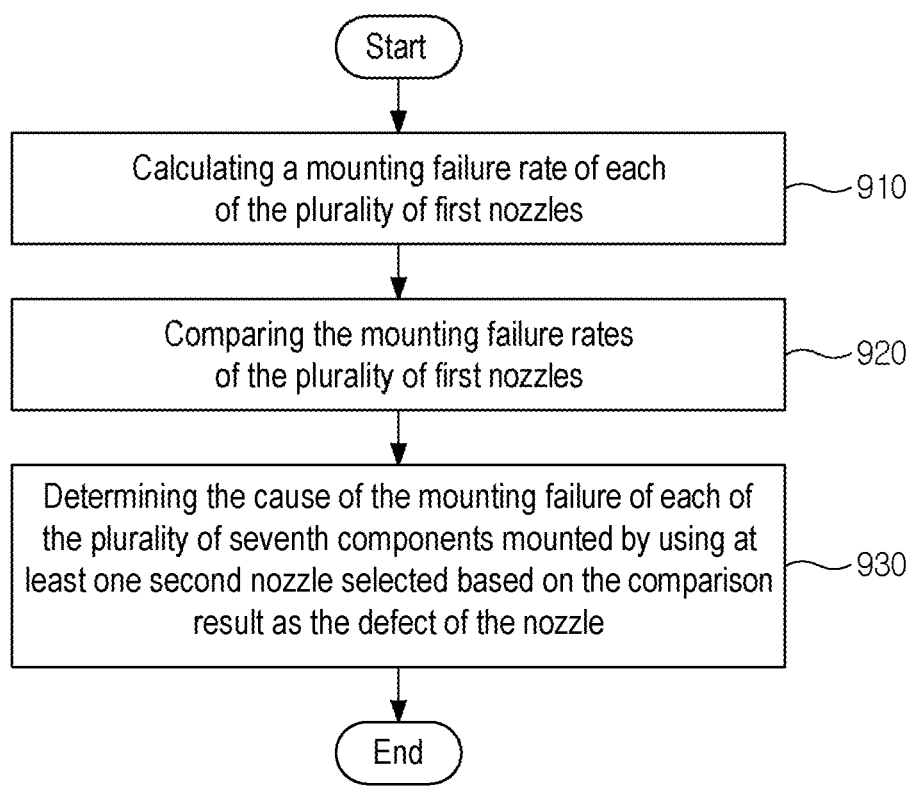
FIG. 9 is a flowchart illustrating a method for determining a cause of a mounting failure for a component as a nozzle defect according to various embodiments of the present disclosure.

FIG. 9 is a flowchart illustrating a method for determining a cause of a mounting failure for a component as a nozzle defect according to various embodiments of the present disclosure.

In step 910, the processor 320 of the electronic apparatus 110 may calculate a mounting failure rate of each of a plurality of first nozzles based on the mounting failure rate of each of the plurality of fourth component types except for the plurality of third component types, which is the component type of a plurality of sixth components having a cause of a mounting failure determined as a mounting condition setting error according to a component type, among the plurality of first component types. For example, the mounting failure rate of a specific nozzle is a mounting failure rate calculated by using the mounting failure rates of the components mounted by the specific nozzle, and may be used to check how much mounting failure rate has occurred for each nozzle and to determine whether or not the cause of the mounting failure is a nozzle defect.

The mounting failure for the plurality of sixth components is most affected by the mounting condition setting error according to a component type. Therefore, when calculating the mounting failure rate of each of the plurality of first nozzles in consideration of the mounting failure rate of the third component type as a component type of the plurality of sixth components together, the mounting failure rate of each of the plurality of first nozzles may not be accurately calculated. Accordingly, the processor 320 may calculate the mounting failure rate of each of the plurality of first nozzles based on the mounting failure rate of each of the plurality of fourth component types excluding the plurality of third component types.

For example, referring to FIG. 6, the processor 320 may calculate a mounting failure rate of a N0 nozzle based on the mounting failure rates of the P1 and P2 component types. As described above, in order to accurately calculate the mounting failure rate of the N0 nozzle, the processor 320 may not use the mounting failure rate of the P0 component type, which is the component type of the C0, C1 and C2 components having a cause of a mounting failure determined as a mounting condition setting error according to a component type, to calculate the mounting failure rate of the N0 nozzle. The processor 320 may calculate the mounting failure rate of the N0 nozzle as 30%, which is an average of the mounting failure rates of the P1 and P2 component types.

In addition, the processor 320 may calculate a mounting failure rate of a N1 nozzle based on the mounting failure rate of the P4 and P5 component types. In order to accurately calculate the mounting failure rate of the N1 nozzle, the processor 320 may not use the mounting failure rate of the P3 component type to calculate the mounting failure rate of the N1 nozzle. The processor 320 may calculate the mounting failure rate of the N1 nozzle as 1%, which is an average of the mounting failure rates of the P4 and P5 component types.

Furthermore, the processor 320 may calculate a mounting failure rate of a N2 nozzle based on the mounting failure rate of the P8 component type. In order to accurately calculate the mounting failure rate of the N2 nozzle, the processor 320 may not use the mounting failure rate of the P6 component type to calculate the mounting failure rate of the N2 nozzle. The processor 320 may calculate the mounting failure rate of the N2 nozzle as 0.33%, which is the mounting failure rate of the P7 component type.

In step 920, the processor 320 may compare the mounting failure rates of the plurality of first nozzles with each other. For example, the processor 320 may compare the mounting failure rates of the plurality of first nozzles to check whether there is at least one second nozzle having a mounting failure rate determined as an outlier among the plurality of first nozzles. For example, the mounting failure rates of the N0 to N2 nozzles may be compared with each other.

For example, the existence or absence of at least one second nozzle having a mounting failure rate determined as an outlier may be checked through the result of comparison of the mounting failure rates of the plurality of first nozzles by using a method such as distance-based clustering, Grubb's test, MIQCP, or the like.

In step 930, the processor 320 may determine that the cause of a mounting failure for a plurality of seventh components mounted by the at least one second nozzle selected based on the result of comparison of step 920 among the plurality of second components in which a mounting failure has occurred is a nozzle defect. For example, the nozzle defect is a mechanical defect of the nozzle itself. Due to the nozzle defect, the nozzle may not operate according to the set control parameters.

In an embodiment, the at least one second nozzle may be a nozzle having a mounting failure rate determined as an outlier based on the result of comparison of step 920 among the plurality of first nozzles. For example, the lowest mounting failure rate among the mounting failure rates of the plurality of first nozzles may be a criterion for determining an outlier. For example, the mounting failure rate of the N2 nozzle, 0.33%, may be a criterion for determining an outlier.

For example, the difference between the mounting failure rate of the N2 nozzle, which is a criterion for determining an outlier, and the mounting failure rate of the N0 nozzle may be determined to have an abnormal value in view of the difference between the mounting failure rate of the N2 nozzle and the mounting failure rate of the N1 nozzle. Accordingly, the processor 320 may determine that the mounting failure rate of the N0 nozzle is an outlier, and may determine the N0 nozzle as a nozzle having a mounting failure rate determined as an outlier. In addition, the processor 320 may determine the cause of the mounting failure for the C0 to C8 components mounted by the N0 nozzle as a nozzle defect.

The processor 320 may determine that the mounting failure for the component mounted by a nozzle having a mounting failure rate determined as an outlier among the components mounted by a plurality of nozzles attached to the same spindle during a component mounting process has occurred due to a nozzle defect. Accordingly, the processor 320 may determine that the cause of the mounting failure for the component mounted by the nozzle having the mounting failure rate determined as the outlier is a nozzle defect.

In an embodiment, the mounting failure for the component may occur due to various causes of a mounting failure. Therefore, the causes of the mounting failure for the component may be determined to be two or more rather than one. For example, the causes of the mounting failure for the C0 to C2 components may be determined as a mounting condition setting error according to a component type and a nozzle defect error, and the causes of the mounting failure for the C6 component may be determined as a component mounting position setting error and a nozzle defect error.

Meanwhile, in FIGS. 7 to 9, for the sake of convenience, description has been made mainly on the case where the cause of the mounting failure for the plurality of second components in which a mounting failure has occurred is determined as at least one of the component mounting position setting error, the mounting condition setting error according to a component type and the nozzle defect. However, the present disclosure is not limited thereto. For example, the processor 320 may further use a mounting failure rate for each of a plurality of feeders included in the mounter, a mounting failure rate for each of a plurality of spindles included in the mounter and a mounting failure rate for each of a plurality of reels included in the mounter, to determine the cause of the mounting failure for the plurality of second components. In this case, the processor 320 may determine the cause of the mounting failure for the plurality of second components as at least one of a component mounting position setting error, a mounting condition setting error according to a component type, a feeder defect, a nozzle defect, a spindle defect and a reel defect.

For example, the mounting failure rate of the plurality of feeders may be calculated in the same manner as the method for calculating the mounting failure rate of each of the plurality of nozzles based on the mounting failure rate of each of the plurality of component types. In this case, the mounting failure rate of each of the plurality of nozzles may be calculated through the use of the mounting failure rate of each of the plurality of feeders in the same manner as the method for calculating the mounting failure rate of each of the plurality of nozzles using the mounting failure rate of each of the plurality of component types described above. Furthermore, the mounting failure rate of the plurality of spindles may be calculated based on the mounting failure rate of each of the plurality of nozzles in the same manner as the method for calculating the mounting failure rate of each of the plurality of nozzles using the mounting failure rate of each of the plurality of component types described above. In addition, the method for determining the cause of the mounting failure for at least one of the plurality of second components as a feeder defect based on the calculated mounting failure rate of each of the plurality of feeders, the method for determining the cause of the mounting failure for at least one of the plurality of second components as a spindle defect, and the method for determining the cause of the mounting failure for at least one of the plurality of second components as a reel defect are the same as the method for determining the cause of the mounting failure described above. Therefore, detailed description thereof will be omitted.

Figure 10:
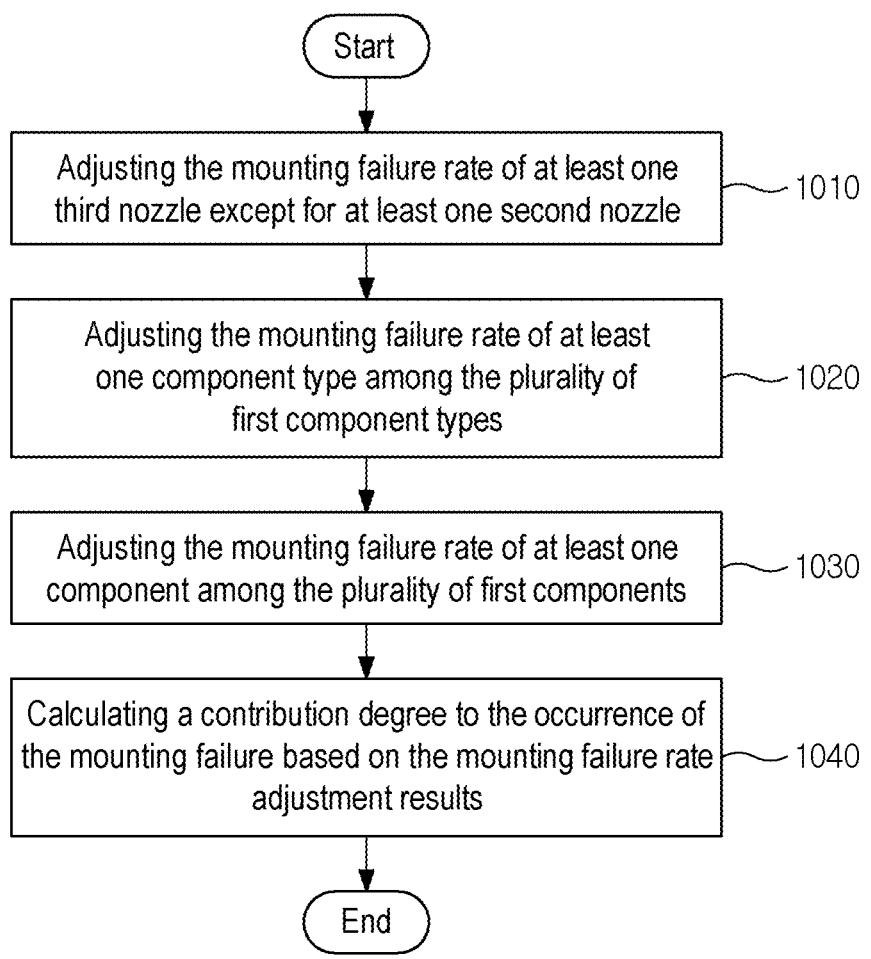
FIG. 10 is a flowchart illustrating a method for calculating a contribution degree to occurrence of a mounting failure according to various embodiments of the present disclosure.

FIG. 10 is a flowchart illustrating a method for calculating a contribution degree to occurrence of a mounting failure according to various embodiments of the present disclosure.

In step 1010, the processor 320 of the electronic apparatus 110 may adjust a mounting failure rate of at least one third nozzle except for the at least one second nozzle selected in step 930 among the plurality of first nozzles. For example, the processor 320 may adjust the mounting failure rate of the at least one third nozzle to 0%. Since the nozzle defect is not a cause of a mounting failure for the components mounted using the at least one third nozzle, the processor 320 may determine that the nozzle defect has no contribution to the occurrence of the mounting failure, and may adjust the mounting failure rate of the at least one third nozzle to 0%. For example, referring to FIG. 11, the processor 320 may adjust the mounting failure rates of the N1 nozzle and the N2 nozzle to 0%.

In step 1020, the processor 320 may adjust the mounting failure rate of at least one component type among the plurality of first component types based on at least one of the mounting failure rate of the at least one second nozzle and the mounting failure rate of the at least one third nozzle adjusted in step 1010.

For example, the processor 320 may adjust the mounting failure rate of the remaining plurality of component types other than the plurality of second component types selected in step 840 among the plurality of first component types to 0%. For the components classified as the remaining plurality of component types, the mounting condition setting error according to a component type is not a cause of a mounting failure. Therefore, the processor 320 may determine that the mounting condition setting error according to a component type has no contribution to the occurrence of the mounting failure, and may adjust the mounting failure rate to 0%. For example, referring to FIG. 11, the processor 320 may adjust the mounting failure rates of the P1 component type, the P2 component type, the P4 component type, the P5 component type and the P7 component type to 0%.

In addition, the processor 320 may adjust the mounting failure rate of the P0 component type to 25% which is reduced by 30% as the mounting failure rate of the N0 nozzle from 55% as the mounting failure rate of the P0 component type calculated in step 810. The processor 320 may determine that the mounting failure rate of the N0 nozzle is included in the mounting failure rate of the P0 component type calculated in step 810, and may adjust the mounting failure rate of the P0 component type. Meanwhile, the mounting failure rate of the P3 component type and the mounting failure rate of the P6 component type may not be adjusted because the mounting failure rate of the N1 nozzle and the N2 nozzle is 0%.

In step 1030, the processor 320 may adjust the mounting failure rate of at least one of the plurality of first components based on at least one of the mounting failure rate of at least one second nozzle, the mounting failure rate of at least one third nozzle adjusted in step 1010 and the mounting failure rate of at least one component type adjusted in step 1020.

For example, the processor 320 may adjust the mounting failure rate of the remaining plurality of components other than the plurality of fourth components selected in step 740 among the at least one component for which it is determined that a mounting failure has not occurred and the plurality of second components for which it is determined that a mounting failure has occurred among the plurality of first component types to 0%. For the remaining plurality of components, the component mounting position setting error is not a cause of a mounting failure. Therefore, the processor 320 may determine that the component mounting position setting error has no contribution to the occurrence of the mounting failure, and may adjust the mounting failure rate to 0%. For example, referring to FIG. 9, the processor 320 may adjust the mounting failure rates of each of the C0 to C5 components, the C7 to C12 components and the C14 to C21 components to 0%.

In addition, the processor 320 may adjust the mounting failure rate of the C6 component type to 15% which is reduced by 30% as the mounting failure rate of the N0 nozzle from 45% as the mounting failure rate of the C6 component calculated in step 420. The processor 320 may determine that the mounting failure rate of the N0 nozzle is included in the mounting failure rate of the C6 component calculated in step 420, and may adjust the mounting failure rate of the C6 component. In addition, unlike FIG. 9, when the mounting failure rate of the P4 type is not 0%, the processor 320 may determine that the mounting failure rate of the P4 type is also included in the mounting failure rate of the C6 component type. Thus, the processor 320 may also reduce the mounting failure rate of the P4 type in the mounting failure rate of the C6 component type, thereby adjusting the mounting failure rate of the C6 component type. Meanwhile, the mounting failure rate of the C13 component may not be adjusted because the mounting failure rate of each of the P4 component type and the N1 nozzle is 0%.

In step 1040, the processor 320 may calculate a contribution degree of each of the component mounting position setting error, the mounting condition setting error according to a component type and the nozzle defect to the occurrence of the mounting failure for the plurality of second components based on the result of the mounting failure rate adjustment performed in steps 1010 to 1030.

For example, the processor 320 may determine that the contribution degree of the P0 mounting condition setting error according to a component type to the occurrence of the mounting failure for the C0 to C2 components is 45% and further that the contribution degree of the N0 nozzle defect to the occurrence of the mounting failure for the C0 to C2 components is 55%. In addition, the processor 320 may determine that the contribution degree of the N0 nozzle defect to the occurrence of the mounting failure for the C3 to C5 components and the C7 and C8 components is 100%, the contribution degree of the C6 component mounting position setting error to the occurrence of the mounting failure for the C6 component is 33%, and the contribution degree of the N0 nozzle defect to the occurrence of the mounting failure for the C6 component is 67%.

Similarly, the processor 320 may determine that the contribution degree of the P3 mounting condition setting error according to a component type to the occurrence of the mounting failure for the C9 to C12 components is 100%, the contribution degree of the C13 component mounting position setting error to the occurrence of the mounting failure for the C13 component is 100%, and the contribution degree of the P6 mounting condition setting error according to a component type to the occurrence of the mounting failure for the C17 and C18 components is 100%.

As described above, the processor 320 may adjust the mounting failure rate calculated in the mounting failure cause determination process in order to calculate the contribution degree of each of the component mounting position setting error, the mounting condition setting error according to a component type and the defect of the nozzle included in the mounter to the occurrence of the mounting failure for the plurality of second components in which a mounting failure has occurred.

In addition, the processor 320 may display, on the display 340, the mounting failure rates of FIG. 6 calculated in the mounting failure cause determination process and the mounting failure rate of FIG. 11 obtained by adjusting the mounting failure rate calculated in the mounting failure cause determination process. For example, the processor 320 may set the height value of the cells displaying the mounting failure rates of the C6 and C13 components having the mounting failure rate determined as an outlier among the C0 to C21 components so as to become greater than the height value of the cells displaying the mounting failure rates of other components. The height value of the cells displaying the mounting failure rates of the C6 and C13 components may be determined based on the values of the mounting failure rates of the C6 and C13 components. In addition, the color of the cells displaying the mounting failure rates of the C6 and C13 components may also be distinguished from the color of the cells displaying the mounting failure rates of other components. However, this is merely for the purpose of explanation. The present disclosure is not limited thereto. The cells displaying the mounting failure rates of the C6 and C13 components may be indicated in various manners so as to be distinguished from the cells displaying the mounting failure rates of other components.

Similarly, the processor 320 may display, on the display 340, the cells displaying the mounting failure rates of the P0, P3 and P6 component types having the mounting failure rates determined as outliers among the P0 to P7 component types so as to be distinguished from the cells displaying the mounting failure rates of other component types. In addition, the processor 320 may also display, on the display 340, the cells displaying the mounting failure rate of the N1 nozzle having the mounting failure rate determined as an outlier among the N0 to N2 nozzles so as to be distinguished from the cells displaying the mounting failure rates of other nozzles. This enables the user to intuitively and easily recognize the cause of the mounting failure for each of the plurality of second components in which a mounting failure has occurred.

Figure 12:
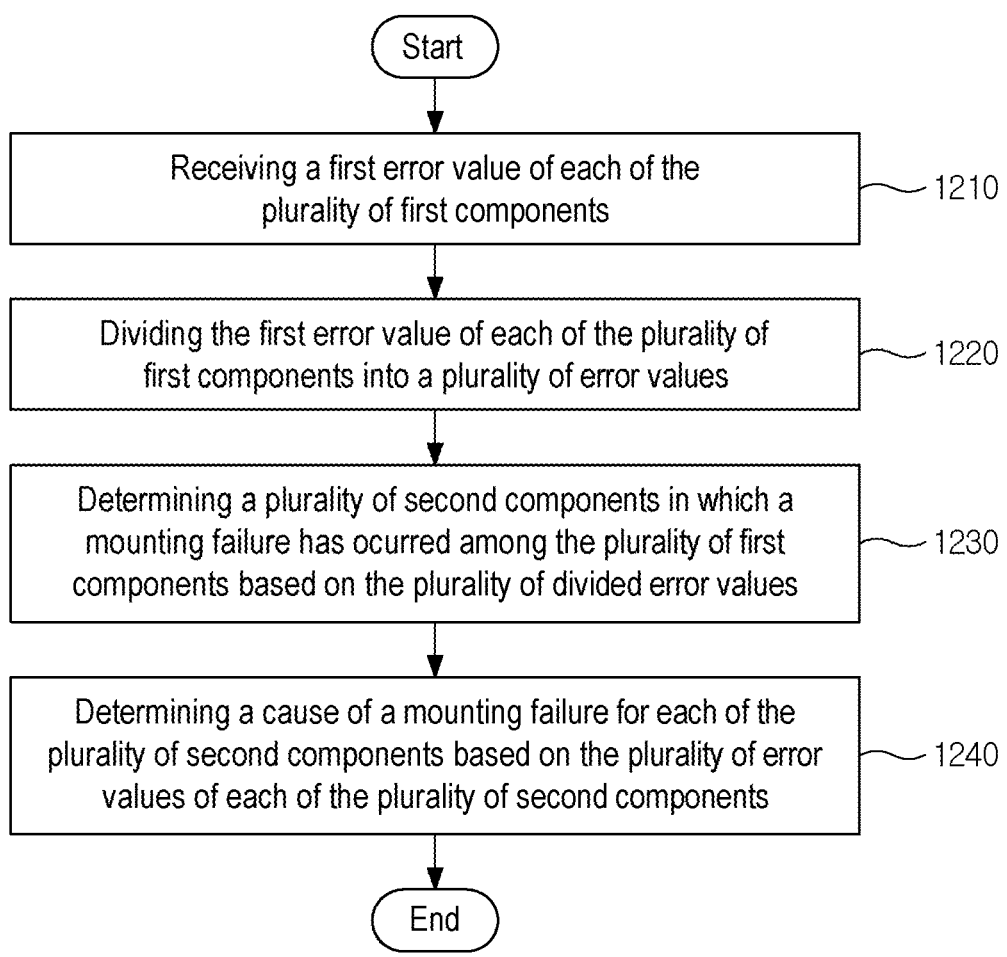
FIG. 12 is a flowchart illustrating a method for determining a cause of a mounting failure for each of a plurality of components mounted on a substrate according to various embodiments of the present disclosure.

FIG. 12 is a flowchart illustrating a method for determining a cause of a mounting failure for each of a plurality of components mounted on a substrate according to various embodiments of the present disclosure.

In step 1210, the processor 320 of the electronic apparatus 110 may receive a first error value of each of the plurality of first components determined by inspecting the plurality of substrates of the first type on which the plurality of first components are mounted. When the electronic apparatus 110 is configured separately from the first substrate inspection apparatus 150, the processor 320 may receive a first error value of each of the plurality of first components through the communication circuit 330. When the electronic apparatus 110 is included in the first substrate inspection apparatus 150, the processor 320 may directly generate a first error value of each of the plurality of first components through the information measured during the process of inspecting the plurality of substrates of the first type.

In an embodiment, the respective first components may be mounted at different positions on the substrate of the first type. In other words, the mounting positions of the respective first components on the substrate of the first type may be different from each other. For example, the A component may be mounted at the A position on the substrate of the first type, and the B component may be mounted at the B position on the substrate of the first type. In this regard, the types of the A component and the B component may be the same or may be different.

In addition, the same type of substrates may indicate that the substrates are manufactured according to the same design information. In other words, since the same type of substrates are manufactured according to the same design information, a specific component may be mounted at a specific position of each of the same type of substrates. For example, according to the design information of the substrate of the first type, the A components may be mounted at the A and B positions on the substrates of the first type.

In an embodiment, the first error value of each of the plurality of first components may be generated based on the measurement values measured for the inspection of the substrate performed by the first substrate inspection apparatus 150. For example, the first error value of each of the plurality of first components by comparing the information measured through the inspection of the plurality of substrates of the first type, for example, the mounting position of each of the plurality of first components and the coplanarity of each of the plurality of first components, with predetermined reference values.

In an embodiment, the first error value of each of the plurality of first components may include at least one of an error value for the mounting position of each of the plurality of first components and an error value for the coplanarity of each of the plurality of first components. For example, an error value for the mounting position of each of the plurality of first components may be calculated by comparing the mounting position of each of the plurality of first components measured through inspection with the reference position of each of the plurality of first components identified through design information of the substrate of the first type. In addition, an error value for the mounting position of each of the plurality of first components may be calculated by comparing the coplanarity of each of the plurality of first components measured through inspection with the reference coplanarity of each of the plurality of first components identified through the design information of the substrate of the first type. In this way, the first error value of each of the plurality of first components may be generated by comparing the measurement value measured through inspection with the reference value identified through the design information of the substrate.

In addition, the first error value of each of the plurality of first components may be generated using a plurality of measurement values of each of the plurality of first components measured in the process of inspecting the plurality of substrates of the first type. For example, the first error value of an A component among the plurality of first components may be an average value of differences between the plurality of measurement values of the A component measured in the process of inspecting each of the plurality of substrates of the first type and the reference value. However, this is merely for the purpose of explanation and the present disclosure is not limited thereto. One of an average value, a median value, a mode value, a minimum value, a maximum value and a standard deviation of the differences may be generated as the first error value.

In addition, the measurement information indicating whether each of the plurality of first components is mounted on the substrate of the first type may be used to determine a cause of a mounting failure for each of the plurality of first components. In this case, however, the mounting failure rate of each of the plurality of first components calculated based on the measurement information indicating whether each of the plurality of first components is mounted on the substrate of the first type may be used in place of the first error value of each of the plurality of first components to determine a cause of a mounting failure for each of the plurality of first components. Hereinafter, for sake of convenience of description, the description will be made mainly on a method for determining a cause of a mounting failure for each of the plurality of first components using the first error value of each of the plurality of first components. However, the present disclosure is not limited thereto. Even if the mounting failure rate of each of the first components is used, the cause of the mounting failure for each of the plurality of first posture may be determined in the same manner.

In step 1220, the processor 320 may divide the first error value of each of the plurality of first components into a plurality of error values caused by each of a plurality of predetermined mounting failure causes. For example, when the plurality of mounting failure causes are set to a component mounting position setting error, a mounting condition setting error according to a component type and a defect of a nozzle included in the mounter, the processor 320 may divide the first error value of each of the plurality of first components into a second error value caused by a component mounting position setting error, a third error value caused by a mounting condition setting error according to a component type and a fourth error value caused by a nozzle detect. Since the error values of the components measured through inspection of the substrate may be affected by each of a plurality of mounting failure causes, the sum of the error values caused by the plurality of mounting failure causes may be an error value of a component measured through the inspection of the substrate. Accordingly, the processor 320 may divide the first error value of each of the plurality of first components into a plurality of error values caused by a plurality of predetermined mounting failure causes.

In addition, a defect of a feeder included in the mounter, a defect of a spindle included in the mounter and a defect of a reel included in the mounter may be further set as a plurality of mounting failure causes by the user's setting. In this case, the processor 320 may divide the first error value into second to fourth error values, a fifth error value caused by the defect of the feeder, a sixth error value caused by the defect of the spindle and a seventh error value caused by the defect of the reel. In the following description, for the sake of convenience of description, the division of the first error value into the second to fourth error values will be mainly described. However, the present disclosure is not limited thereto. The first error value may be divided into a plurality of error values corresponding to the number of the mounting failure causes. A specific method for dividing a plurality of first error values will be described later.

In step 1230, the processor 320 may determine a plurality of second components in which a mounting failure has occurred among the plurality of first components based on the plurality of error values divided in step 1220. For example, the processor 320 may determine a plurality of second components in which a mounting failure has occurred among the plurality of first components based on the second error value, the third error value and the fourth error value of each of the plurality of first components. The processor 320 may determine a plurality of components falling outside a first range in which at least one of the second error value, the third error value and the fourth error value of each of the plurality of first components is set, and may determine the plurality of determined components as a plurality of second components in which a mounting failure has occurred.

For example, the first range is an error value range as a criterion for determining a mounting failure for a component. The first range may be differently set for each of the second error value, the third error value and the fourth error value, or may be identically set.

For example, it is assumed that the first error value of the A component among the plurality of first components is 1 μm, the first error value is divided into a second error value of 1 μm, a third error value of −30 μm and a fourth error of 30 μm, and the set first range is from −3 μm to 3 μm, the third error value and the fourth error value of the A component are out of the first range. Therefore, the processor 320 may determine the A component as a component in which a mounting failure has occurred even if the first error value as the sum of the second to fourth error values exists within the first range. In contrast, it is assumed that the first error value of the B component among the plurality of first components is 1 μm, the first error value is divided into a second error value of 1 μm, a second error value of −2 μm and a third error of −2 μm, and the set first range is from −3 μm to 3 μm, all of the second error value, the third error value and the fourth error value of the B component exist within the first range. Therefore, the processor 320 may determine the B component as a component in which a mounting failure has not occurred. The above description has been made mainly about the case where the first range set for each of the second error value, the third error value and the fourth error value remains the same. However, this is merely for the purpose of explanation. The present disclosure is not limited thereto.

The first ranges set for the second error value, the third error value and the fourth error value may be different.

The processor 320 may simplify a mounting failure cause determination process to be described below by determining a plurality of second components in which a mounting failure has occurred among the plurality of first components. However, depending on the user's setting, step 1230 may not be performed.

In step 1240, the processor 320 may determine a cause of a mounting failure for each of the plurality of second components based on the plurality of error values of each of the plurality of second components for which it is determined that a mounting failure has occurred. For example, the processor 320 may determine a cause of a mounting failure for each of the plurality of second components based on the second error value, the third error value and the fourth error value of each of the plurality of second components. For example, the processor 320 may determine the cause of the mounting failure for each of the plurality of second components as at least one of a component mounting position setting error, a mounting condition setting error according to a component type and a nozzle defect. However, this is merely for the purpose of explanation. The present disclosure is not limited thereto. A defect of a feeder, a defect of a spindle and a defect of a reel may be further set as mounting failure causes. In this case, the processor 320 may determine the cause of the mounting failure for each of the plurality of second components as at least one of a component mounting position setting error, a mounting condition setting error according to a component type, a nozzle defect, a spindle defect, a feeder defect and a reel defect. A specific method for determining the cause of the mounting failure for each of the plurality of second components will be described later.

In one embodiment, the processor 320 may further obtain an error variance value of each of the plurality of first components indicating a variance of the differences between the plurality of measurement values for each of the plurality of first components and the predetermined reference value. The error variance value of each of the plurality of first components may be calculated by the first substrate inspection device 150 based on the differences between the measurement values of the mounting positions of the plurality of first components mounted on the plurality of substrates of the first type and the reference values set for the mounting positions. The processor 320 may further obtain an error variance value of each of the plurality of first components from the first substrate inspection device 150. In addition, the processor 320 may directly generate an error variance value of each of the plurality of first components.

The processor 320 may divide the error variance value into a plurality of error variance values just like the first error value described above. That is, as in step 1220 of dividing the first error value described above, the processor 320 may divide the error variance value of each of the plurality of first components into an error variance value caused by a component mounting position setting error, an error variance value caused by a component-type-dependent mounting condition setting error and an error variance value caused by a nozzle defect. The error variance values of the components measured through the inspection of the substrates may be affected by each of a plurality of mounting failure causes. Thus, the sum of the error variance values due to each of the plurality of mounting failure causes may be the error variance values of the components measured through the inspection of the substrates. Accordingly, the processor 320 may divide the error variance value of each of the plurality of first components into a plurality of error variance values due to the plurality of predetermined failure causes. In addition, when the defects of a feeder, a spindle and a reel included in the mounter are further set as the plurality of mounting failure causes according to the user's setting, the error variance value for a component may be divided into an error variance value due to a component mounting position setting error, an error variance value due to a component-type-dependent mounting condition setting error, an error variance value due to a nozzle defect, an error variance value due to a feeder defect, an error variance value due to a spindle defect and an error variance value due to a reel defect. A specific method of dividing a plurality of error variance values is the same as a specific method of dividing a plurality of first error values, which will be described below. Thus, a separate description thereof will be omitted.

The processor 320 may determine a plurality of components in which at least one of the divided error variance values deviates from a predetermined second range, and may determine the determined components as a plurality of second components in which a mounting failure has occurred. A method of determining a plurality of second components in which a mounting failure has occurred using the divided error variance values is the same as the above-described method of determining a plurality of second components in which a mounting failure has occurred using the plurality of divided first error values. Thus, a separate description thereof will be omitted.

In addition, the processor 320 may determine a plurality of components in which at least one of the divided first error values deviates from a predetermined first range and at least one of the divided error variance values deviates from a predetermined second range, and may determine the determined components as a plurality of second components in which a mounting failure has occurred.

Hereinafter, for the sake of convenience of explanation, a description will be given mainly on a method of determining a mounting failure cause of each of a plurality of second components using a first error. However, the present disclosure is not limited thereto. The error variance value described above or both the first error value and the error variance value may be used to determine the mounting failure cause of each of the second components. The method of determining the mounting failure cause using the error variance value or both the first error value and the error variance value is the same as the method of determining the mounting failure cause using the first error value. Thus, a separate description thereof will be omitted. A specific method of determining the mounting failure cause of each of the plurality of second components using the first error value will be described later.

FIGS. 13A and 13B are tables illustrating first to fourth error values of each of a plurality of first components according to various embodiments of the present disclosure. According to various embodiments of the present disclosure, the processor 320 of the electronic apparatus 110 may display, on the display 340, the first error value of each of the plurality of first components received from the first substrate inspection apparatus 150 as shown in FIG. 13A. In addition, the processor 320 may display the second to fourth error values of each of the plurality of first components obtained by dividing the first error value of each of the plurality of first components as shown in FIG. 13B. Hereinafter, a method for dividing the first error value of each of the plurality of first components shown in FIG. 13A into the second to fourth error values of each of the plurality of first components shown in FIG. 13B, and determining the cause of the mounting failure for the plurality of second components using the second to fourth error values will be described.

In addition, for the sake of convenience of description, the first error value will be described as being an error value of a mounting position of each of the plurality of first components. However, the present disclosure is not limited thereto. The following description may apply even when the first error value is an error value for the coplanarity of each of the first components, or even when a mounting failure rate is used instead of the first error value.

Figure 14:
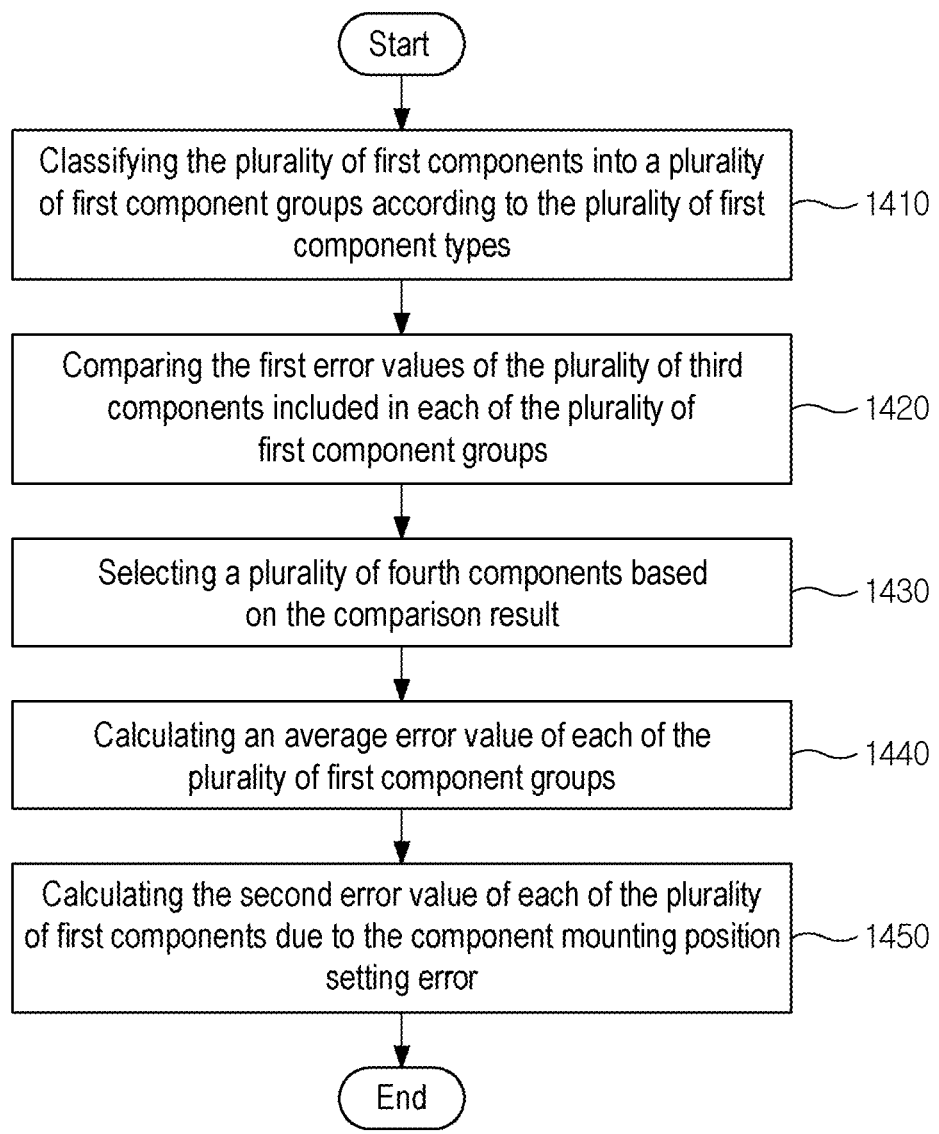
FIG. 14 is a flowchart illustrating a method for calculating a second error value of each of a plurality of first components according to various embodiments of the present disclosure.

FIG. 14 is a flowchart illustrating a method for calculating a second error value of each of a plurality of first components according to various embodiments of the present disclosure.

In operation 1410, the processor 320 of the electronic apparatus 110 may classify the plurality of first components classified as one of the plurality of first component types into a plurality of first component groups according to the plurality of first component types. For example, referring to FIG. 13B, the processor 320 may classify the C0 to C2 components classified as the P0 component type into a first component group 1311, may classify the C3 to C6 components classified as the P1 component type into a first component group 1312, and may classify the C7 and C9 components classified as the P2 component type into a first component group 1313. Similarly, the processor 320 may classify the C9 to C12 components classified as the P3 component type into a first component group 1314, may classify the C13 to C15 components classified as the P4 component type into a first component group 1315, may classify the C16 component classified as the P5 component type into a first component group 1316, may classify the C17 and C18 components classified as the P6 component type into a first component group 1317, and may classify the C19 to C21 components classified as the P7 component type into a first component group 1318.

In step 1420, the processor 320 may compare first error values of a plurality of third components included in each of the plurality of first component groups 1311, 1312, 1313, 1314, 1315, 1316, 1317 and 1318 based on the first error value of each of the plurality of first components. For example, the processor 320 may compare first error values of a plurality of third components included in each of the plurality of first component groups 1311, 1312, 1313, 1314, 1315, 1316, 1317 and 1318 in order to check whether there exists at least one component having the first error value determined as an outlier among the plurality of third components included in each of the plurality of first component groups 1311, 1312, 1313, 1314, 1315, 1316, 1317 and 1318.

For example, the first error values of the C0 to C2 components included in the first component group 1311 may be compared with each other, the first error values of the C3 to C6 components included in the first component group 1312 may be compared with each other, the first error values of the C7 and C8 components included in the first component group 1313 may be compared with each other, the first error values of the C9 to C12 components included in the first component group 1314 may be compared with each other, the first error values of the C13 to C15 components included in the first component group 1315 may be compared with each other, the first error values of the C17 and C18 components included in the first component group 1317 may be compared with each other, and the first error values of the C19 to C21 components included in the first component group 1318 may be compared with each other. Since only the C16 component is included in the first component group 1316, the process of comparing the first error values with each other may be omitted.

For example, the existence or absence of at least one component having a mounting failure rate determined as an outlier may be checked through the result of comparison of the first error values of the plurality of third components included in each of the plurality of first component groups 1311, 1312, 1313, 1314, 1315, 1316, 1317 and 1318 by using a method such as distance-based clustering, Grubb's test, mixed integer quadratically constrained programming (MIQCP), or the like.

In step 1430, the processor 320 may select a plurality of fourth components from among the plurality of first components based on the comparison result of step 1420. For example, the plurality of fourth components may be components having a first error value determined as an outlier based on the comparison result of step 1420 in one of the plurality of first component groups 1311, 1312, 1313, 1314, 1315, 1316, 1317 and 1318.

For example, in the first component group 1312, the difference between the first error value of the C6 component and the first error value of each of the C3 to C5 components may be determined to have an abnormal value in view of the difference between the first error values of the C3 to C5 components. Accordingly, the processor 320 may determine that the first error value of the C6 component is an outlier, and may determine the C6 component as a component having a first error value determined as the outlier in the first component group 1312. Similarly, the processor 320 may determine the C13 component as a component having a first error value determined as the outlier in the first component group 1315.

Meanwhile, the processor 320 may determine that a component having a first error value determined as an outlier does not exist in the plurality of first component groups 1311, 1313, 1314, 1317 and 1318, based on the comparison result of step 1420. As a specific method for determining whether the mounting failure rate of a specific component type is an outlier when compared with the mounting failure rates of other component types classified to the component type group, it may be possible to use a method such as distance-based clustering, Grubb's test, MIQCP or the like as described above.

In step 1440, the processor 320 may calculate an average error value of each of the plurality of first component group 1311, 1312, 1313, 1314, 1315, 1316, 1317 and 1318 based on the first error values of the plurality of fifth components except for the plurality of fourth components selected in step 1430 among the plurality of second components. For example, the processor 320 may exclude the C6 component for the first component group 1312 in which the component having the first error value determined as the outlier exists, and may calculate an average error value based on the first error values of the C3 to C5 components. Referring to FIG. 13A, an average error value of the first error values of the C3 to C5 components, 29 μm, may be calculated as the average error value of the first component group 1312. Similarly, for the first component group 1315, an average error value of the first error values of the C14 and C15 components except for the C13 component, 1 μm, may be calculated as the average error value of the first component group 1315.

Meanwhile, for the plurality of first component groups 1311, 1313, 1314, 1316, 1317 and 1318 in which a component having a first error value determined as an outlier does not exist, the processor 320 may calculate the average error value of the components included in each of the plurality of first component groups 1311, 1313, 1314, 1316, 1317 and 1318 as an average error value of each of the plurality of first component groups 1311, 1313, 1314, 1316, 1317 and 1318.

In step 1450, the processor 320 may calculate a second error value of each of the first components caused by a component mounting position setting error based on the first error value of each of the plurality of first components and the average error value of each of the plurality of first component groups 1311, 1312, 1313, 1314, 1315, 1316 and 1317 calculated in step 1440. For example, the component mounting position setting error may include a design error for a component mounting position, an error caused by incorrectly inputting a component mounting position into the mounter, and the like. The second error value may represent an error value generated due to the component mounting position setting error.

In an embodiment, the second error value of each of the plurality of first components may be calculated based on the difference between the error value of each of the plurality of first components and the average error value of one of a plurality of first groups including the plurality of first components. For example, the processor 320 may calculate a second error value of the C0 component, as 0 μm, which is the difference between 55 μm, which is the first error value of the C0 component, and 55 μm, which is the average error value of the first component group 1311 including the C0 component. Furthermore, the processor 320 may calculate a second error value of the C6 component having the first error value determined as the outlier, as 16 μm, which is the difference between 45 μm, which is the first error value of the C6 component, and 29 μm, which is the average error value of the first component group 1312 including the C6 component. Similarly, second error values may be calculated for the remaining components. The second error values calculated as described above may be used in a process of determining a plurality of second components in which a mounting failure has occurred among a plurality of first components and in a process of determining a cause of a mounting failure for each of a plurality of second components.

Figure 15:
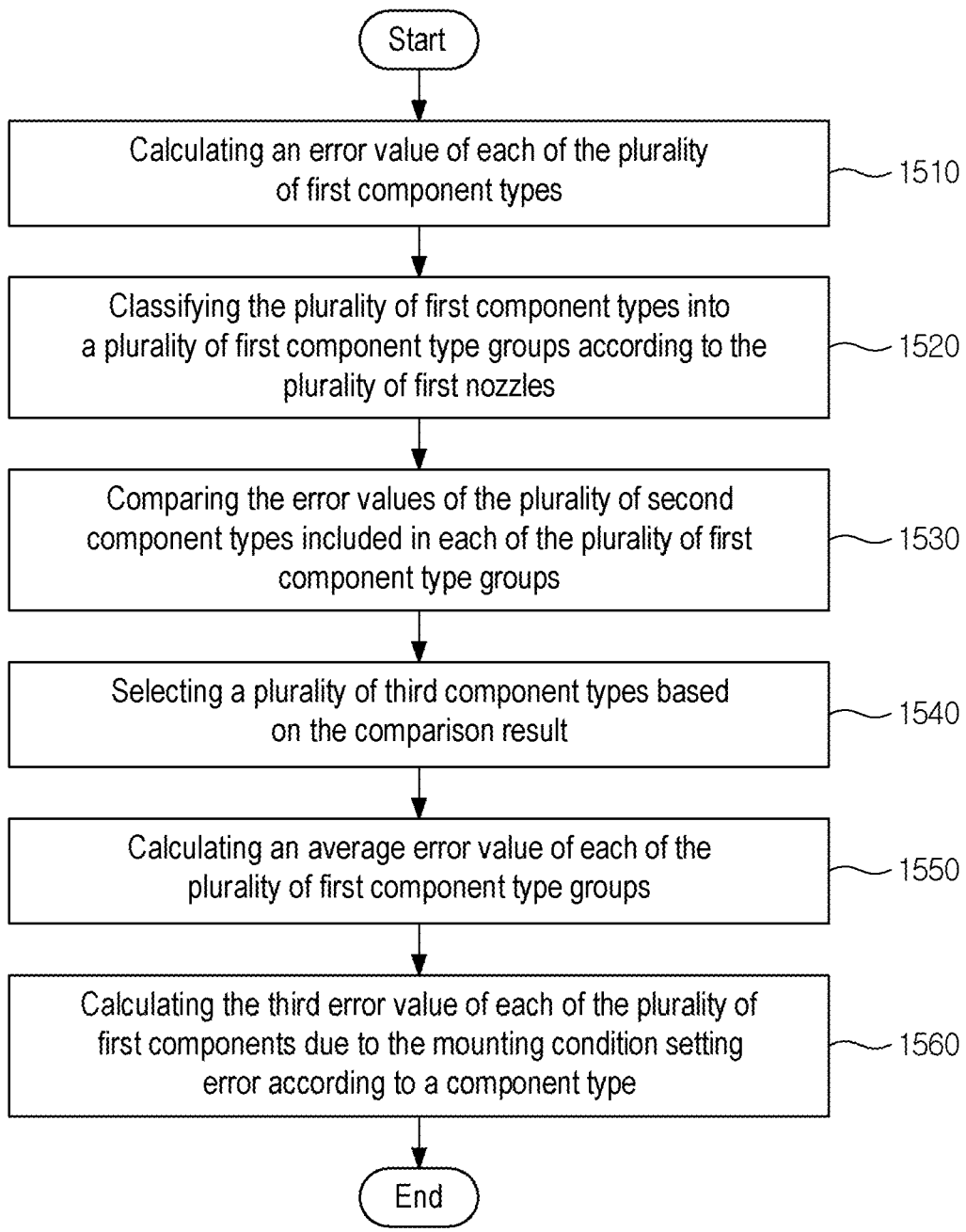
FIG. 15 is a flowchart illustrating a method for calculating a third error value of each of a plurality of first components according to various embodiments of the present disclosure.

FIG. 15 is a flowchart illustrating a method for calculating a third error value of each of a plurality of first components according to various embodiments of the present disclosure.

In step 1510, the processor 320 of the electronic apparatus 110 may calculate an error value of each of the plurality of first component types based on an average error value of each of the plurality of first component groups 1311, 1312, 1313, 1314, 1315, 1316, 1317 and 1318 calculated in step 1440. For example, the processor 320 may calculate the average error value of the first component group corresponding to each of the plurality of first component types as an error value of each of the plurality of first component types. For example, the error value of a specific component type may be used to check how much an error value has occurred for each component type and to calculate a third error value caused by a mounting condition setting error according to a component type.

For example, referring to FIG. 13B, the error value of the P0 component type may be calculated as 55 μm, which is an average error value of the first component group 1311 corresponding to the P0 component type, the error value of the P1 component type may be calculated as 29 μm, which is an average error value of the first component group 1312 corresponding to the P1 component type, and the error value of the P2 component type may be calculated as 31 μm, which is an average error value of the first component group 1313 corresponding to the P2 component type. Similarly, an error value may be calculated for each of the P3 to P7 component types.

In step 1520, the processor 320 may classify the plurality of first component types into a plurality of first component type groups 1321, 1322 and 1323 according to the plurality of first nozzles used to mount the plurality of first components. For example, referring to FIG. 13B, when the N0 nozzle is used to mount the C0 to C8 components, the P0 to P2 component types may be classified into the first component type group 1321. In addition, when the N1 nozzle is used to mount the C9 to C16 components, the P3 to P5 component types may be classified into the first component type group 1322. When the N2 nozzle is used to mount the C17 to C21 components, the P6 and P7 component types may be classified into the first component type group 1323.

In step 1530, the processor 320 may compare the error values of the plurality of second component types included in each of the plurality of first component type groups 1321, 1322 and 1323, based on the error value of each of the plurality of first component types. For example, the processor 320 may compare the mounting failure rates of the plurality of second component types included in each of the plurality of first component type groups 1321, 1322 and 1323 in order to check whether there exists at least one component type having an error value determined as an outlier among the plurality of second component types included in each of the plurality of first component type groups 1321, 1322 and 1323.

For example, the error values of the P0 to P2 component types included in the first component type group 1321 may be compared with each other, the error values of the P3 to P5 component types included in the second component type group 1322 may be compared with each other, and the error values of the P6 and P7 component types included in the second component type group 1323 may be compared with each other.

For example, the existence or absence of at least one component type having an error value determined as an outlier may be checked through the result of comparison of the mounting failure rates of the plurality of second component types included in each of the plurality of first component type groups 1321, 1322 and 1323 by using a method such as distance-based clustering, Grubb's test, MIQCP, or the like.

In step 1540, the processor 320 may select a plurality of third component types from among the plurality of first component types based on the comparison result of step 1530. For example, the plurality of third component types may be component types having an error value determined as an outlier based on the comparison result of step 1530 in one of the plurality of first component type groups 1321, 1322 and 1323.

For example, in the first component type group 1321, the difference between the error value of the P0 component type and the error value of each of the P1 and P2 component types may be determined to have an abnormal value in view of the difference between the error values of the P1 and P2 components. Accordingly, the processor 320 may determine that the error value of the P0 component type is an outlier, and may determine the P0 component type as a component having an error value determined as the outlier in the first component type group 1321. Similarly, the processor 320 may determine the P3 component type as a component type having an error value determined as the outlier in the first component type group 1322, and may determine the P6 component type as a component type having an error value determined as the outlier in the first component type group 1323. As a specific method for determining whether the error value of a specific component type is an outlier when compared with the error values of other component types classified as the component type group, it may be possible to use a method such as distance-based clustering, Grubb's test, MIQCP or the like as described above.

In step 1550, the processor 320 may calculate an average error value of each of the plurality of first component type group 1321, 1322 and 1323 based on the error values of the plurality of fourth component types except for the plurality of third component types selected in step 1540 among the plurality of first component types. For example, the processor 320 may exclude the P0 component type having an error value determined as an outlier from the first component type group 1321, and may calculate an average error value based on the error values of the P1 and P2 component types. For example, the processor 320 may calculate 30 μm, which is an average error value of the error values of the P1 and P2 component types, as an average error value of the first component type group 1321. Similarly, for the first component group 1322, the processor 320 may calculate 1 μm, which is an average error value of the P4 and P5 component types except for the P3 component type, as an average error value of the first component type group 1322. Since only the P7 component type except for the P6 component type exists in the first component type group 1323, the error value of the P7 component type, 0.33 um, may be calculated as an average error value of the first component type group 1323.

In step 1560, the processor 320 may calculate a third error value of each of the plurality of first components caused by a mounting condition setting error according to a component type, based on the error value of each of the plurality of first component types and the average error value of each of the plurality of first component type groups 1321, 1322 and 1323 calculated in step 1550. For example, the mounting condition setting error according to a component type may include a setting error of mounter control parameters (e.g., a moving speed of a spindle, a component suction pressure of a nozzle, a moving speed of a feeder, a decomposition value of a reel, etc.) set for each component type. However, this is merely for the purpose of description. The present disclosure is not limited thereto. Various mounter control parameter setting errors set for each component type may be included in the mounting condition setting error according to a component type. The third error value may indicate an error value generated due to such a mounting condition setting error according to a component type.

In an embodiment, the third error value of each of the plurality of first components may be calculated based on the difference between the error value of each of the plurality of first components and the average error value of one of a plurality of first component type groups 1321, 1322 and 1323 including the plurality of first component types. For example, the processor 320 may calculate a third error value of each of the C0 to C2 components, as 25 μm, which is a difference between 55 μm, which is the error value of the P0 component type including the C0 to C2 components, and 30 μm, which is the average error value of the first component type group 1321 including the P0 component type. Furthermore, the processor 320 may calculate a third error value of each of the C3 to C6 components, as −1 μm, which is a difference between 29 μm, which is the error value of the P1 component type including the C3 and C6 components, and 30 μm, which is the average error value of the first component type group 1321. Similarly, third error values may be calculated for the remaining components. The third error values calculated as described above may be used in a process of determining a plurality of second components in which a mounting failure has occurred among a plurality of first components and in a process of determining a cause of a mounting failure for each of a plurality of second components.

Figure 16:
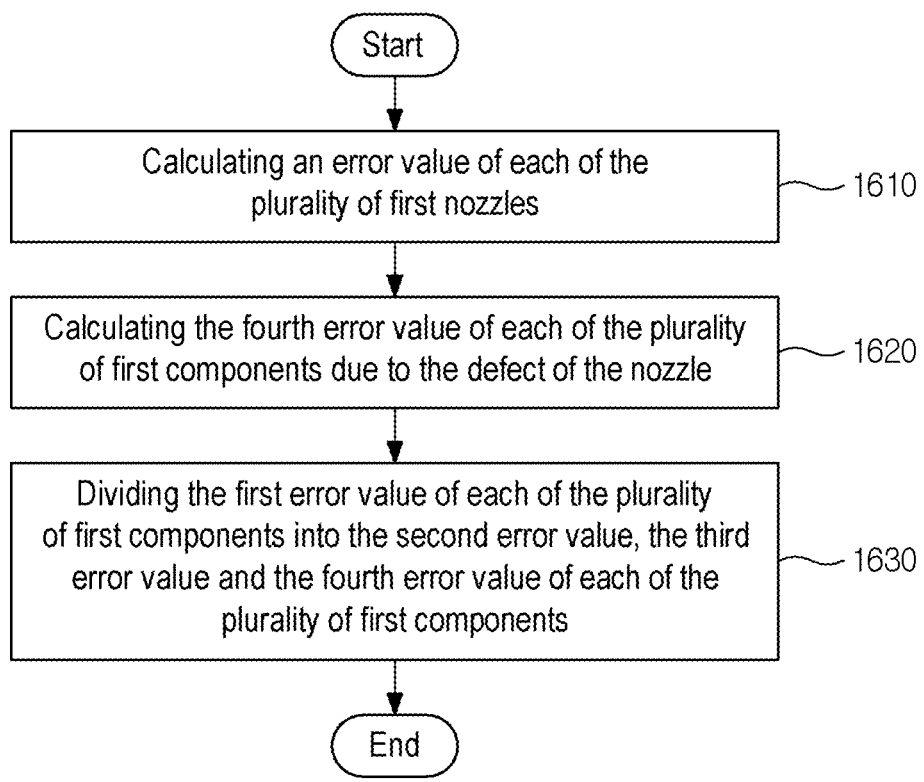
FIG. 16 is a flowchart illustrating a method for calculating a fourth error value of each of a plurality of first components according to various embodiments of the present disclosure.

FIG. 16 is a flowchart illustrating a method for calculating a fourth error value of each of a plurality of first components according to various embodiments of the present disclosure.

In step 1610, the processor 320 of the electronic apparatus 110 may calculate an error value of each of a plurality of first nozzles based on the average error value of each of the plurality of first component type groups 1321, 1322 and 1323 calculated in step 1550. For example, the processor 320 may calculate an average error value of each of the plurality of first component type groups 1321, 1322 and 1323 corresponding to each of the plurality of first nozzles as an error value of each of the plurality of first nozzles. The component type group corresponding to a specific nozzle among the plurality of first nozzles may indicate that the components classified as the plurality of component types included in the component type group are mounted by a specific nozzle. For example, the error value of a specific nozzle is an error value calculated by using the error values of the components mounted by the specific nozzle, and may be used to check how much error value has occurred for each nozzle and to calculate a fourth error value due to a nozzle defect.

For example, referring to FIG. 13B, the error value of the N0 nozzle may be calculated as 30 μm, which is an average error value of the first component type group 1321 corresponding to the N0 nozzle, the error value of the N1 nozzle may be calculated as 1 μm, which is an average error value of the first component type group 1322 corresponding to the N1 nozzle, and the error value of the N2 nozzle may be calculated as 0.33 μm, which is an average error value of the first component type group 1323 corresponding to the N2 nozzle.

In step 1620, the processor 320 may calculate a fourth error value of each of the plurality of first components due to the defect of a nozzle, based on the error value of each of the plurality of first nozzles calculated in step 1610. For example, the nozzle defect is a mechanical defect of a nozzle itself. By this defect, the nozzle may not operate according to the set control parameters.

In an embodiment, the fourth error value of each of the plurality of first components may be calculated based on the error value of each of the plurality of first nozzles. For example, the processor 320 may calculate the fourth error value of each of the C0 to C8 components mounted through the N0 nozzle as 30 μm, which is an error value of the N0 nozzle. In addition, the processor 320 may calculate the fourth error value of each of the C9 to C16 components mounted through the N1 nozzle as 1 μm, which is an error value of the N1 nozzle, and may calculate the fourth error value of each of the C17 to C21 components mounted through the N2 nozzle as 0.33 μm, which is an error value of the N2 nozzle. The fourth error value calculated as described above may be used in a process of determining a plurality of second components in which a mounting failure has occurred among a plurality of first components and in a process of determining a cause of a mounting failure for each of a plurality of second components.

In step 1630, the processor 320 may divide the first error value of each of the plurality of first components into a second error value, a third error value and a fourth error value of each of the plurality of first components. For example, the processor 320 may divide 55 μm, which is a first error value of the C0 component, into 0 μm, which is a second error value of the C0 component, 25 μm, which is a third error value of the C0 component, and 30 μm, which is a fourth error value of the C0 component. Similarly, the first error value of each of the remaining components may be divided into a second error value, a third error value and a fourth error value of each of the remaining components.

Figure 17:
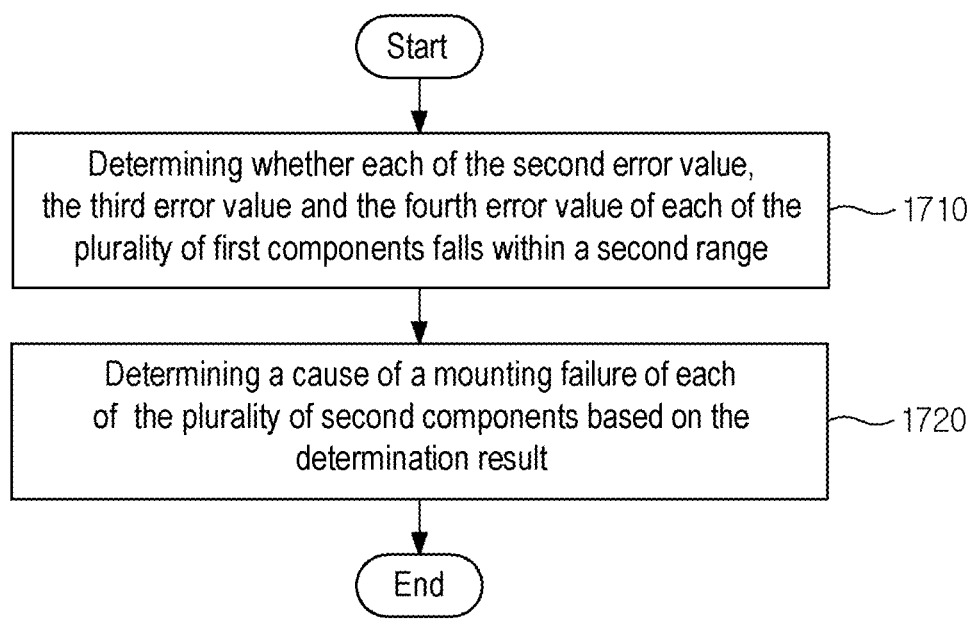
FIG. 17 is a flowchart illustrating a method for determining a cause of a mounting failure for each of a plurality of second components in which a mounting failure has occurred according to various embodiments of the present disclosure.

FIG. 17 is a flowchart illustrating a method for determining a cause of a mounting failure for each of a plurality of second components in which a mounting failure has occurred according to various embodiments of the present disclosure.

In step 1710, the processor 320 of the electronic apparatus 110 may determine whether each of the second error value, the third error value and the fourth error value of each of the first components divided in step 1630 falls within a preset second range. For example, the second range is a range of error values used as a criterion for determining a cause of a mounting failure. The second range may be set differently for each of the second error value, the third error value and the fourth error value, or may be set identically. In addition, the second range may be set to become the same as the aforementioned first range which is the criterion for determining the mounting failure for the component, or may be set to become different from the aforementioned first range. Hereinafter, for the sake of convenience of description, it will be assumed that the second range is from −3 μm to 3 μm.

In step 1720, the processor 320 may determine the cause of the mounting failure for each of the plurality of second components as at least one of a component mounting position setting error, a mounting condition setting error according to a component type and a nozzle defect based on the determination result of step 1710. For example, the processor 320 may determine that the second error value among the second error value, the third error value and the fourth error value of each of the C0 to C2 components falls within the second range, and the third error value and the fourth error value are out of the second range. Accordingly, the processor 320 may determine the causes of the mounting failure for each of the C0 to C2 components as a mounting condition setting error according to a component type and a nozzle defect.

In addition, the processor 320 may determine that only the fourth error value among the second error value, the third error value and the fourth error value of each of the C3 to C5 components is out of the second range and further that the cause of the mounting failure for each of the C3 to C5 components is a nozzle defect. Meanwhile, the processor 320 may determine that the second error value and the fourth error value of the C6 component are out of the second range and further that the causes of the mounting failure for the C6 component are a component mounting position setting error and a nozzle defect.

In FIGS. 14 to 17, for the sake of convenience, description has been made mainly on the case where the cause of the mounting failure for the plurality of second components in which a mounting failure has occurred is determined as at least one of the component mounting position setting error, the mounting condition setting error according to a component type and the nozzle defect. However, the present disclosure is not limited thereto. For example, the processor 320 may further use an error value of each of a plurality of feeders included in the mounter, an error value of each of a plurality of spindles included in the mounter and an error value of each of a plurality of reels included in the mounter to determine the cause of the mounting failure for the plurality of second components. In this case, the processor 320 may determine the cause of the mounting failure for the plurality of second components as at least one of a component mounting position setting error, a mounting condition setting error according to a component type, a feeder defect, a nozzle defect, a spindle defect and a reel defect.

For example, the error value of each of the plurality of feeders may be calculated based on the error value of each of the plurality of component types in the same manner as the method for calculating the error value of each of the plurality of nozzles described above. In this case, the error value of each of the plurality of nozzles may be calculated based on the error value of each of the plurality of feeders in the same manner as the method for calculating the error value of each of the plurality of nozzles using the error value of each of the plurality of component types described above. Furthermore, the error value of each of the plurality of spindles may be calculated based on the error value of each of the plurality of nozzles in the same manner as the method for calculating the error value of each of the plurality of nozzles using the error value of each of the plurality of component types described above. After calculating the error values of the plurality of feeders, the error values of the plurality of spindles and the error values of the plurality of reels, the first error value of each of the plurality of first components may be divided into second to seventh error values. The plurality of second components in which a mounting failure has occurred may be determined using the divided second to seventh error values, and the cause of the mounting failure for each of the plurality of second components may be determined. Since the method for determining the plurality of second components and determining the cause of the mounting failure for each of the plurality of second components is the same as the above-described method, detailed description thereof will be omitted.

Figure 18:
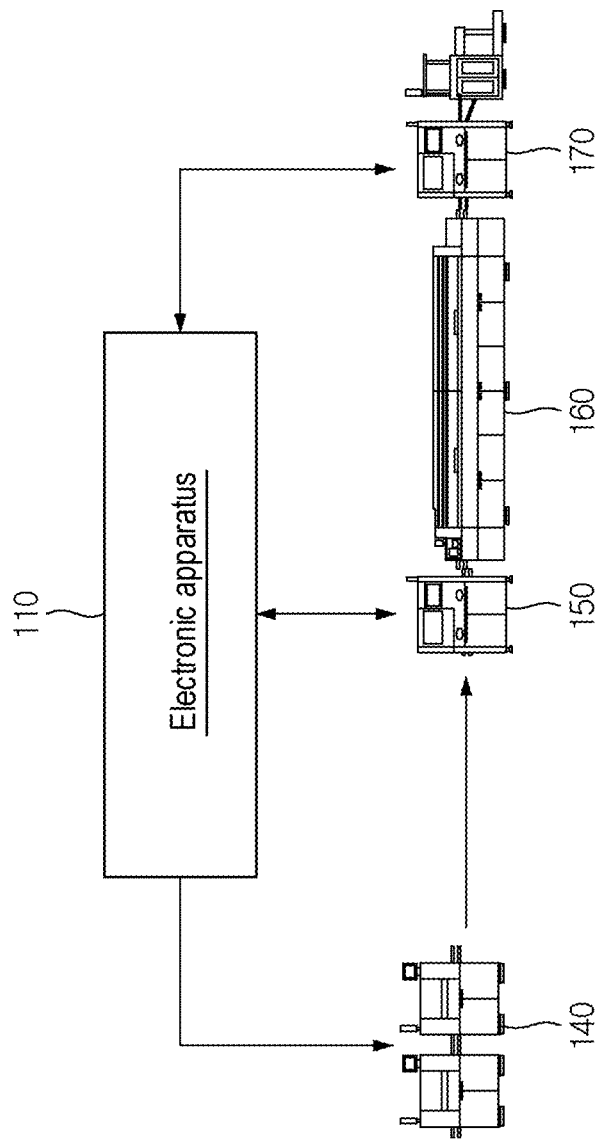
FIG. 18 is a diagram illustrating a method for controlling a mounter according to a cause of a mounting failure according to various embodiments of the present disclosure.

FIG. 18 is a diagram illustrating a method for controlling a mounter according to a cause of a mounting failure according to various embodiments of the present disclosure.

According to various embodiments of the present disclosure, the processor 320 of the electronic apparatus 110 may determine a cause of a mounting failure for each of a plurality of second components in which a mounting failure has occurred, and may control the mounter 140 based on the determined cause of the mounting failure for each of the plurality of second components. For example, based on the determined cause of the mounting failure for each of the plurality of second components, the processor 320 may transmit a control signal to the mounter 140 through the communication circuit 330 to change the control parameters of the mounter 140 to reduce the mounting failure rate.

In addition, if it is determined based on the cause of the mounting failure for each of the plurality of second components that the components (e.g., the nozzle, the spindle, the feeder, the reel, etc.) of the mounter 140 need to be replaced, the processor 320 may output a message indicating the necessity of replacement of the components of the mounter 140 through the display 340, or may transmit the message to the mounter 140 through the communication circuit 330 so that the message is outputted through the display of the mounter 140.

In an embodiment, the processor 320 may determine a plurality of fourth components having a mounting failure cause determined as a component mounting position setting error among the plurality of second components in which a mounting failure has occurred. The processor 320 may check the offset of each of the plurality of fourth components through the inspection result of the plurality of substrates of the first type received from the first substrate inspection apparatus 150. The processor 320 may generate a control signal for changing a control parameter associated with the mounting position setting of each of the plurality of fourth components such that the offset of each of the plurality of fourth components is less than a predetermined threshold value for the offset. The processor 320 may transmit the generated control signal to the mounter 140, and the mounter 140 may change the control parameter related to the mounting position setting of each of the plurality of fourth components in response to the control signal.

In an embodiment, the processor 320 may determine a plurality of sixth components having a mounting failure cause determined as a mounting condition setting error according to a component type among the plurality of second components in which a mounting failure has occurred. The processor 320 may check the offsets, the planarity and the like of each of the plurality of sixth components through the inspection result of the plurality of substrates of the first type received from the first substrate inspection apparatus 150. The processor 320 may generate a control signal for changing the control parameters (e.g., the head and spindle moving speeds, the corrected distance or coordinate for movement, the component suction pressure of the nozzle, the feeder moving speed, the reel decomposition value, etc.) of the mounter 140 set for the component types of the plurality of sixth components such that the offset, the planarity and the like of each of the plurality of sixth components is less than predetermined threshold values for the offset, the planarity and the like. The processor 320 may transmit the generated control signal to the mounter 140, and the mounter 140 may change the control parameter set for the component types of the plurality of sixth components in response to the control signal.

In an embodiment, the processor 320 may determine a plurality of seventh components having a mounting failure cause determined as a nozzle defect among the plurality of second components in which a mounting failure has occurred. The processor 320 may confirm the nozzle used to mount the plurality of seventh components. The processor 320 may output a message indicating the necessity of replacement of the confirmed nozzle through the display 340, or may transmit the message to the mounter 140 through the communication circuit 330 so that the message is outputted through the display of the mounter 140.

In addition, when a plurality of components having a mounting failure cause determined as a feeder defect, a spindle defect or a reel defect exists among the plurality of second components in which a mounting failure has occurred, the processor 320 may identify the feeder, the spindle or the reel used to mount a plurality of components. The processor 320 may output a message indicating the necessity of replacement of the identified feeder, spindle or reel through the display 340, or may transmit the message to the mounter 140 through the communication circuit 330 so that the message is outputted through the display of the mounter 140.

Figure 19A:
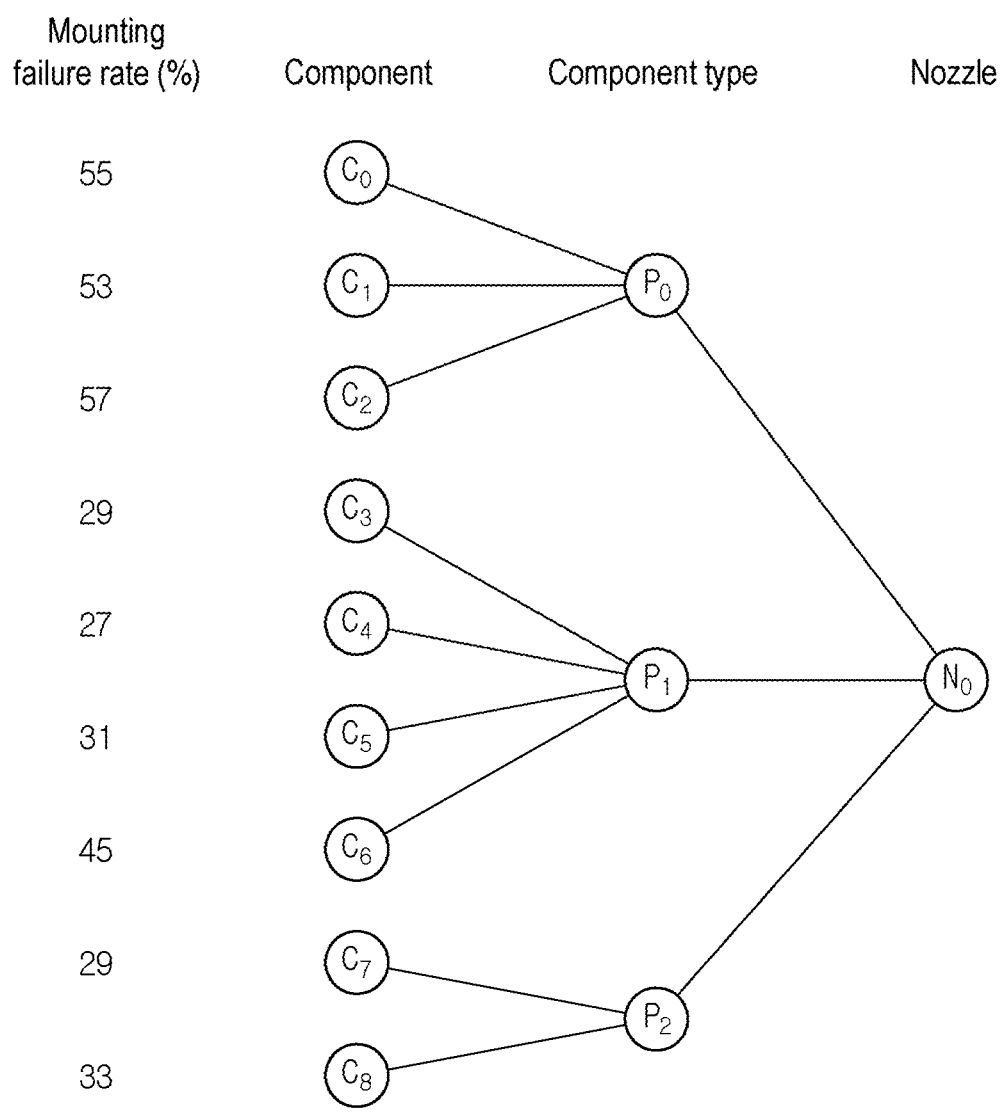
FIGS. 19A to 19C are graphs indicating mounting failure rates according to various embodiments of the present disclosure.
Figure 19B:
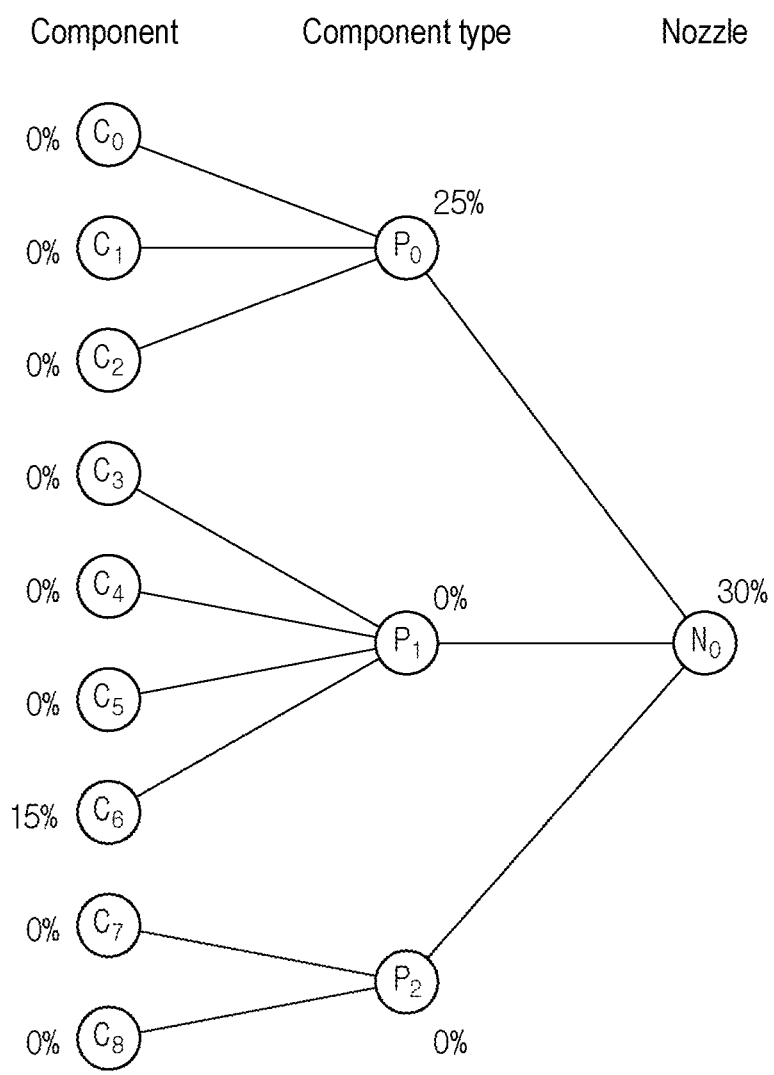
Figure 19C:
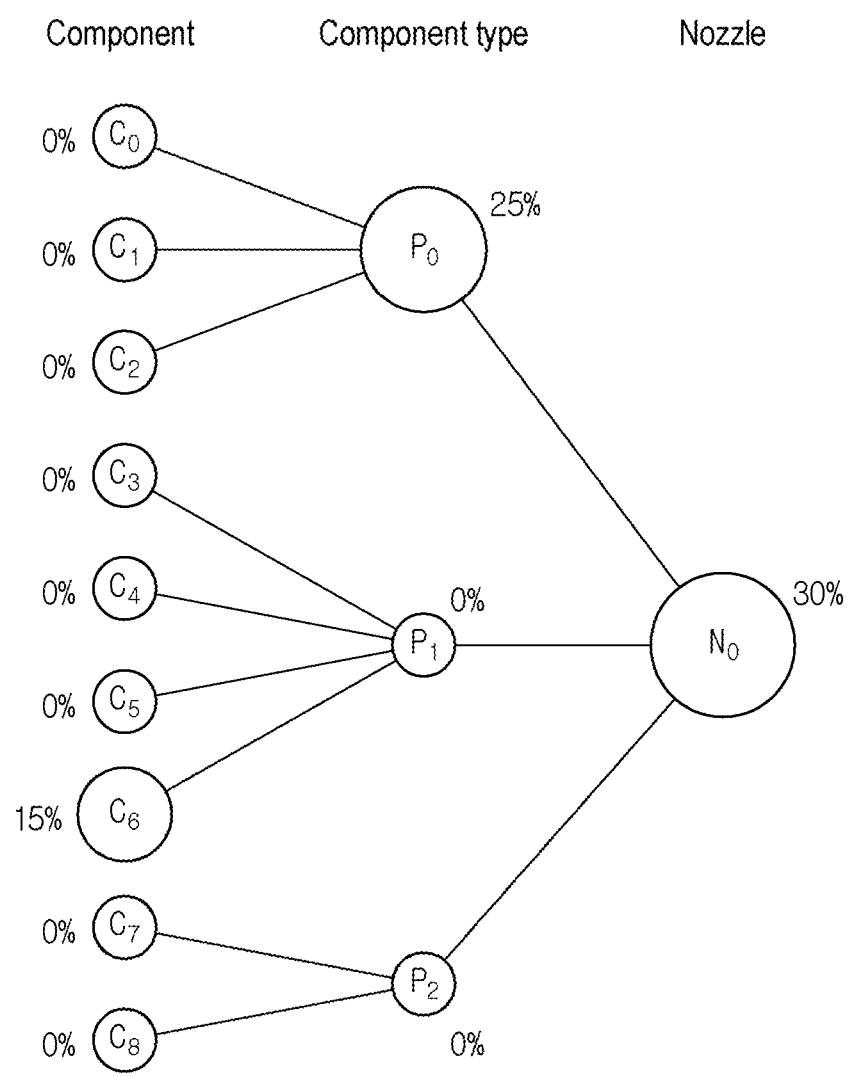

FIGS. 19A to 19C are graphs indicating mounting failure rates according to various embodiments of the present disclosure.

According to various embodiments of the present disclosure, the processor 320 of the electronic apparatus 110 may receive an inspection result on the mounting failure for each of the plurality of first components mounted on the plurality of substrates of the first type, and may calculate a mounting failure rate of each of the plurality of first components. The processor 320 may generate a graph having a tree structure as shown in FIG. 19A by using the calculated mounting failure rate of each of the plurality of first components, and may display the generated graph on the display 340. The graph shown in FIG. 19A may be displayed before the cause of the mounting failure for each of the plurality of second components in which a mounting failure has occurred is determined. The mounting failure rate of each of the plurality of first components calculated by the processor 320 may be indicated in the graph. In an embodiment, the graph may indicate the relationship between the plurality of components included in the mounter 140, the components mounted on the substrate and the types of components. For example, as shown in FIG. 19A, the graph may indicate the relationship between the plurality of first components, the plurality of first component types and the plurality of first nozzles as the components of the mounter 140. Description has been made mainly on the case where the graph has a tree structure. However, this is merely for the purpose of explanation. The present disclosure is not limited thereto. Various types of graphs may be used to indicate the relationship between the plurality of components included in the mounter, the components mounted on the substrate and the types of components.

The processor 320 may calculate a mounting failure rate of each of the plurality of first components, a mounting failure rate of each of the plurality of first component types and a mounting failure rate of each of the plurality of first nozzles by using the calculated mounting failure rate of each of the plurality of first components. The processor 320 may determine a mounting failure cause using the calculated result, and then may adjust the mounting failure rate of each of the plurality of first components, the mounting failure rate of each of the plurality of first component types and the mounting failure rate of each of the plurality of first nozzles. As shown in FIG. 19B, the processor 320 may indicate the adjusted mounting failure rate of each of the plurality of first components, the adjusted mounting failure rate of each of the plurality of first component types and the adjusted mounting failure rate of each of the plurality of first nozzles through the graph.

Furthermore, as shown in FIG. 19C, the processor 320 may adjust the nodes included in the graph to various graphic forms (e.g., a bubble form) according to the adjusted mounting failure rate of each of the plurality of first components, the adjusted mounting failure rate of each of the plurality of first component types and the adjusted mounting failure rate of each of the plurality of first nozzles, and may indicate the adjusted nodes so that the user can more clearly recognize the cause of the mounting failure. For example, the processor 320 may indicate a C6 component node having a mounting failure rate adjusted to 15%, a P0 component type node having a mounting failure rate adjusted to 25%, and a N0 nozzle node having a mounting failure rate adjusted to 30%, in a larger size than other nodes having mounting failure rates adjusted to 0%. In addition, the processor 320 may indicate the C6 component node, the P0 component type node and the N0 nozzle node in different sizes according to each adjusted mounting failure rate. Moreover, the processor 320 may generate and display a chart or table indicating a mounting failure rate ranking in which the mounting failure rates of the mounter components, the components and the component types are aligned according to the magnitude of the mounting failure rates.

In the above description, the size of the node is differently indicated according to the adjusted failure rate. However, this is merely for the purpose of description. The present disclosure is not limited thereto. It may be possible to use various methods such as changing the color, shape or size of one of a point, a line, a surface and a solid of a node, so that the user may more clearly recognize a cause of a mounting failure.

In addition, the node may be indicated by symbolizing not only the 2D/3D bubble form but also the actual form (e.g., a component shape, a nozzle shape, or the like) of a component and then adjust the size or color thereof, or by adjusting the size or color of the number/character of each component (e.g., a nozzle character, a type character, a number, a component name, an error value, or the like).

Figure 20A:
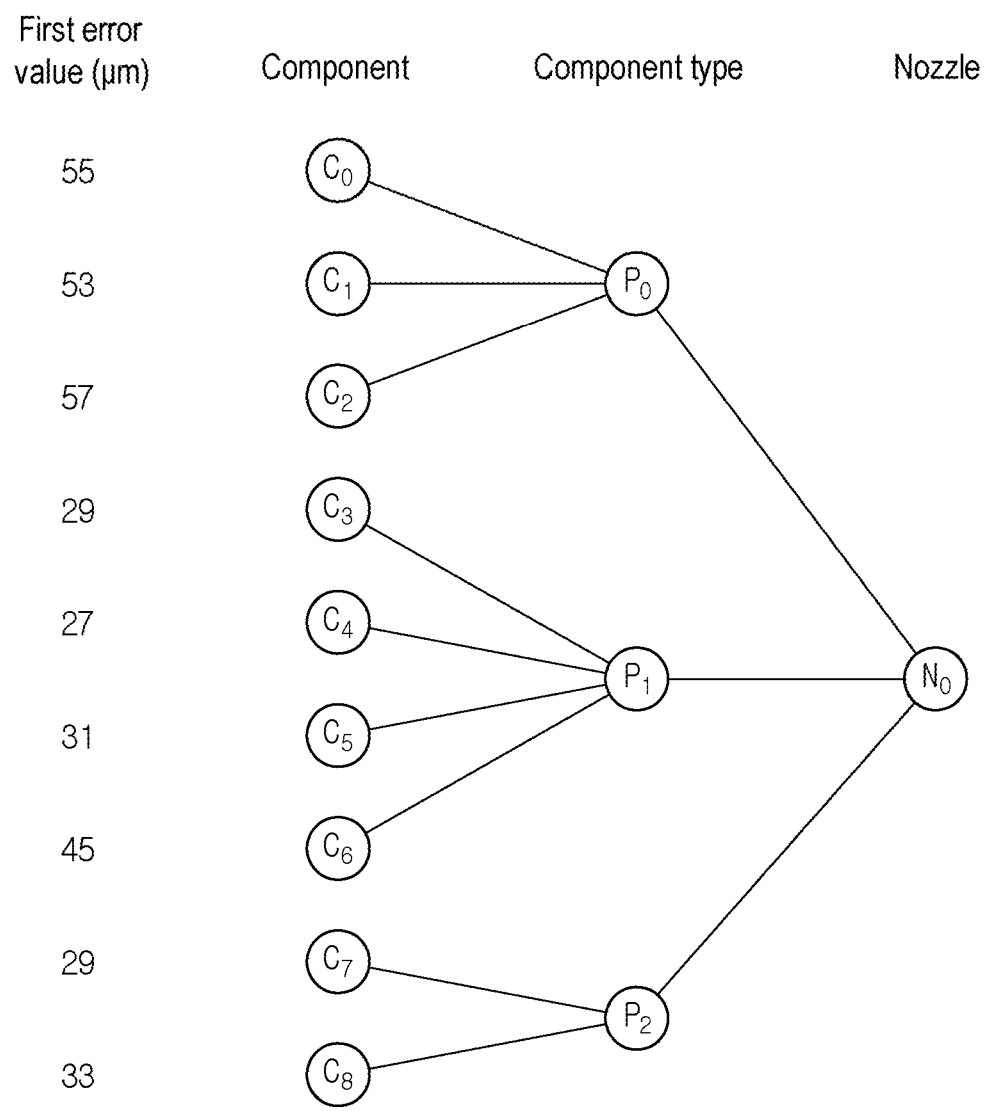
Figure 20B:
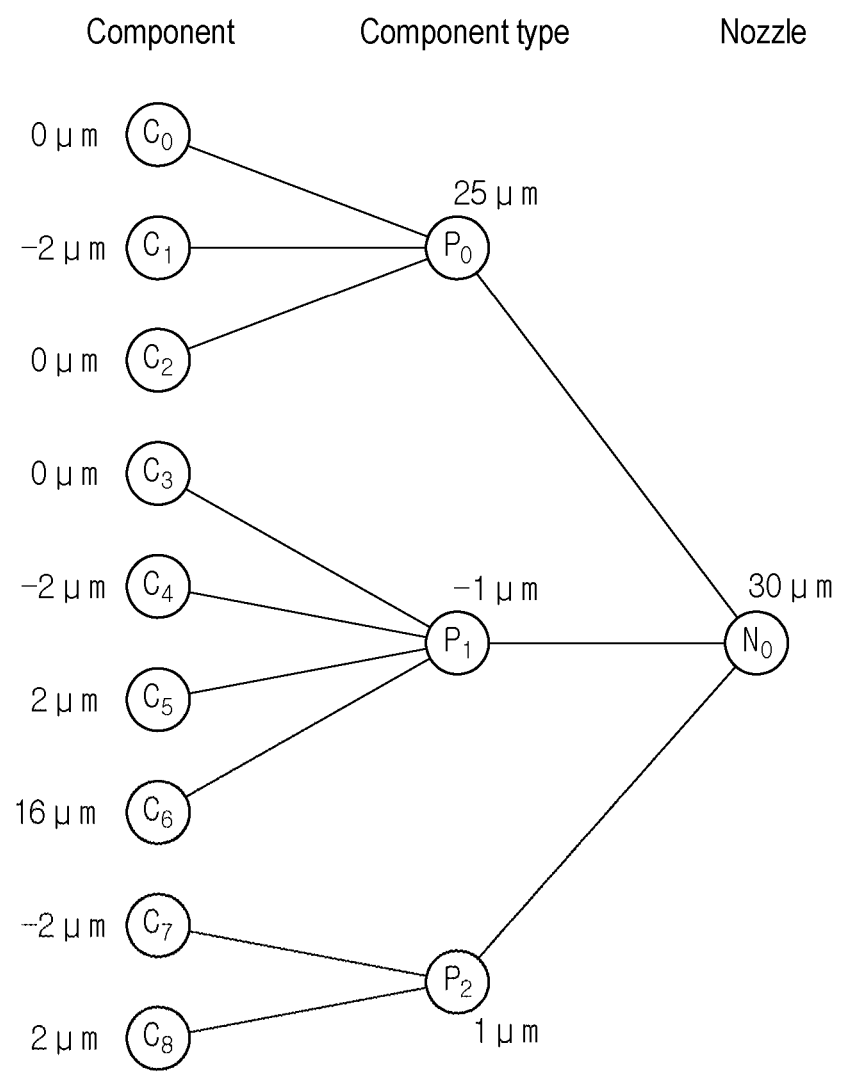

FIGS. 20A to 20C are graphs indicating error values according to various embodiments of the present disclosure.

According to various embodiments of the present disclosure, the processor 320 of the electronic apparatus 110 may receive a first error value of each of a plurality of first components mounted on a plurality of substrates of the first type. The processor 320 may generate a graph having a tree structure as illustrated in FIG. 20A by using the calculated first error value of the plurality of first components, and may display the generated graph on the display 340. The graph shown in FIG. 20A may be displayed before the cause of the mounting failure for each of the plurality of second components in which a mounting failure has occurred is determined, and the first error value of each of the plurality of first components calculated by the processor 320 may be indicated in the graph. In an embodiment, the graph may indicate the relationship between the plurality of components included in the mounter 140, the components mounted on the substrate, and the types of components. For example, as shown in FIG. 19A, the graph may indicate the relationship between the plurality of first components, the plurality of first component types and the plurality of first nozzles as the components of the mounter 140. Description has been made mainly on the case where the graph has a tree structure. However, this is merely for the purpose of explanation. The present disclosure is not limited thereto. Various types of graphs may be used to indicate the relationship between the plurality of components included in the mounter, the components mounted on the substrate and the types of components.

The processor 320 may divide the calculated first error value of each of the plurality of first components into a second error value due to a component mounting position setting error, a third error value due to a mounting condition setting error according to a component type, and a fourth error value due to a nozzle defect. The processor 320 may determine a cause of a mounting failure using the division result, and then may display the second error value, the third error value and the fourth error value through a graph as shown in FIG. 20B.

In addition, as shown in FIG. 20C, the processor 320 may adjust the size of nodes included in the graph having a tree structure according to the second error value, the third error value and the fourth error value, and may display the nodes so that the user may more clearly recognize the cause of the mounting failure. For example, the processor 320 may obtain absolute values of the second error value, the third error value and the fourth error value, and may adjust the size of each node such that the absolute value becomes a radius. Accordingly, the user may more clearly recognize the cause of the mounting failure. In the above description, the size of the node is differently indicated according to the absolute value of the error value. However, this is merely for the purpose of description. The present disclosure is not limited thereto. It may be possible to use various methods such as changing the color and shape of a node, so that the user may more clearly recognize a cause of a mounting failure.

Figure 21:
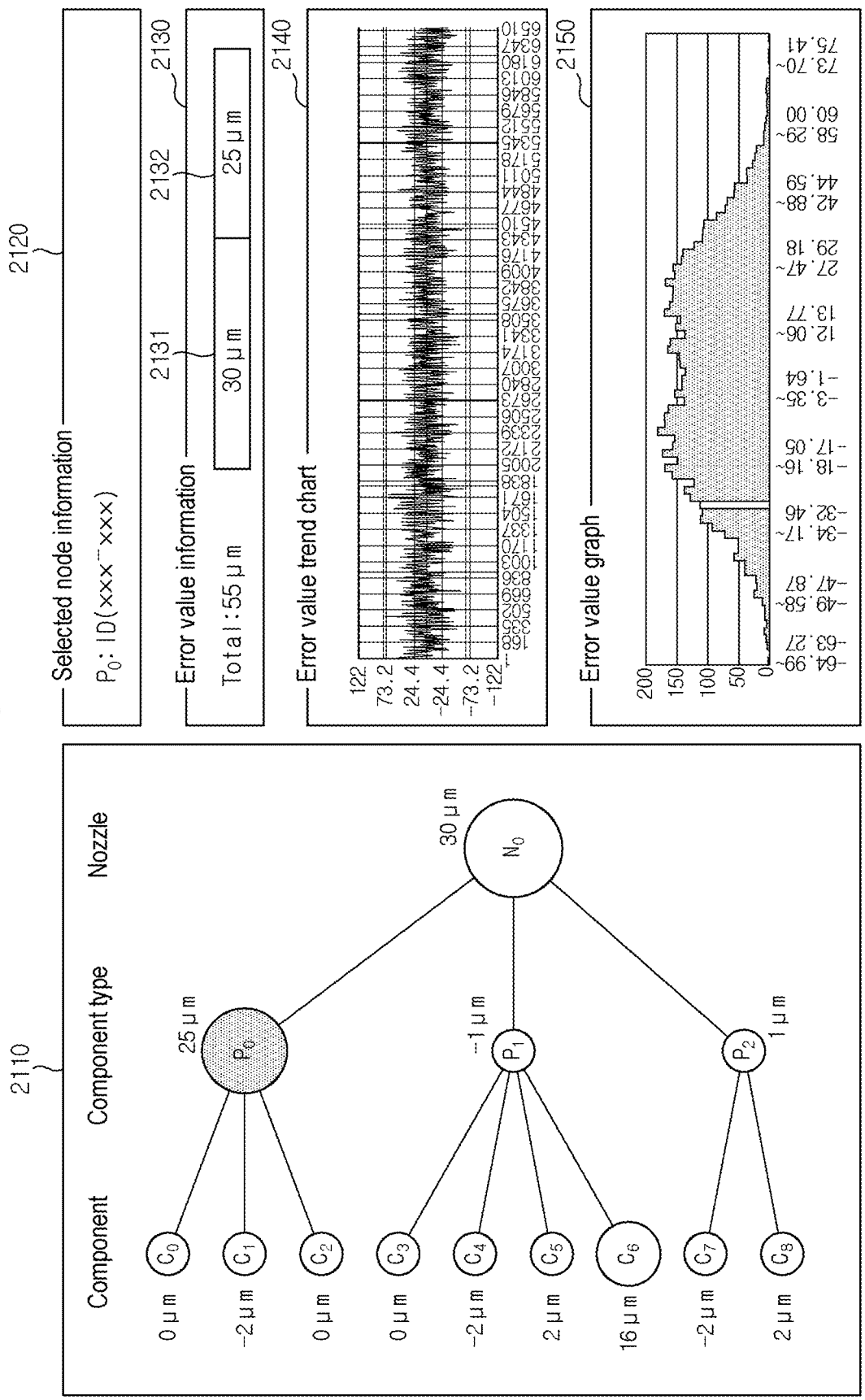
FIG. 21 illustrates a screen displaying the content of error value analysis according to various embodiments of the present disclosure.

FIG. 21 illustrates a screen displaying the content of error value analysis according to various embodiments of the present disclosure.

According to various embodiments of the present disclosure, the processor 320 of the electronic apparatus 110 may display, on the display 340, a screen of the content of error value analysis including a graph 2110 of a tree structure indicating the error values described with reference to FIGS. 20A through 20C, node information 2120 selected by the user in the graph 2110, error value information 2130 corresponding to the selected node, an error value trend chart 2140 corresponding to the selected node and an error value graph 2150 corresponding to the selected node.

In an embodiment, when the user selects a P0 node corresponding to the P0 component type included in the graph 2110, the processor 320 may display information about the P0 node (e.g., identification information for identifying the P0 component type) as the selected node information 2120. In FIG. 21, only the identification information for identifying the P0 component type is displayed as the selected node information 2120. However, the present disclosure is not limited thereto. Various information related to the P0 component type may be displayed as the selected node information 2120.

In addition, the processor 320 may display the error value information 2130 corresponding to the P0 node. In the error value information 2130, an error value 2131 of the N0 node, which is an upper node of the P0 node, and an error value 2130 of the P0 node may be divisionally displayed. However, this is merely for the purpose of description. The present disclosure is not limited thereto. Error values of the C0 node, the C1 node and the C2 node, which are lower nodes of the P0 node, may be further displayed in the error value information 2130.

As described above, the first error value of each of the plurality of first components may be generated by using the plurality of measurement values of the plurality of first components measured in the process of inspecting the plurality of substrates of the first type. The first error value of each of the plurality of first components may be generated based on one of an average value, a median value, a mode value, a minimum value, a maximum value and a standard deviation of the differences between a plurality of measurement values for the plurality of first components and the reference value. A second error value, a third error value and a fourth error value may be generated by dividing the first error value.

The processor 320 may generate and display an error value trend chart 2140 of the P0 node as the selected node based on the calculated plurality of second error values, the calculated plurality of third error values and the calculated plurality of fourth error values. In addition, the processor 320 may generate and display the error value graph 2150 using an average value, a median value, a mode value, a minimum value, a maximum value and a standard deviation of the error value of the P0 node as the selected node. This enables the user to easily grasp the error value characteristic of the P0 node as the selected node.

Figure 22:
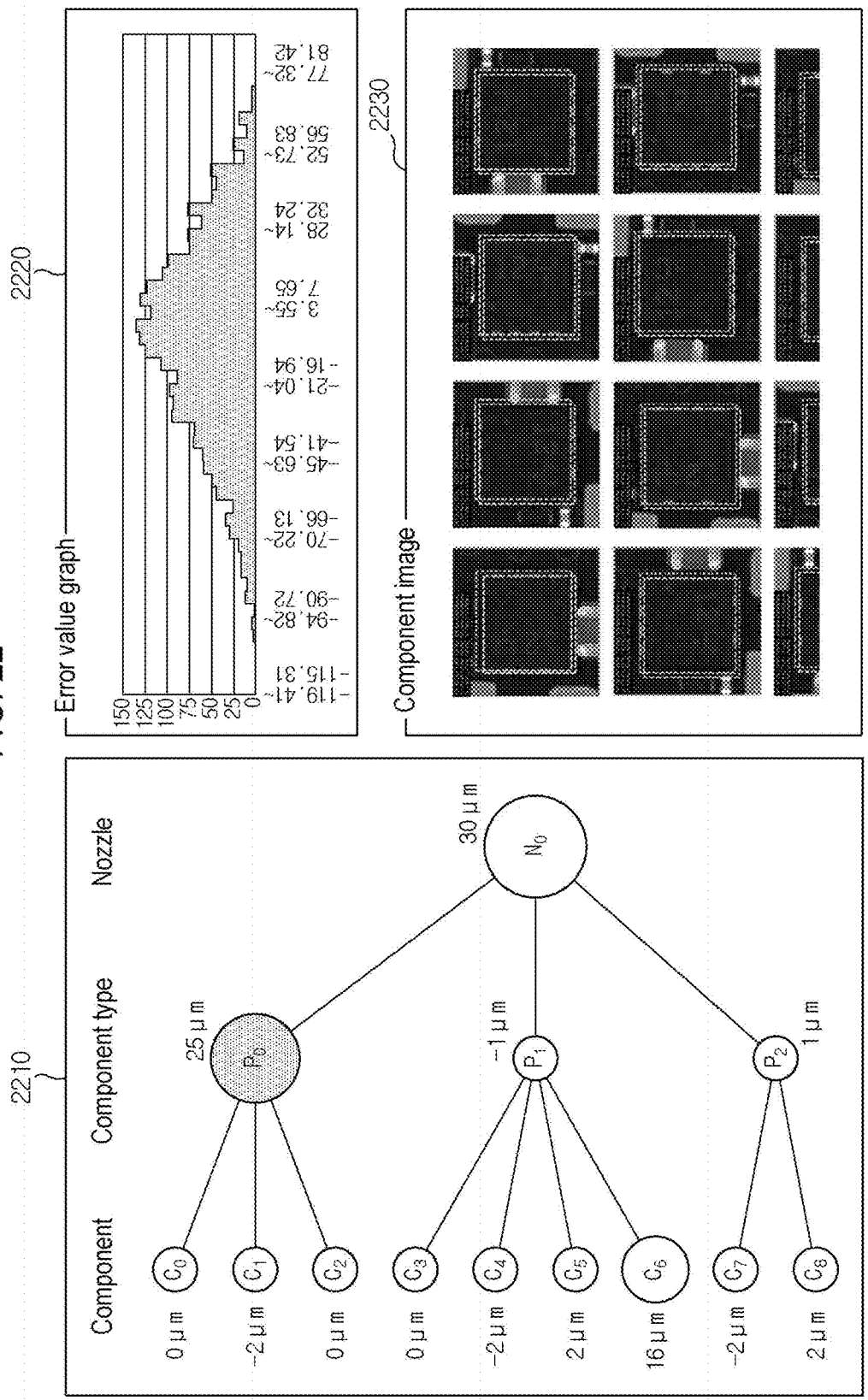
FIG. 22 illustrates a screen displaying the content of error value analysis according to various embodiments of the present disclosure.

FIG. 22 illustrates a screen displaying the content of error value analysis according to various embodiments of the present disclosure.

According to various embodiments of the present disclosure, the processor 320 of the electronic apparatus 110 may display, on the display 340, a screen of the content of error value analysis including a graph 2210 of a tree structure indicating the error values described with reference to FIGS. 20A through 20C, an error value graph 2220 corresponding to the node selected by the user and a component image 2230 related to the node selected by the user.

In an embodiment, when the user selects the N0 node corresponding to the N0 nozzle included in the graph 2210, as described with reference to FIG. 21, the processor 320 may generate and display an error value graph 2220 using an average value, a median value, a mode value, a minimum value, a maximum value and a standard deviation of the error value of the N0 node as the selected node. This enables the user to easily grasp the error value characteristic of the N0 node as the selected node.

In addition, the processor 320 may display a component image 2230 related to the N0 node. For example, the component image related to the N0 node may indicate images of all the components mounted by the N0 nozzle. In this case, the image of the component in which a mounting failure has occurred among all the components mounted by the N0 nozzle may be displayed with a different color, size or the like so as to be distinguished from the image of the component in which a mounting failure has not occurred. As another example, the image of the component related to the N0 node may include only the image of the component in which a mounting failure has occurred among all the components mounted by the N0 nozzle. This enables the user to easily grasp the image of the component in which a mounting failure has occurred among the components mounted by the N0 nozzle.

Figure 23:
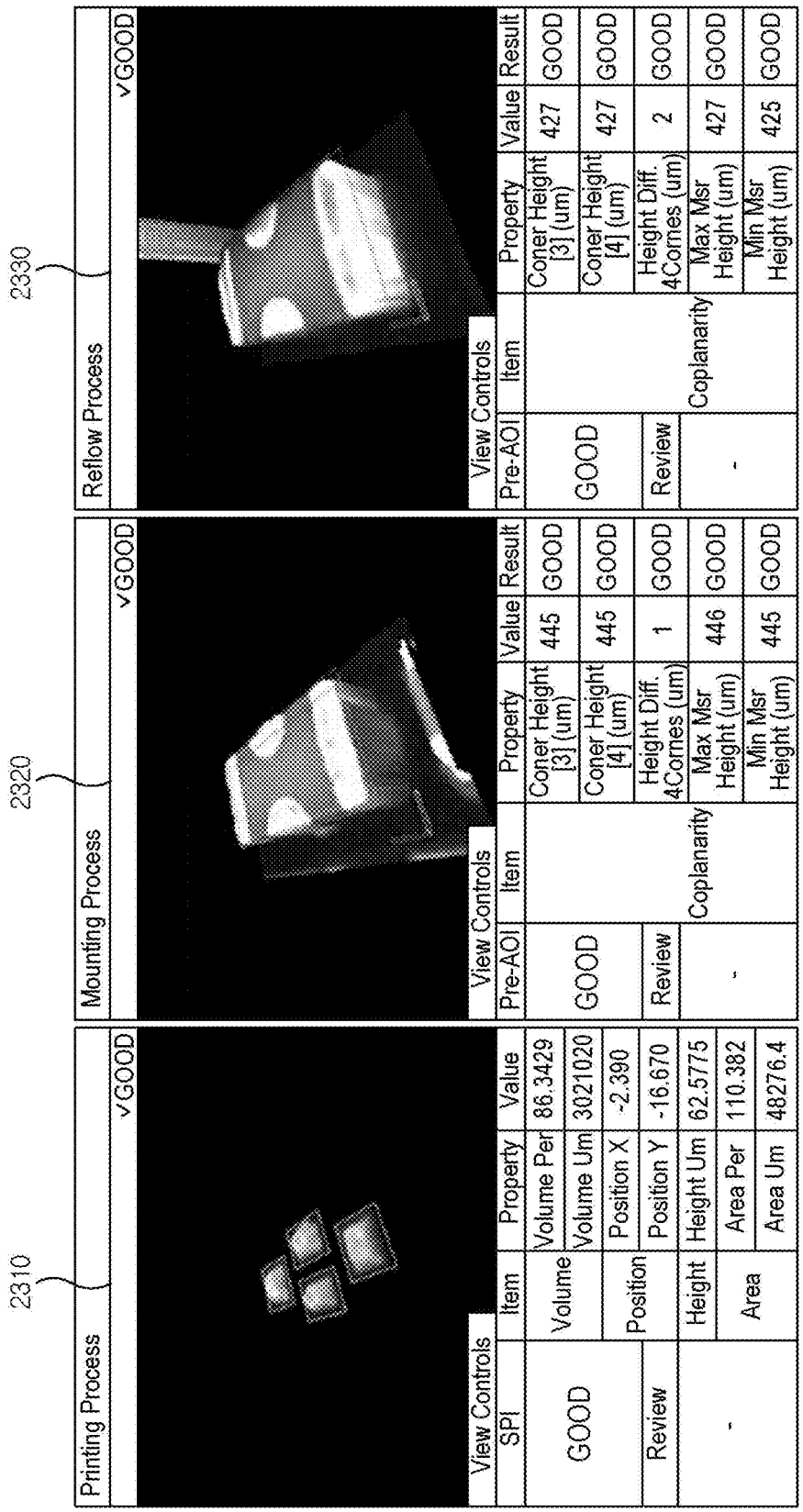
FIG. 23 illustrates a screen displaying a solder paste image, a component image after a mounting process and a component image after a reflow process according to various embodiments of the present disclosure.

FIG. 23 illustrates a screen displaying a solder paste image, a component image after a mounting process and a component image after a reflow process according to various embodiments of the present disclosure.

According to various embodiments of the present disclosure, the processor 320 of the electronic apparatus 110 may display, on the display 340, an image of a solder paste printed on a substrate, a component image after a mounting process and a component image after a reflow process, by using the inspection result received from the SPI apparatus 130, the first substrate inspection apparatus 150 and the second substrate inspection apparatus 170. In addition, the processor 320 may also display, on the display 340, the inspection results received from the SPI apparatus 130, the first substrate inspection apparatus 150 and the second substrate inspection apparatus 170. This enables the user to easily grasp the process in which the mounting failure has occurred.

Figure 24:
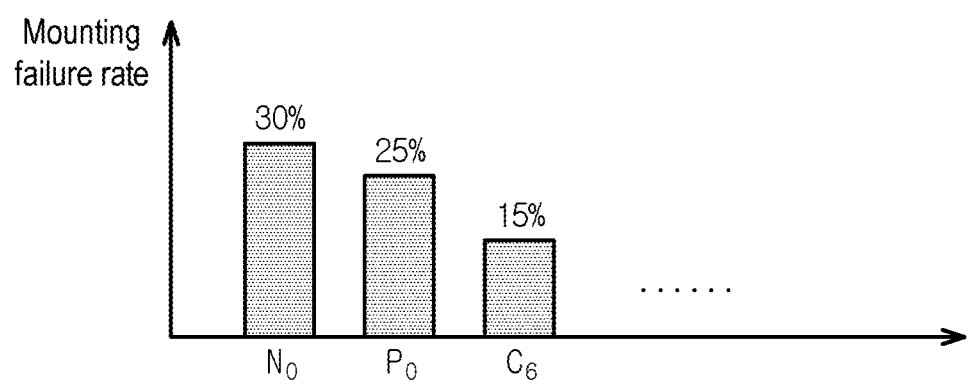
FIG. 24 is a graph representing mounting failure rates according to various embodiments of the present disclosure.

FIG. 24 is a graph representing mounting failure rates according to various embodiments of the present disclosure.

According to various embodiments of the present disclosure, the processor 320 of the electronic apparatus 110 may determine a cause of a mounting failure for each of a plurality of second components in which a mounting failure has occurred, and then may adjust the mounting failure rate of each of the plurality of first components, the mounting failure rate of each of the plurality of first component types and the mounting failure rate of each of the plurality of first nozzles. Based on the adjusted mounting failure rate, the processor 320 may generate a graph in which the mounting failure rates are arranged according to the size thereof, and may display the graph as shown in FIG. 24. This enables the user to easily check which part has contributed most to the mounting failure.

Figure 25:
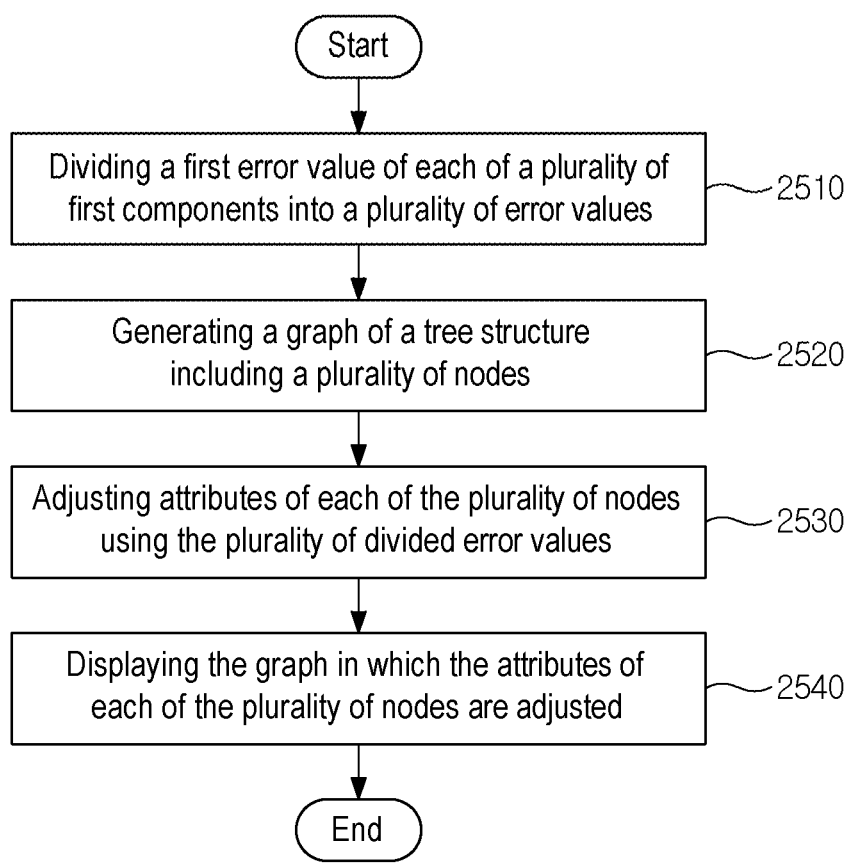
FIG. 25 is a flowchart showing a method for displaying an inspection result in an electronic apparatus according to various embodiments of the present disclosure.

FIG. 25 is a flowchart showing a method for displaying an inspection result in an electronic apparatus according to various embodiments of the present disclosure.

In step 2510, the processor 320 of the electronic apparatus 110 may divide the error value of each of the first components with respect to the mounting position obtained by inspecting the plurality of substrates of the first type on which the plurality of first components are mounted by the mounter, into a plurality of error values. For example, the plurality of error values may include a second error value due to a component mounting position setting error and a third error value due to a condition setting error according to a component type. The plurality of error values may further include at least one of a fourth error value due to a defect of a component included in the mounter, a fifth error value due to a defect of a feeder, a sixth error value due to a defect of a spindle, a seventh error value due to a defect of a reel and an eighth error value due to a defect of a head. Since the method of dividing the first error value into a plurality of error values is the same as described above, a separate description thereof will be omitted.

In step 2520, the processor 320 may generate a graph of a tree structure including a plurality of first components, component types of each of the first components and a plurality of nodes corresponding to the respective elements included in the mounter 140. As shown in FIG. 20A, the graph of the tree structure generated by the processor 320 may represent the relationship between the plurality of first components, the component types of the first components and the plurality of nozzles as the elements of the mounter 140. Hereinafter, for the sake of convenience of explanation, the nozzle will be mainly described as the component of the mounter 140. However, the present disclosure is not limited thereto. At least one of a head, a spindle, a feeder and a reel may be used as the component of the mounter 140. In this case, the hierarchical structure of the graph of the tree structure may be further extended according to the relationship between the components of the mounter 140.

For example, the graph of the tree structure may include a plurality of first nodes C0 to C8 corresponding to the respective first components, a plurality of second nodes P0 to P2 corresponding to the respective component types of the first component and a plurality of third nodes N0 corresponding to a plurality of nozzles included in the mounter 140. Although FIG. 20A shows that the third node N0 is one, the present disclosure is not limited thereto. When there is a plurality of nozzles included in the mounter 140, the third nodes corresponding to the nozzles may also be plural. Furthermore, in order to represent the relationship between the first components, the component types of the first components and the nozzles as the elements of the mounter 140, as shown in FIG. 20A, the plurality of first nodes may be set as a lower layer than the plurality of second nodes which may be set as a lower layer than the plurality of third nodes.

In step 2530, the processor 320 may adjust the attributes of the plurality of nodes by using the plurality of error values divided from the first error values of the plurality of first components. For example, the attributes of the plurality of nodes may include at least one of the shape, size and color of the plurality of nodes. However, this is merely for the purpose of explanation. The present disclosure is not limited thereto. Various elements for distinguishing the nodes may be used as the attributes of the nodes. A specific method of adjusting the attributes of the plurality of nodes will be described later.

In step 2540, the processor 320 may display, on the display 340, a graph in which the attributes of the plurality of nodes are adjusted. For example, as shown in FIG. 20C, the size of each of the plurality of nodes may be adjusted, and a graph in which the size of each of the plurality of nodes is adjusted may be displayed on the display 340.

Figure 26:
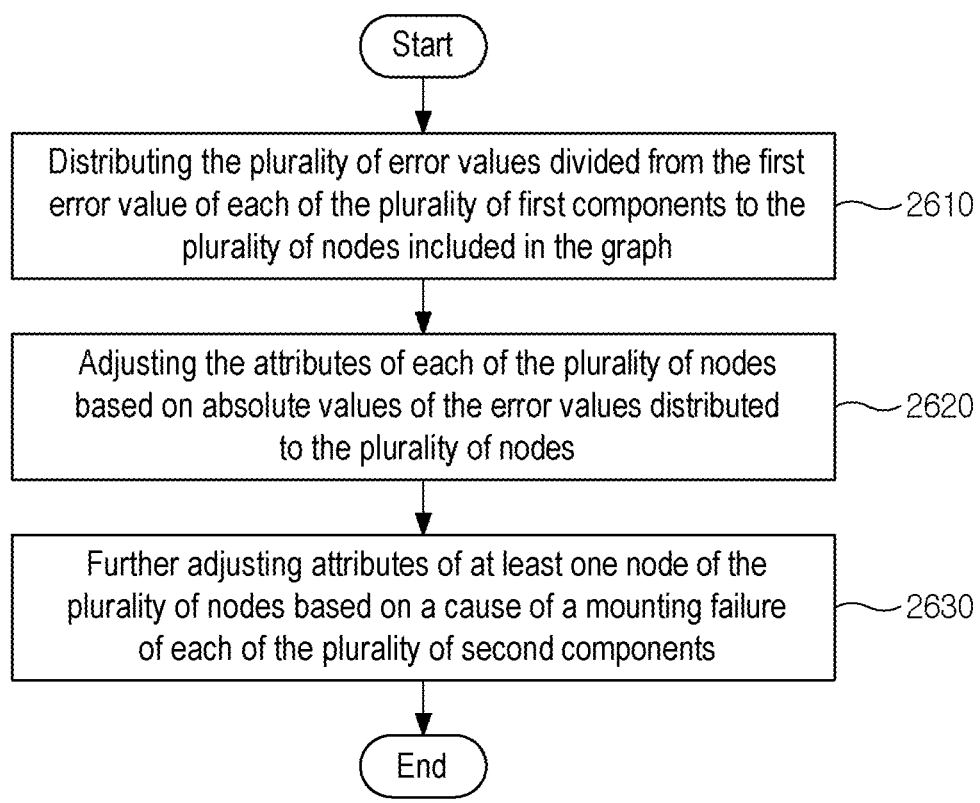
FIG. 26 is a flowchart of a method for adjusting attributes of a plurality of nodes included in a graph according to various embodiments of the present disclosure.

FIG. 26 is a flowchart of a method for adjusting attributes of a plurality of nodes included in a graph according to various embodiments of the present disclosure.

In step 2610, the processor 320 of the electronic apparatus 100 may distribute the plurality of error values divided from the first error value of each of the plurality of first components to the nodes included in the graph. For example, as shown in FIG. 20B, the processor 320 may divide 55 μm, which is the first error value for the C0 component, into 0 μm, 25 μm and 30 μm, which may be distributed to the node corresponding to the C0 component, the node corresponding to the P0 component type and the node corresponding to the N0 nozzle, respectively. In the same manner, the first error value of each of the C1 to C8 components may be divided into a plurality of error values, which may then be distributed to the respective nodes.

In step 2620, the processor 320 may adjust the attributes of each of the plurality of nodes based on the absolute values of the error values distributed to the plurality of nodes included in the graph. For example, as shown in FIG. 20C, the size of the node, which is one of the attributes of each of the plurality of nodes, may be adjusted based on the absolute values of the error values distributed to the plurality of nodes. However, this is merely for the purpose of explanation. The present disclosure is not limited thereto. The processor 320 may adjust the color or shape, which is one of the attributes of each of the plurality of nodes, based on the absolute values of the error values.

In step 2630, the processor 320 may determine a cause of a mounting failure of each of the plurality of second components in which a mounting failure has occurred among the plurality of first components, and then may further adjust the attributes of at least one of the nodes based on the cause of the mounting failure of each of the plurality of second components. For example, the processor 320 may determine a cause of a mounting failure of the C0 component as a component-type-dependent mounting condition setting error and a defect of an element (e.g., a head, a spindle, a nozzle, a feeder, a reel, or the like). When the cause of the mounting failure of the C0 component is determined as the component-type-dependent mounting condition setting error and the element defect, the processor 320 may further adjust the color which is one of the attributes of the node corresponding to the P0 component type and the node corresponding to the N0 nozzle.

Figure 27:
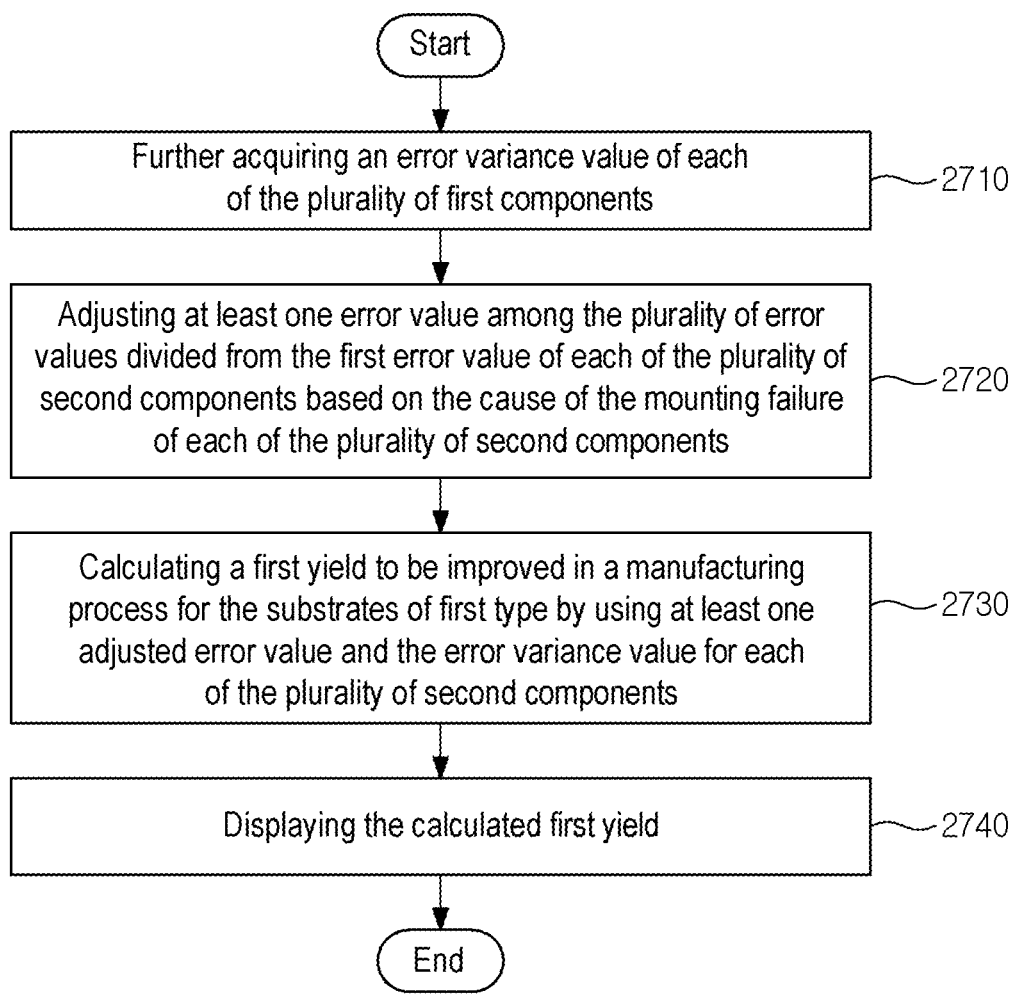
FIG. 27 is a flowchart of a method for calculating a yield to be improved in a manufacturing process for substrate of first type according to various embodiments of the present disclosure.

FIG. 27 is a flowchart of a method for calculating a yield to be improved in a manufacturing process of a substrate of the first type according to various embodiments of the present disclosure.

In step 2710, the processor 320 of the electronic apparatus 110 may further acquire an error variance value of each of the plurality of first components indicating the variance of the differences between the plurality of measurement values for the plurality of first components and a predetermined reference value. For example, the error variance value of each of the plurality of first components may be calculated by the first substrate inspection device 150 based on the differences between the measurement values for the mounting positions of the plurality of first components mounted on the plurality of substrates of the first type and the reference values set for the mounting positions. The processor 320 may further acquire an error variance value of each of the plurality of first components from the first substrate inspection device 150. In addition, the processor 320 may directly generate an error variance value of each of the plurality of first components.

In step 2720, the processor 320 may adjust at least one error value among the plurality of error values divided from the first error value of each of the plurality of second components based on the cause of the mounting failure of each of the plurality of second components in which a mounting failure has occurred. In order to calculate a first yield to be improved in the manufacturing process for the substrate of the first type through the improvement of the cause of the mounting failure, the processor 320 may adjust at least one error value among the plurality of error values divided from the second error value of each of the plurality of second components, based on the cause of the mounting failure of each of the plurality of second components.

For example, referring to FIG. 20B, the processor 320 may divide 55 μm, which is the first error value for the C0 component, into 0 μm, 25 μm and 30 μm, and may determine the cause of the mounting failure of the C0 component as a component-type-dependent mounting condition setting error and an element defect. The processor 320 may adjust 25 μm, which is an error value distributed to the node corresponding to the P0 component type, and 30 μm, which is an error value distributed to the node corresponding to the N0 nozzle, according to the cause of the mounting failure of the C0 component. For example, the processor 320 may adjust 25 μm, which is an error value distributed to the node corresponding to the P0 component type, to 0 μm, and may adjust 30 μm, which is an error value distributed to the node corresponding to the N0 nozzle, to 0 μm.

In step 2730, the processor 320 may calculate a first yield to be improved in the manufacturing process for the substrate of the first type through the improvement of the cause of the mounting failure of each of the plurality of second components, by using at least one adjusted error value and the error variance values for the plurality of second components identified through the error variance values of the plurality of first components. For example, the processor 320 may divide the error variance value for each of the plurality of second components into a plurality of error variance values in the same manner as the process of dividing the first error value. The processor 320 may calculate a mounting failure probability for each of the plurality of second components by using the at least one adjusted error value and the plurality of divided error variance values.

Figure 28A:
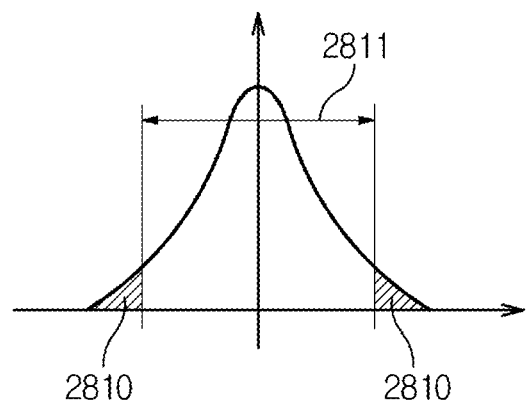
FIGS. 28A, 28B and 28C are graphs showing a distribution of divided error values according to various embodiments of the present disclosure.
Figure 28B:
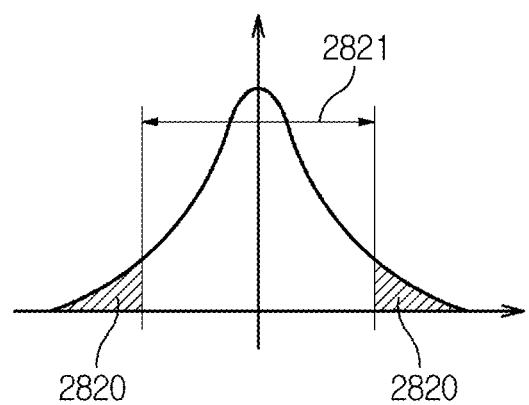
Figure 28C:
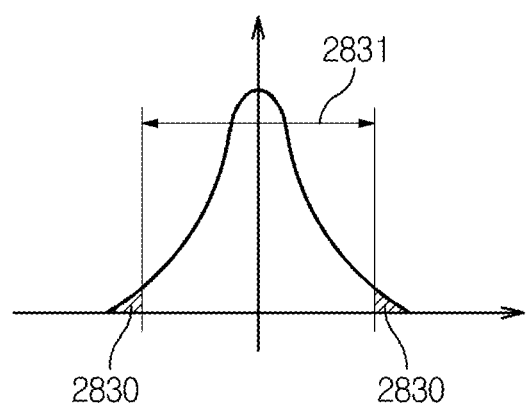

As shown in FIGS. 28A to 28C, the processor 320 may acquire a distribution of at least one adjusted error value among the plurality of divided error values and at least one unadjusted error value among the plurality of divided error values by using the plurality of divided error variance values. For example, FIG. 28A illustrates a distribution of the error values distributed to the node corresponding to the unadjusted C0 component, FIG. 28B illustrates a distribution of the error values distributed to the node corresponding to the adjusted P0 component type, and FIG. 28C illustrates a distribution of the error values distributed to the node corresponding to the adjusted N0 nozzle. The processor 320 may calculate, in each distribution, an area 2810, 2820 or 2830 deviating from the first range 2811, 2821 or 2831 used as a criterion for determining whether a mounting failure has occurred, and may calculate a mounting failure occurrence probability for the C0 component based on the calculated area 2810, 2820 or 2830. The processor 320 may calculate a mounting failure occurrence probability for each of the C1 to C8 components in the same manner as described above.

The processor 320 may calculate a first yield to be improved in the manufacturing process for the substrate of the first type through the improvement of the cause of the mounting failure of each of the plurality of second components, by using the mounting failure occurrence probability for each of the C0 to C8 components. The first yield may be calculated as in Equation (1):

$$1-p(PCB\ NG)=(1-p(comp0\ NG))(1-p(comp1\ NG))(1-p(comp2\ NG)) \quad (1),$$

where $1-p(PCB\ NG)$ denotes the first yield, $p(comp0\ NG)$ denotes the mounting failure occurrence probability of the C0 component, $p(comp1\ NG)$ denotes the mounting failure occurrence probability of the C1 component, and $p(comp2\ NG)$ denotes the mounting failure occurrence probability of the C2 component.

The processor 320 may calculate a second yield for a plurality of already-manufactured substrates of the first type based on the number of at least one substrate of the first type including a plurality of second components in which a mounting failure has occurred among the plurality of substrates of the first type. The second yield may be a yield calculated under the assumption that the at least one substrate of the first type including the plurality of second components is defective.

In addition, the processor 320 may calculate a third yield for the plurality of substrates of the first type based on the number of at least one substrate of a second type in which a mounting failure has actually occurred among the plurality of substrates of the first type. The third yield may be a yield calculated according to whether an actual failure occurs.

However, the at least one substrate of the first type including a plurality of second components determined to have a mounting failure may actually be determined not to have a mounting failure. Just like the second yield, the first yield is calculated under the assumption that the substrate of the first type including the component determined to have a mounting failure is defective. Therefore, the first yield may be adjusted for more accurate yield prediction. The processor 320 may adjust the first yield based on the second yield and the third yield. For example, if it is assumed that the predicted first yield is 95%, the predicted second yield is 80%, and the predicted third yield is 90%, the failure probability according to the first yield may be 5%, the failure probability according to the second yield may be 20%, and the failure probability according to the third yield may be 10%. In this case, the processor 320 may determine that the failure probability is improved by 15% due to the elimination of the mounting failure cause, based on the first yield and the second yield by which the substrate of the first type including the component determined to have a mounting failure is assumed to be defective. That is, the processor 320 may determine that the failure probability is improved by 75% due to the elimination of the mounting failure cause. According to the determination result, the processor 320 may determine that the third yield, which is a yield calculated according to the actual defect occurrence, is also improved by 75% due to the elimination of the mounting failure cause, the failure probability is improved to 2.5%, and the yield is 97.5%. The processor 320 may adjust the first yield of 95% to the third yield of 97.5%, which is improved due to the elimination of the mounting failure cause. This makes it possible to more accurately reflect the actual yield increasing effect.

In step 2740, the processor 320 may display the calculated first yield on the display. When the first yield is adjusted, the processor 320 may display the adjusted first yield on the display 340. This enables the user to easily recognize the yield to be improved due to the elimination of the mounting failure cause.

Figure 29:
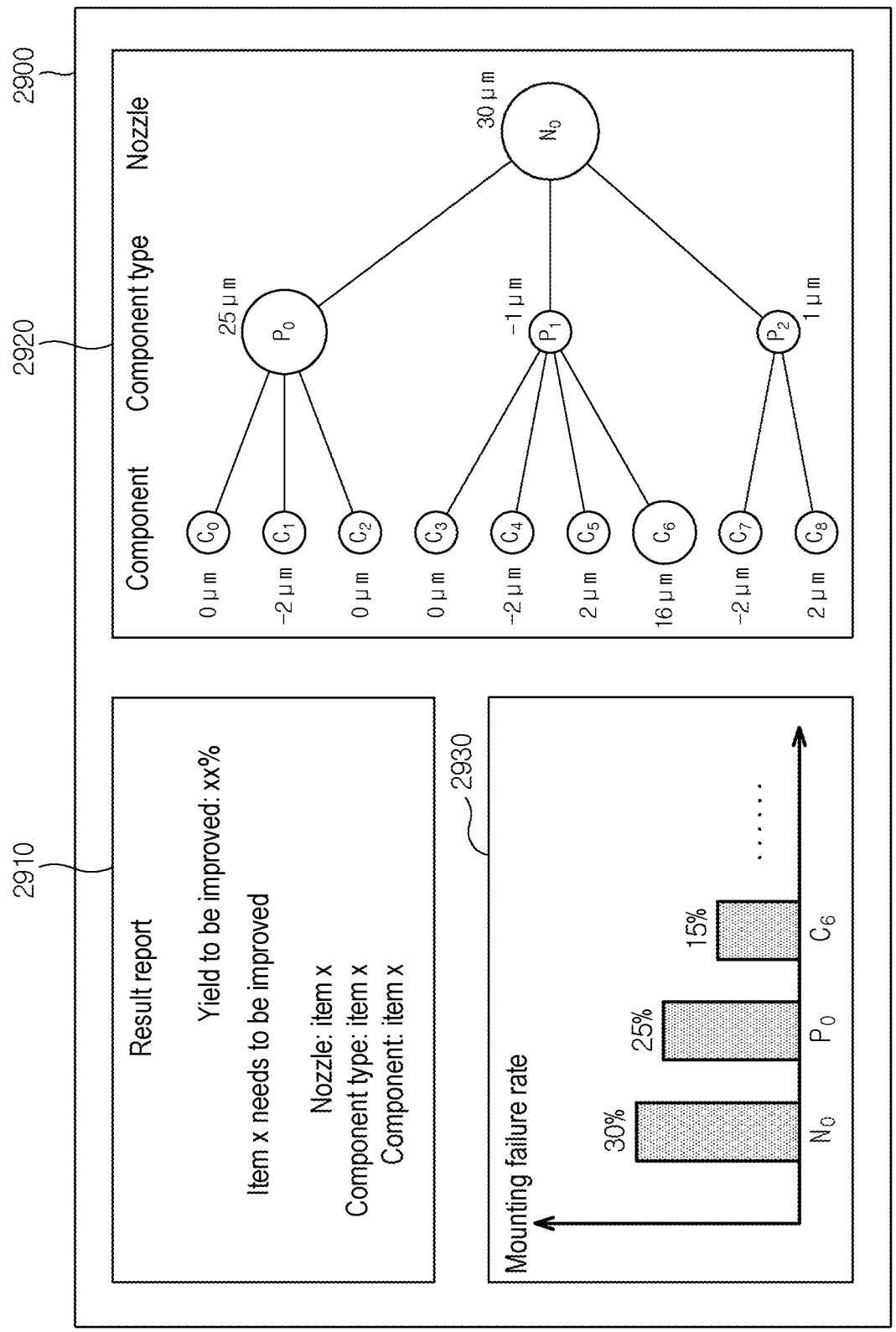
FIG. 29 is a view showing an inspection result screen displayed on an electronic apparatus according to various embodiments of the present disclosure.

FIG. 29 is a view showing an inspection result screen displayed on the electronic apparatus according to various embodiments of the present disclosure.

The processor 320 of the electronic apparatus 110 may perform an inspection of each of the plurality of substrates of the first type on which the plurality of first components are mounted by the mounter, and then may display a screen 2900 indicating an inspection result. The screen 2900 may include at least an inspection result report 2910, a graph 2920 of a tree structure, and a graph 2930 indicating a mounting failure rate. However, this is merely for the purpose of explanation. The present disclosure is not limited thereto. Various inspection result contents based on various data acquired in the inspection process for the substrates of the first type may be included in the screen 2900. The user may check the inspection result through the screen 2900 displayed on the display 340, and may easily confirm the mounting failure cause and the yield to be improved through the improvement of the mounting failure cause.

While the foregoing methods have been described with respect to particular embodiments, these methods may also be implemented as computer-readable codes on a computer-readable recording medium. The computer-readable recording medium includes any kind of data storage devices that can be read by a computer system. Examples of the computer-readable recording medium includes ROM, RAM, CD-ROM, magnetic tape, floppy disk, optical data storage device and the like. Also, the computer-readable recoding medium can be distributed on computer systems which are connected through a network so that the computer-readable codes can be stored and executed in a distributed manner. Further, the functional programs, codes and code segments for implementing the foregoing embodiments can easily be inferred by programmers in the art to which the present disclosure pertains.

Although the technical spirit of the present disclosure has been described by the examples described in some embodiments and illustrated in the accompanying drawings, it should be noted that various substitutions, modifications, and changes can be made without departing from the scope of the present disclosure which can be understood by those skilled in the art to which the present disclosure pertains. In addition, it should be noted that such substitutions, modifications and changes are intended to fall within the scope of the appended claims.

What is claimed is:
1. An electronic apparatus, comprising:
a display; and
one or more processor,
wherein the one or more processor is configured to:
divide a first error value of each of a plurality of first components with respect to a mounting position acquired through inspection of a plurality of substrates of a first type on which the plurality of first components are mounted by a mounter, into a plurality of error values;
generate a graph of a tree structure including a plurality of nodes corresponding to the plurality of first components, component types of each of the plurality of first components and a plurality of mounter component nodes included in the mounter;

adjust attributes of each of the plurality of nodes using the plurality of error values divided from the first error value of each of the plurality of first components; and display the graph, in which the attributes of each of the plurality of nodes are adjusted, on the display.

2. The apparatus of claim 1, wherein the plurality of mounter component nodes include at least one of a head, a spindle, a nozzle, a feeder and a reel.

3. The apparatus of claim 1, wherein the plurality of nodes includes a plurality of first nodes corresponding to the plurality of first components, a plurality of second nodes corresponding to the component types of each of the plurality of first components and a plurality of third nodes corresponding to the plurality of mounter component nodes included in the mounter, the plurality of first nodes is set as a lower layer than the plurality of second nodes, and the plurality of second nodes is set as a lower layer than the plurality of third nodes.

4. The apparatus of claim 1, wherein the attributes of each of the plurality of nodes include at least one of a shape, a size and a color of the plurality of nodes.

5. The apparatus of claim 4, wherein the one or more processor is configured to:

distribute the plurality of error values divided from the first error value of each of the plurality of first components to the plurality of nodes; and adjust the attributes of each of the plurality of nodes based on absolute values of the error values distributed to the plurality of nodes.

6. The apparatus of claim 1, wherein the one or more processor is configured to:

determine a plurality of second components in which a mounting failure has occurred among the plurality of first components by using the plurality of error values divided from the first error value of each of the plurality of first components; and determine a cause of a mounting failure of each of the plurality of second components as at least one of a component mounting position setting error, a mounting condition setting error according to a component type and a defect of the mounter component nodes included in the mounter by using the plurality of error values divided from the first error value of each of the plurality of second components.

7. The apparatus of claim 6, wherein the one or more processor is configured to:

further adjust attributes of at least one node among the plurality of nodes based on the cause of the mounting failure of each of the plurality of second components.

8. The apparatus of claim 6, wherein the first error value of each of the plurality of first components is an average value of differences between a plurality of measurement values of mounting positions of the plurality of first components measured in inspecting each of the plurality of substrates of the first type, and predetermined reference values, and the one or more processor is configured to:

further acquire an error variance value of each of the plurality of first components indicating a variance with respect to the differences between the plurality of measurement values of the mounting positions of the plurality of first components and the predetermined reference values.

9. The apparatus of claim 8, wherein the one or more processor is configured to:

adjust at least one error value among the plurality of error values divided from the first error value of each of the plurality of second components based on the determined cause of the mounting failure of each of the plurality of second components;

calculate a first yield to be improved in a manufacturing process for the substrate of the first type through improvement of the determined cause of the mounting failure of each of the plurality of second components, by using at least one adjusted error value and the error variance value for each of the plurality of second components identified through the error variance value of each of the plurality of first components; and display the calculated first yield on the display.

10. The apparatus of claim 9, wherein the one or more processor is configured to:

calculate a second yield of the plurality of substrates of the first type based on the number of at least one substrate of the first type including the plurality of second components among the plurality of substrates of the first type;

calculate a third yield for the plurality of substrates of the first type based on the number of at least one substrate of the first type in which a failure has actually occurred among the plurality of substrates of the first type; and adjust the calculated first yield based on the second yield and the third yield, and display the adjusted first yield on the display.

11. A method of displaying an inspection result in an electronic apparatus, comprising:

dividing, by one or more processor of the electronic apparatus, a first error value of each of a plurality of first components with respect to a mounting position acquired through inspection of a plurality of substrates of a first type on which the plurality of first components are mounted by a mounter, into a plurality of error values;

generating a graph of a tree structure including a plurality of nodes corresponding to the plurality of first components, component types of each of the plurality of first components and a plurality of mounter component nodes included in the mounter;

adjusting attributes of each of the plurality of nodes using the plurality of error values divided from the first error value of each of the plurality of first components; and displaying, by a display of the electronic apparatus, the graph in which the attributes of each of the plurality of nodes are adjusted.

12. The method of claim 11, wherein the elements include at least one of a head, a spindle, a nozzle, a feeder and a reel.

13. The method of claim 11, wherein the plurality of nodes includes a plurality of first nodes corresponding to the plurality of first components, a plurality of second nodes corresponding to the component types of each of the plurality of first components and a plurality of third nodes corresponding to the mounter component nodes included in the mounter, the plurality of first nodes is set as a lower layer than the plurality of second nodes, and the plurality of second nodes is set as a lower layer than the plurality of third nodes.

14. The method of claim 11, wherein the attributes of each of the plurality of nodes include at least one of a shape, a size and a color of the plurality of nodes.

15. The method of claim 14, wherein the adjusting attributes of each of the plurality of nodes includes:

distributing the plurality of error values divided from the first error value of each of the plurality of first components to the plurality of nodes; and adjusting the attributes of each of the plurality of nodes based on absolute values of the error values distributed to the plurality of nodes.

16. The method of claim 11, further comprising:

determining a plurality of second components in which a mounting failure has occurred among the plurality of first components by using the plurality of error values divided from the first error value of each of the plurality of first components; and determining a cause of a mounting failure of each of the plurality of second components as at least one of a component mounting position setting error, a mounting condition setting error according to a component type and a defect of the mounter component nodes included in the mounter by using the plurality of error values divided from the first error value of each of the plurality of second components.

17. The method of claim 16, further comprising:

further adjusting attributes of at least one node among the plurality of nodes based on the cause of the mounting failure of each of the plurality of second components.

18. The method of claim 16, wherein the first error value of each of the plurality of first components is an average value of differences between a plurality of measurement values of mounting positions of the plurality of first components measured in inspecting each of the plurality of substrates of the first type and predetermined reference values, and further comprising:

further acquiring an error variance value of each of the plurality of first components indicating a variance with respect to the differences between the plurality of measurement values of the mounting positions of the plurality of first components and the predetermined reference values.

19. The method of claim 18, further comprising:

adjusting at least one error value among the plurality of error values divided from the first error value of each of the plurality of second components based on the determined cause of the mounting failure of each of the plurality of second components;

calculating a first yield to be improved in a manufacturing process for the substrate of the first type through improvement of the determined cause of the mounting failure of each of the plurality of second components, by using at least one adjusted error value and the error variance value for each of the plurality of second components identified through the error variance value of each of the plurality of first components; and displaying, by the display, the calculated first yield.

20. The method of claim 19, further comprising:

calculating a second yield of the plurality of substrates of the first type based on the number of at least one substrate of the first type including the plurality of second components among the plurality of substrates of the first type;

calculating a third yield for the plurality of substrates of the first type based on the number of at least one substrate of the first type in which a failure actually occurred among the plurality of substrates of the first type; and adjusting the calculated first yield based on the second yield and the third yield, and displaying the adjusted first yield on the display.

* * * * *